(12) United States Patent
Umezaki

(10) Patent No.: US 7,995,009 B2
(45) Date of Patent: Aug. 9, 2011

(54) DISPLAY DEVICE HAVING PIXEL INCLUDING TRANSISTOR AND DRIVING METHOD OF THE SAME

(75) Inventor: Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1227 days.

(21) Appl. No.: 11/530,741

(22) Filed: Sep. 11, 2006

(65) Prior Publication Data

US 2007/0064469 A1    Mar. 22, 2007

(30) Foreign Application Priority Data

Sep. 16, 2005  (JP) ................................. 2005-269323

(51) Int. Cl.
*G09G 3/30* (2006.01)
(52) U.S. Cl. .......................................... 345/76; 345/82
(58) Field of Classification Search .................... 345/36, 345/45, 76–81, 82; 313/484–487, 498–502; 315/169.1–169.4
See application file for complete search history.

(56) References Cited

U.S. PATENT DOCUMENTS

| | | | |
|---|---|---|---|
| 6,864,628 B2 * | 3/2005 | Yamazaki et al. | 313/504 |
| 6,930,680 B2 | 8/2005 | Miyazawa | |
| 7,164,401 B2 | 1/2007 | Kwon | |
| 7,187,351 B2 | 3/2007 | Kwon | |
| 7,446,740 B2 | 11/2008 | Jung | |
| 7,646,364 B2 | 1/2010 | Yamashita et al. | |
| 2004/0196224 A1 * | 10/2004 | Kwon | 345/82 |
| 2004/0196239 A1 | 10/2004 | Kwon | |
| 2005/0012695 A1 * | 1/2005 | Park | 345/76 |
| 2005/0017928 A1 * | 1/2005 | Osame et al. | 345/76 |
| 2005/0206593 A1 | 9/2005 | Kwon | |
| 2005/0243040 A1 | 11/2005 | Miyazawa | |
| 2005/0265071 A1 | 12/2005 | Kwon | |

FOREIGN PATENT DOCUMENTS

| | | |
|---|---|---|
| EP | 1 321 922 A2 | 6/2003 |
| EP | 1 465 141 A1 | 10/2004 |
| EP | 1 465 142 A1 | 10/2004 |
| EP | 1 465 143 A2 | 10/2004 |
| EP | 1 777 692 A2 | 4/2007 |
| EP | 1 921 596 A2 | 5/2008 |

(Continued)

OTHER PUBLICATIONS

Japan 2004-310006—English abstract provided by esp@cenet database Worldwide (2006) and family to U.S. Patent Application Publication No. 2004/0196239 (Desig. ID "AA"), U.S. Patent Application Publication No. 2005/0206593 (Desig. ID "AB"), U.S. Patent Application Publication No. 2005/0265071 (Desig ID "AC"), and European Publication No. 1 165 143 (Desig. ID "AN").

*Primary Examiner* — Chanh Nguyen
*Assistant Examiner* — Ram A Mistry
(74) *Attorney, Agent, or Firm* — Fish & Richardson P.C.

(57) ABSTRACT

A first capacitor obtains a gate-source voltage of a first transistor in accordance with a programming current flowing through the first transistor, and a second capacitor obtains a threshold voltage of a second transistor. Then, the electric charges held in the first capacitor and the second capacitor are capacitively coupled. By using the voltage obtained with the capacitively coupling as a gate-source voltage of the first transistor, constant current in accordance with the programming current can be supplied to a light emitting element.

16 Claims, 51 Drawing Sheets

FOREIGN PATENT DOCUMENTS

| | | |
|---|---|---|
| JP | 2003-177709 A | 6/2003 |
| JP | 2004-310006 | 11/2004 |
| JP | 2004-310013 A | 11/2004 |
| JP | 2004-310014 A | 11/2004 |
| JP | 2005-157283 A | 6/2005 |
| JP | 2005-157283 A | 6/2006 |
| JP | 2006-154521 A | 6/2006 |
| JP | 2006-208744 A | 8/2006 |
| WO | WO 98/48403 | 10/1998 |

\* cited by examiner

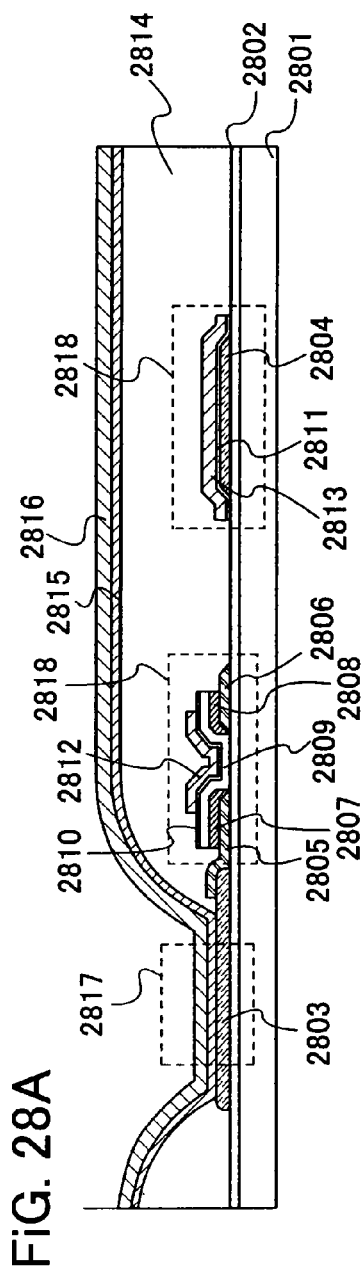
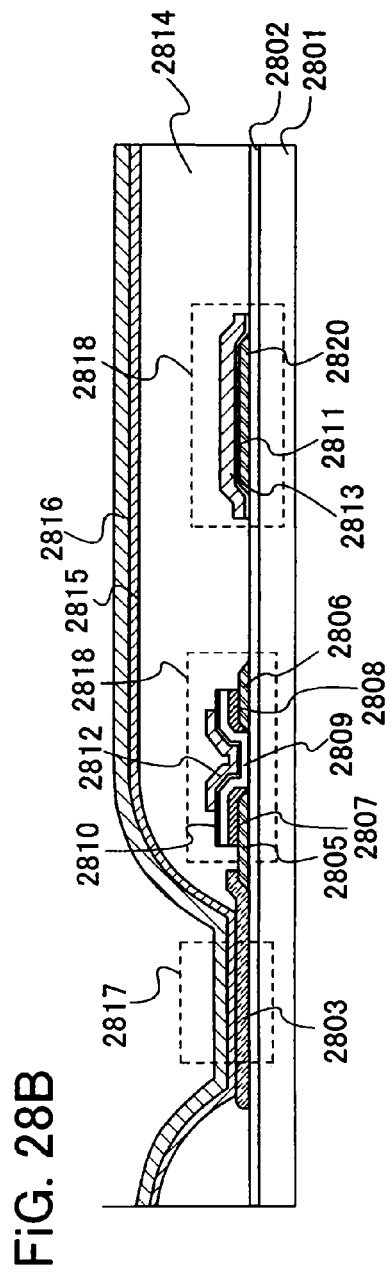
FIG. 28A
FIG. 28B

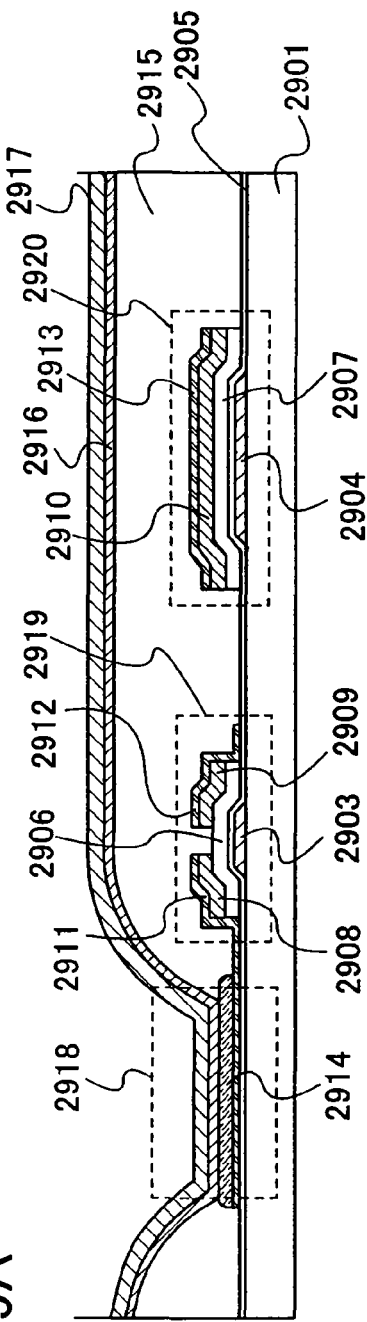
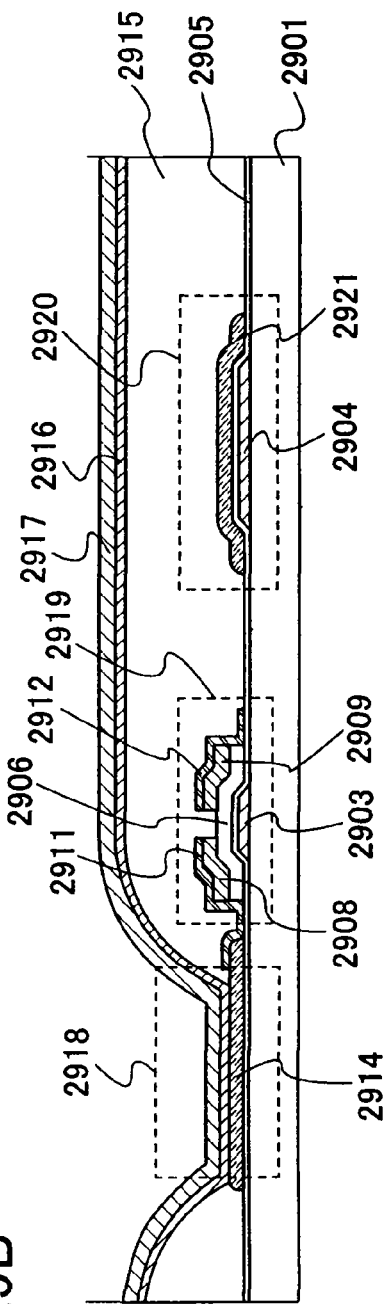
FIG. 29A
FIG. 29B

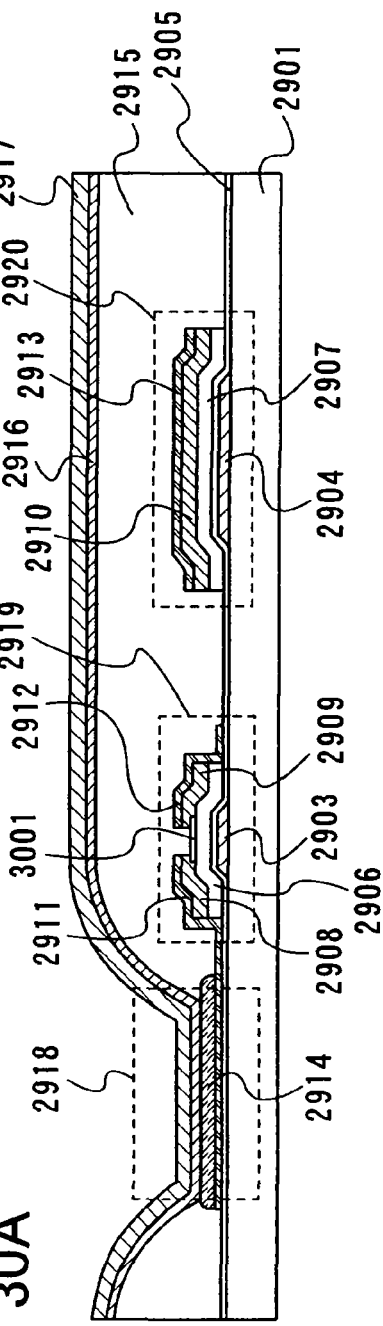
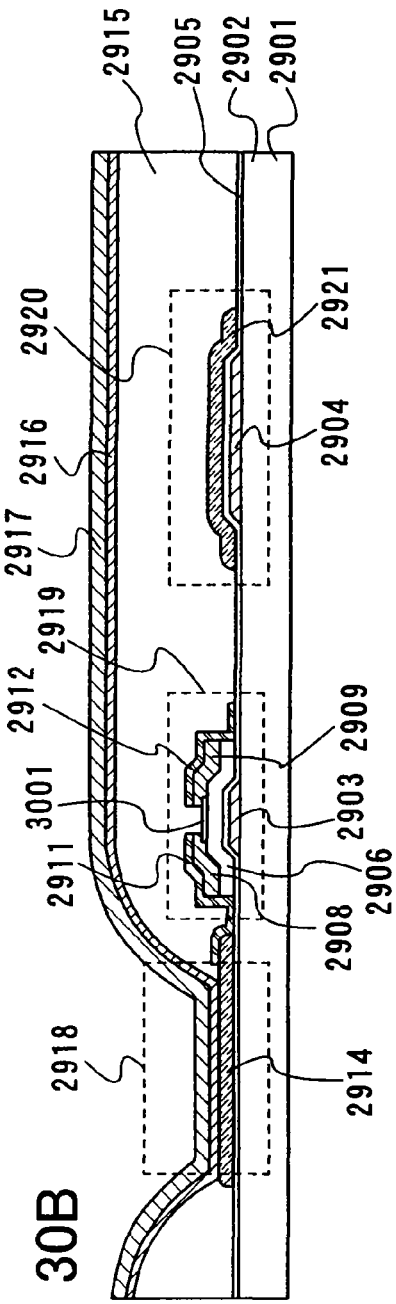
FIG. 30A
FIG. 30B

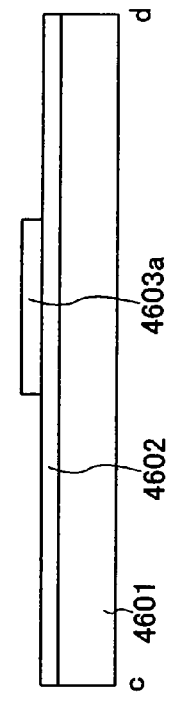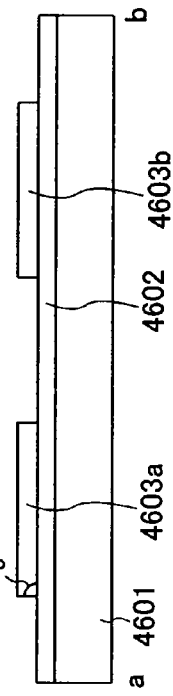
FIG. 32A-1
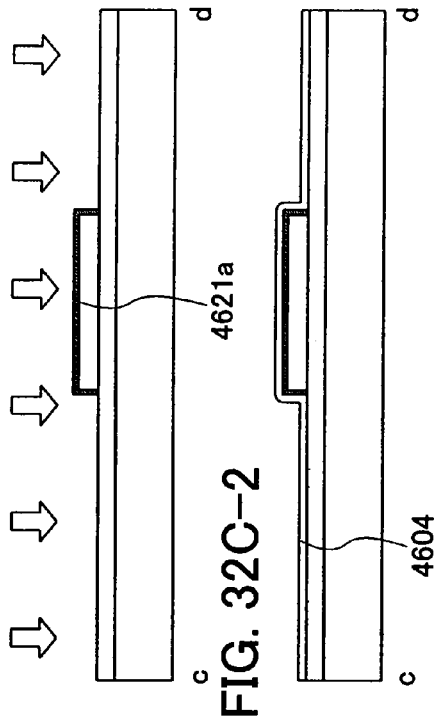
FIG. 32A-2
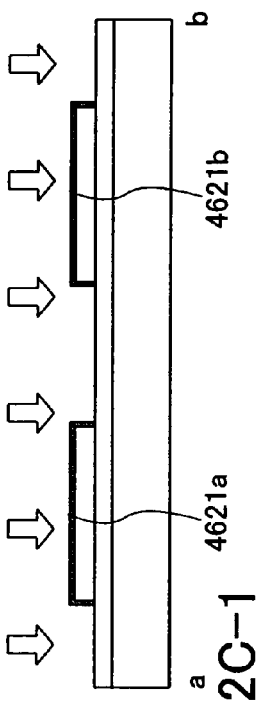
FIG. 32B-1
FIG. 32B-2
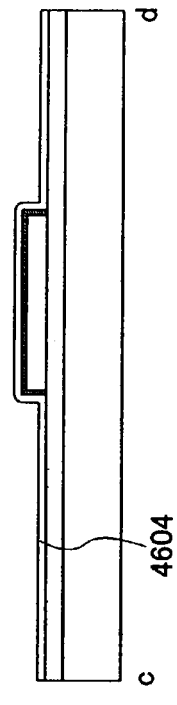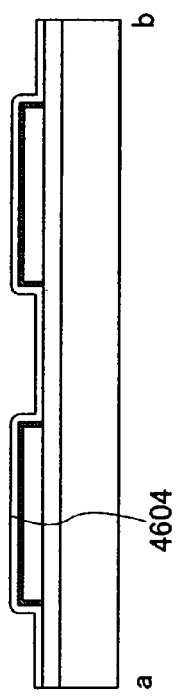
FIG. 32C-1
FIG. 32C-2
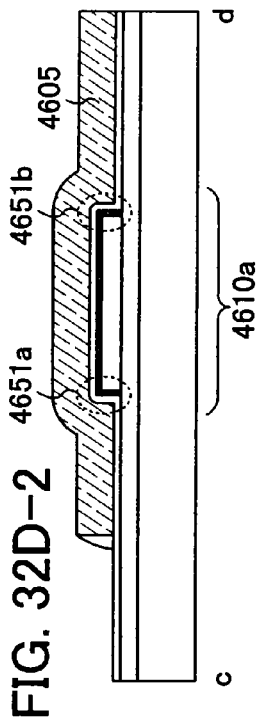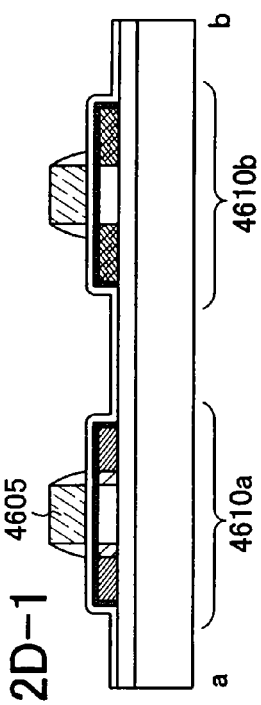
FIG. 32D-1
FIG. 32D-2

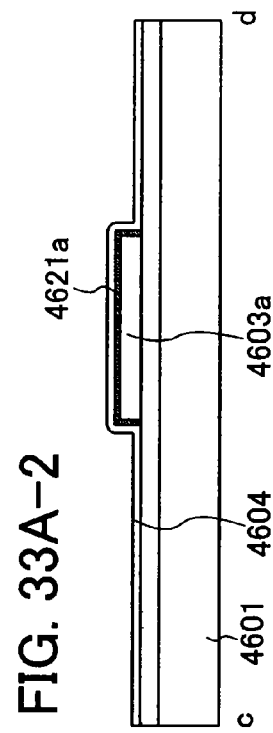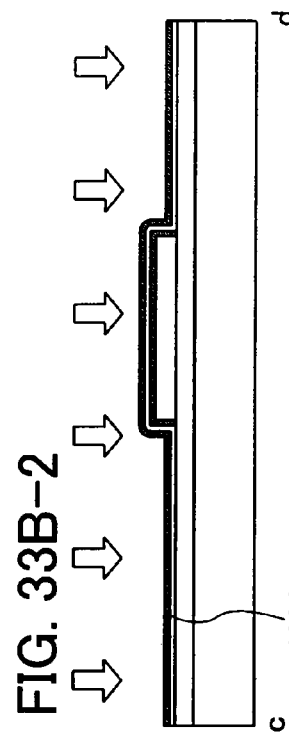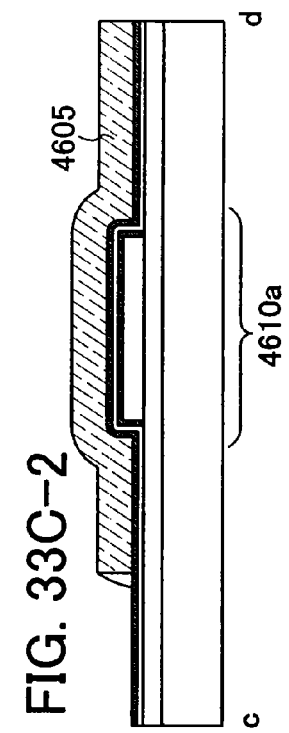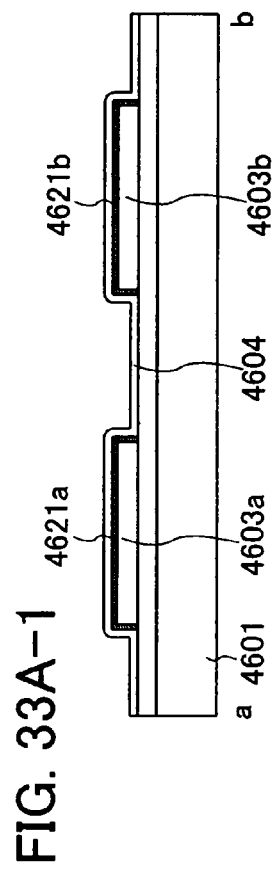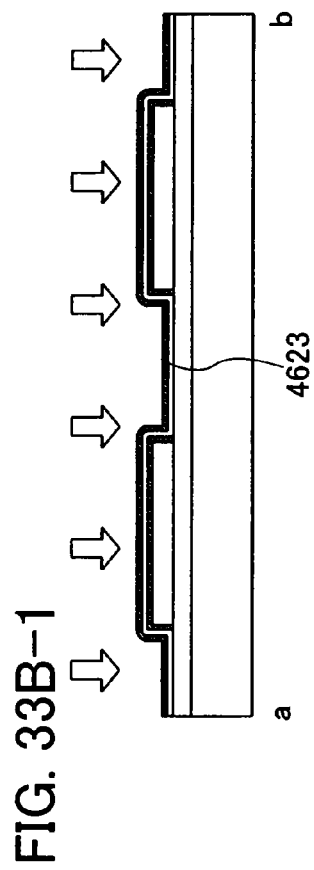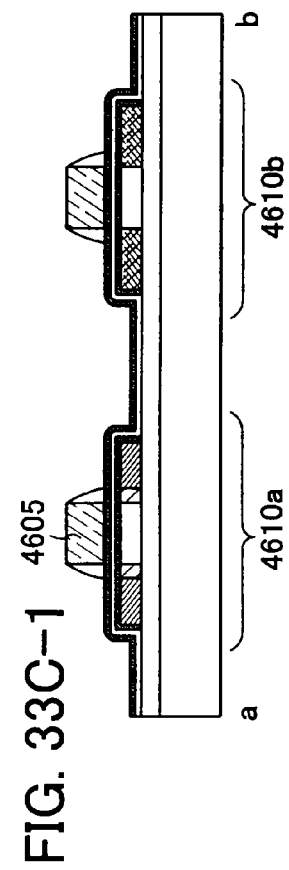

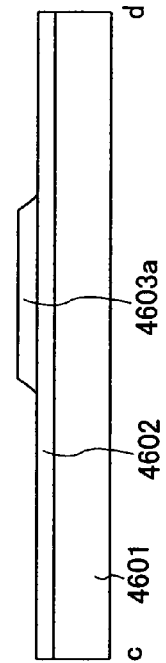
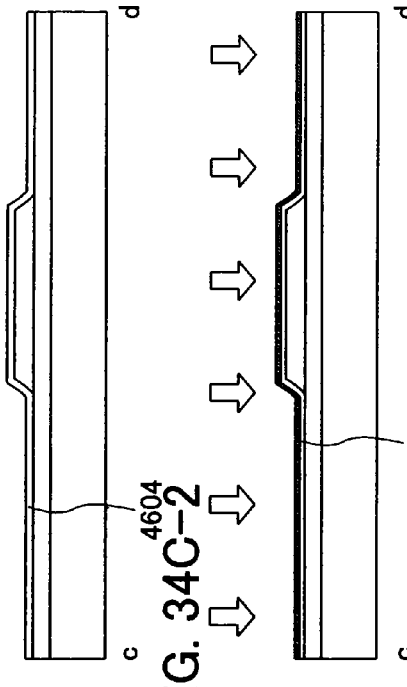
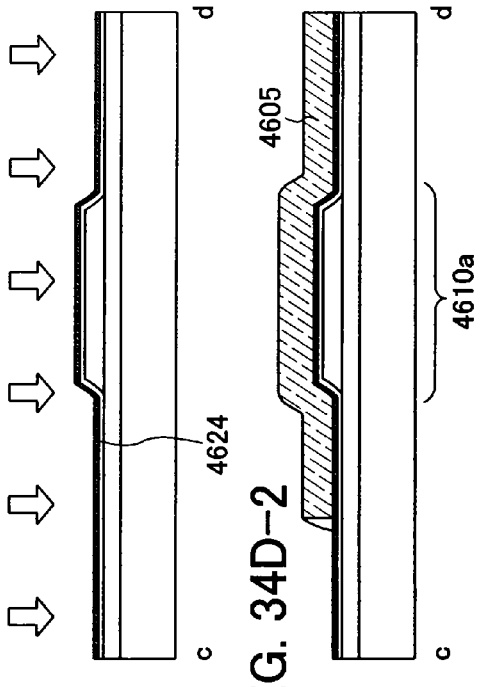
FIG. 34A-2
FIG. 34B-2
FIG. 34C-2
FIG. 34D-2
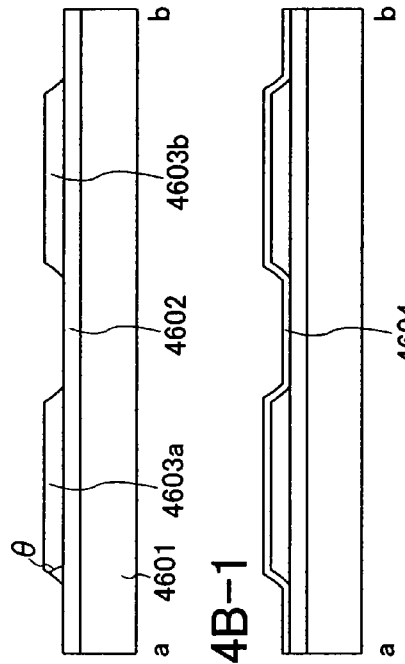
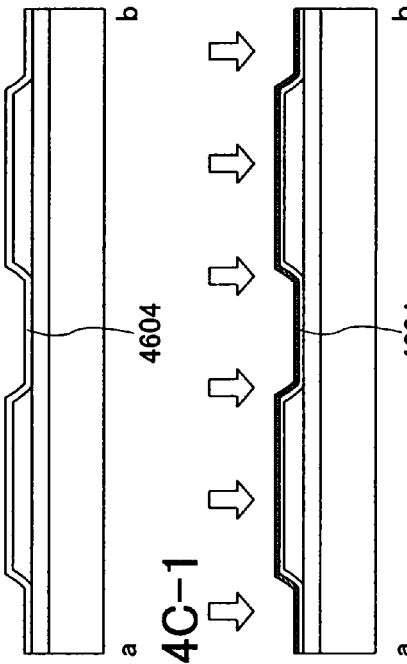
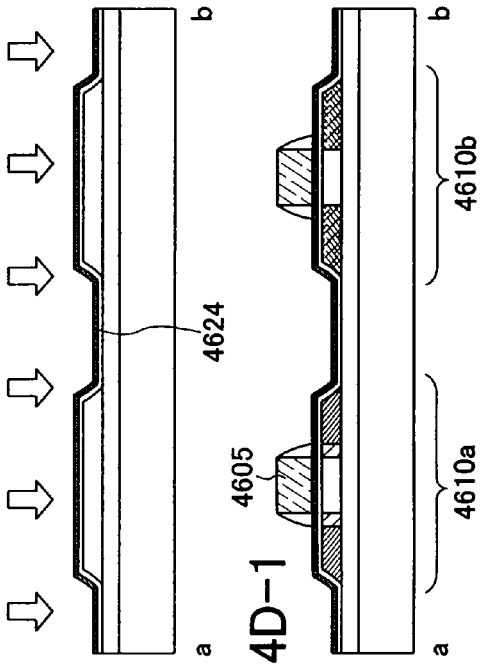
FIG. 34A-1
FIG. 34B-1
FIG. 34C-1
FIG. 34D-1

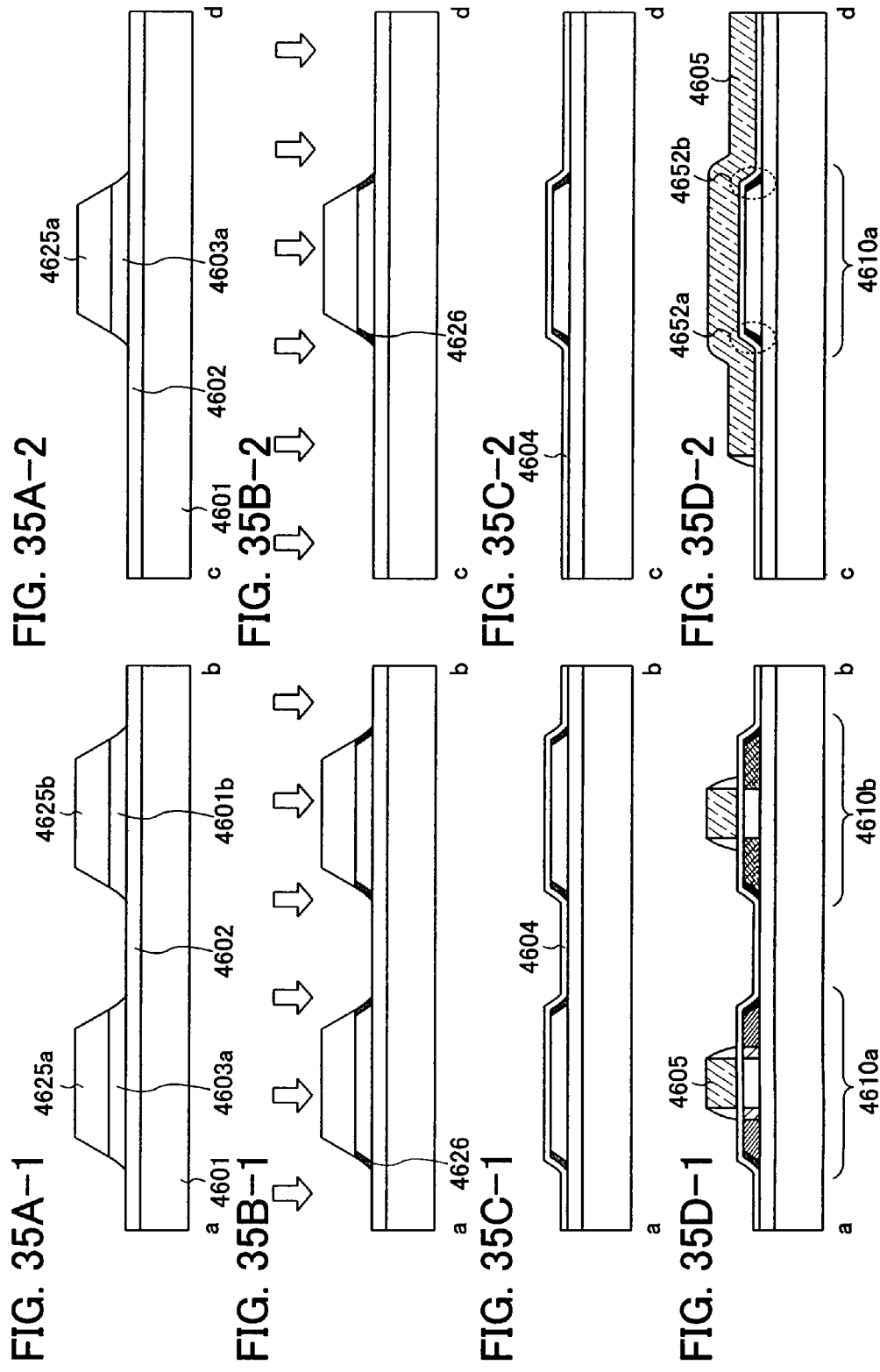

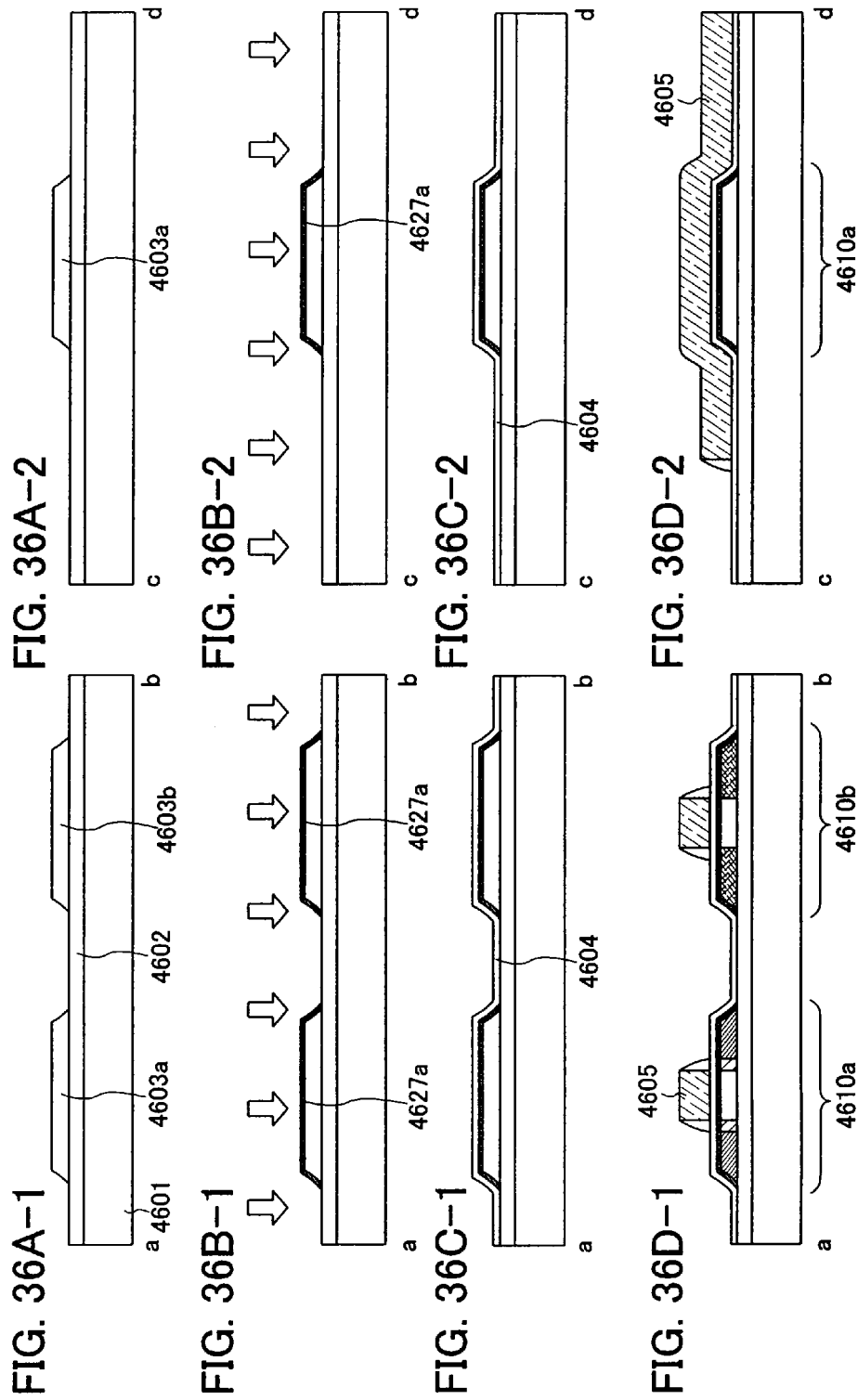

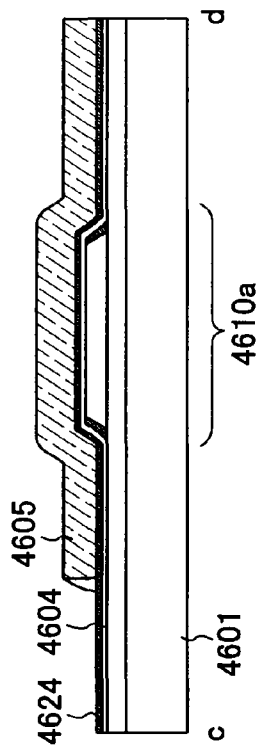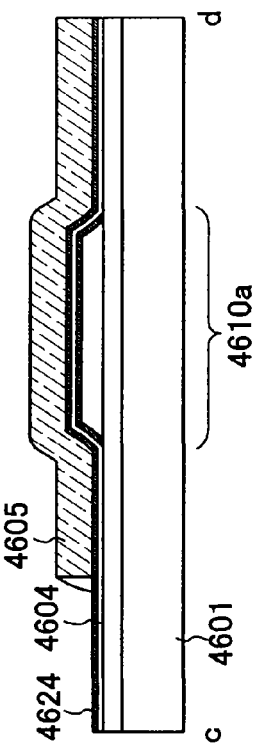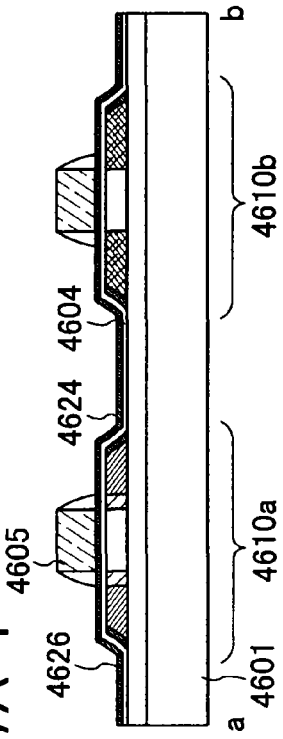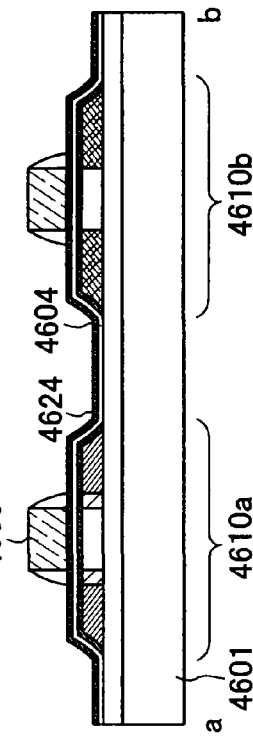

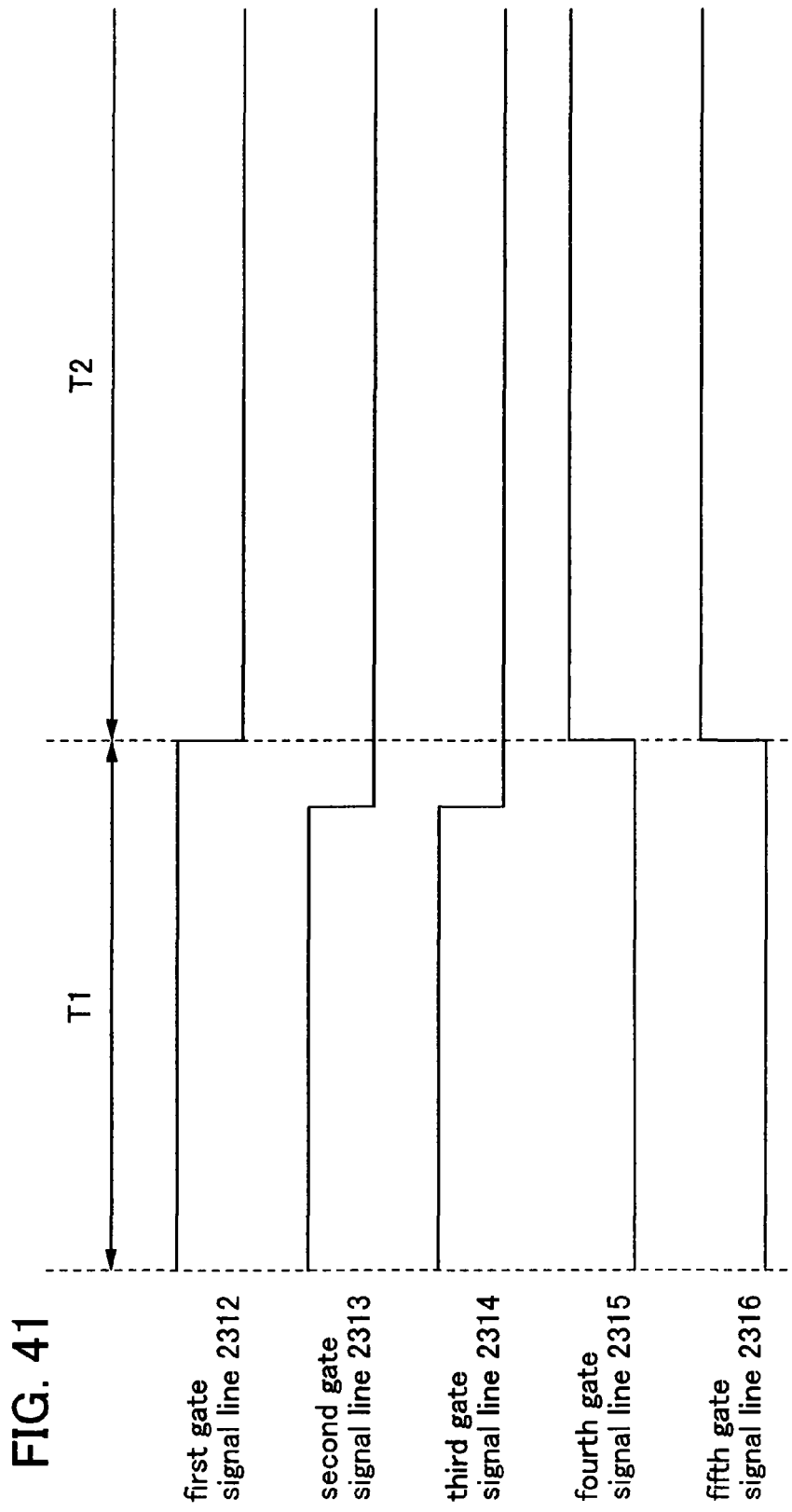

DISPLAY DEVICE HAVING PIXEL INCLUDING TRANSISTOR AND DRIVING METHOD OF THE SAME

BACKGROUND OF THE INVENTION

1. Field of the Invention

The invention relates to a display device constituted including a transistor and a driving method of the display device. In particular, the invention relates to a semiconductor device including a pixel constituted including a thin film transistor (hereinafter also called a transistor).

2. Description of the Related Art

An active matrix display, which is constituted by the combination of an electroluminescence element (also called an organic light emitting diode (OLED) and an EL element or a light emitting element in this specification) and a transistor, has been attracting attentions and actively researched and developed both domestically and internationally as a thin and lightweight display. This display which is also called an organic EL display (OELD) is extensively researched and developed in a practical use stage aiming for a small 2-inch display to a large display of 40-inch or larger.

Luminance of an EL element and a current value flowing therethrough are theoretically in a linear relationship. Therefore, for an organic EL display which employs an EL element as a display medium, a method to express a gray scale by controlling a current value supplied to the EL element is known. Moreover, as a method to control a current value supplied to the EL element, a voltage input driving method and a current input driving method are known.

In the voltage input driving method, a current value supplied to a driving transistor (hereinafter also called a driving transistor) and an EL element is controlled by a gate-source voltage obtained by inputting a voltage signal to a gate of a driving transistor so as to be held therein, which is connected in series to the EL element. In the current input driving method, a current value supplied to a driving transistor and an EL element is controlled by a gate-source voltage of a driving transistor obtained by supplying a current signal to the driving transistor (for example, refer to Patent Document 1).

However, in a conventional current input driving method, a slight amount of current is required to be supplied from a source signal line to express a low gray scale. As time to charge parasitic capacitance of a source signal line or the like is required to input a slight amount of current as a video signal to a pixel, there is a problem in that long writing time is required.

Further, as another example of a current input driving method, such a pixel is known, in which by holding Vgs inputted as a current to a driving TFT and a threshold voltage thereof in two capacitors and capacitively coupling them, a current supplied to an EL element can be smaller than an actual video signal while compensating the threshold voltage (for example, refer to Patent Document 2).

However, even such a pixel configuration requires a period T1 to obtain a threshold voltage and a period T2 to write a video signal. As an area of one pixel is limited, the capacitance of two capacitors are also limited. Therefore, there is a problem in that there is not enough writing time for writing a slight amount of current as a video signal, and in a large panel in particular, a writing period per pixel becomes shorter as compared to a small panel.

[Patent Document 1]
International Publication No. 9848403
[Patent Document 1]
Japanese Patent Laid-Open No. 2004-310006

SUMMARY OF THE INVENTION

In view of such problems, the invention provides a display device and a driving method in which writing time per pixel is further shortened and which is capable of enlarging a panel.

A feature of the invention is to include a first transistor, a second transistor, a first capacitor which holds a gate-source voltage of the first transistor corresponding to a current flowing therethrough, and a second capacitor which holds a threshold voltage of the second transistor and capacitively couples with the first capacitor.

According to one feature of a display device of the invention, the display device includes a pixel including a first transistor having a first terminal connected to a first wire and a second terminal connected to a second wire through a first switching element and to a gate thereof through a second switching element, a second transistor having a first terminal connected to the first wire and a second terminal connected to a gate through a third switching element, a first capacitor having one electrode connected to the first wire and the other electrode connected to the gate of the first transistor, a second capacitor having one electrode connected to the first wire and the other electrode connected to the gate of the second transistor and to the other electrode of the first capacitor through a fourth switching element, and a light emitting element having one electrode connected to the second terminal of the first transistor through a fifth switching element.

Another feature of a display device of the invention includes a pixel including a first transistor having a first terminal connected to a first wire and a second terminal connected to a gate thereof through a first switching element, a second transistor having a first terminal connected to the first wire and a second terminal connected to a second wire through a second switching element and a gate thereof through a third switching element, a first capacitor having one electrode connected to a first wire and the other electrode connected to a gate of the first transistor, a second capacitor having one electrode connected to the first wire and the other electrode connected to the gate of the second transistor and to the other electrode of the first capacitor through a fourth switching element, and a light emitting element having one electrode connected to the second terminal of the first transistor through a fifth switching element.

In a display device of the invention, a channel length of the first transistor can be longer than a channel length of the second transistor. A channel width of the first transistor can be longer than a channel width of the second transistor.

The invention provides a driving method of a display device having a pixel including a first transistor, a second transistor, a first capacitor which holds a gate-source voltage of the first transistor corresponding to a current flowing therethrough, and a second capacitor which capacitively couples with the first capacitor, in which an operation to obtain the gate-source voltage of the first transistor in the first capacitor, an operation to obtain a gate-source voltage of the second transistor in the second capacitor, and an operation to capacitively couples the voltage held in the first capacitor and the voltage held in the second capacitor are performed. An operation to obtain the gate-source voltage of the first transistor in the first capacitor and an operation to obtain a gate-source voltage of the second transistor in the second capacitor can be performed concurrently.

The invention provides a driving method of a display device having a pixel including a first transistor having a first terminal connected to a first wire and a second terminal connected to a second wire through a first switching element and to a gate thereof through a second switching element, a second transistor having a first terminal connected to the first wire and a second terminal connected to a gate thereof through a third switching element, a second capacitor having one electrode connected to the first wire and the other electrode connected to the gate of the second transistor, a first capacitor having one electrode connected to the first wire and the other electrode connected to the gate of the first transistor and to the other electrode of the second capacitor and the gate of the second transistor through a fourth switching element, and a light emitting element having one electrode connected to the second terminal of the first transistor through a fifth switching element, in which an operation to obtain a gate-source voltage of the first transistor in the first capacitor, an operation to obtain a gate-source voltage of the second transistor in the second capacitor, and an operation to capacitively couple the voltage held in the first capacitor and the voltage held in the second capacitor are performed. An operation to obtain the gate-source voltage of the first transistor in the first capacitor and an operation to obtain a gate-source voltage of the second transistor in the second capacitor can be performed concurrently.

The invention provides a driving method of a display device having a pixel including a first transistor having a first terminal connected to a first wire and a second terminal connected to a gate thereof through a first switching element, a second transistor having a first terminal connected to the first wire and a second terminal connected to a second wire through a second switching element and a gate thereof through a third switching element, a second capacitor having one electrode connected to the first wire and the other electrode connected to the gate of the first transistor, a first capacitor having one electrode connected to the first wire and the other electrode connected to the gate of the first transistor and the other electrode of the second capacitor through a fourth switching element, and a light emitting element having one electrode connected to the second terminal of the first transistor through a fifth switching element, in which an operation to obtain a gate-source voltage of the first transistor in the first capacitor, an operation to obtain a gate-source voltage of the second transistor in the second capacitor, and an operation to capacitively couple the voltage held in the first capacitor and the voltage held in the second capacitor are performed. An operation to obtain the gate-source voltage of the first transistor in the first capacitor and an operation to obtain a gate-source voltage of the second transistor in the second capacitor can be performed concurrently.

Switches of various modes can be used as a switch described in the invention. For example, an electrical switch, a mechanical switch, or the like can be used. That is, it may be anything as far as it can control a current flow. It may be a transistor, a diode (for example, a PN diode, a PIN diode, a Schottky diode, a diode-connected transistor, and the like), a thyristor, or a logic circuit configured with them. Therefore, in the case of applying a transistor as a switch, polarity (conductivity type) thereof is not particularly limited because it operates just as a switch. However, when an off current is preferred to be small, a transistor of polarity with a smaller off current is favorably used. For example, the transistor which is provided with an LDD region, a transistor which has a multi-gate structure, or the like has a small off current. Further, it is desirable that an n-channel transistor is employed when a potential of a source terminal of the transistor as a switch is closer to the low potential side power source potential (Vss, GND, 0 V or the like), and a p-channel transistor is desirably employed when the potential of the source terminal is closer to the high potential side power source potential (Vdd or the like). This helps the switch operate efficiently as an absolute value of a gate-source voltage of the transistor can be increased.

It is also to be noted that a CMOS switch can be also formed by using both n-channel and p-channel transistors. A CMOS switch can flow a current if either the p-channel transistor or the n-channel transistor becomes conductive; therefore, a function as a switch can be facilitated. For example, an appropriate voltage can be outputted either when a voltage of an input signal to a switch is high or low. Further, as voltage amplitude of a signal for turning on or off the switch can be set smaller, power consumption can be reduced as well.

A transistor used as a switch includes an input terminal (one of a source terminal and a drain terminal), an output terminal (the other of the source terminal and the drain terminal), and a terminal to control conduction (gate terminal). On the other hand, when a diode is used as a switch, a terminal for controlling conduction may not be included. Therefore, the number of wires for controlling the terminal can be reduced.

It is to be noted in the invention that a connection means an electrical connection, a functional connection, and a direct connection. Therefore, in a configuration disclosed in the invention, other elements than the predetermined connection are also included. For example, one or more of an element (for example, a switch, a transistor, a capacitor, an inductor, a resistor, a diode, and the like) which enables electrical connection may be provided between certain parts. Further, one or more of a circuit which enables a functional connection (for example, a logic circuit (an inverter, a NAND circuit, a NOR circuit, and the like), a signal converter circuit (a DA converter circuit, an AD converter circuit, a gamma correction circuit, and the like), a potential level converter circuit (a power source circuit such as a booster circuit and a step-down circuit, a level shifter circuit which changes a potential level of an H signal or an L signal, and the like), a voltage source, a current source, a switching circuit, an amplifier circuit (a circuit which can increase signal amplification, the amount of current, and the like, such as an operational amplifier, a differential amplifier circuit, a source follower circuit, a buffer circuit, and the like), a signal generating circuit, a memory circuit, a control circuit, and the like) may be provided between certain parts. Alternatively, elements may be directly connected without other elements or circuits interposed therebetween.

It is to be noted that when elements are connected without other elements or circuits interposed therebetween, description will be made as being directly connected. The description "being electrically connected" includes an electrical connection (namely, another element is interposed therebetween), a functional connection (namely, another circuit is interposed therebetween), and a direct connection (namely, no other elements or circuits are interposed therebetween).

It is to be noted that a display element, a display device, a light emitting element, and a light emitting device can have various modes or elements. For example, as the display element, display device, light emitting element, and light emitting device, a display medium which changes the contrast by an electromagnetic effect can be used, such as an EL element (an organic EL element, an inorganic EL element, or an EL element containing an organic substance and an inorganic substance), an electron discharging element, a liquid crystal element, an electron ink, a grating light valve (GLV), a plasma display (PDP), a digital micromirror device (DMD), a piezo-electric ceramic display, and a carbon nanotube. It is to be noted that a display device using an EL element includes an EL display, a display device using an electron discharging element includes a field emission display (FED), an SED type flat display (Surface-conduction Electron-emitter Display), and the like, a display device using a liquid crystal element includes a liquid crystal display, a transmissive liquid crystal display, a semi-transmissive liquid crystal display, and a reflective liquid crystal display, and a display device using an electron ink includes electron paper.

It is to be noted that transistors of various modes can be applied to a transistor of the invention. Thus, any kind of transistor can be applied to the invention without limitation. Therefore, for example, a thin film transistor (TFT) having a non-single crystal semiconductor film typified by amorphous silicon, polycrystal silicon, or the like can be used. As a result, transistors can be manufactured even at a low manufacturing temperature, at low cost, over a large substrate or a transparent substrate, or can transmit light. Further, a MOS transistor, a junction transistor, a bipolar transistor, and the like formed using a semiconductor substrate or an SOI substrate can be used. With these transistors, transistors with less variation, a transistor with a high current supplying capacity, a transistor with a small size, or a circuit with less power consumption can be formed. Moreover, a transistor containing a compound semiconductor such as ZnO, a-InGaZnO, SiGe, and GaAs, a thin film transistor thereof can be used. As a result, transistors can be manufactured at a low manufacturing temperature, at a room temperature, or directly on a low heat resistant substrate such as a plastic substrate or a film substrate.

Moreover, a transistor or the like formed by an ink-jet method or a printing method can be used. As a result, a transistor can be manufactured at a room temperature, in a low vacuum, or over a large substrate. As a mask (reticle) is not required to manufacture a transistor, the layout of a transistor can be easily changed. Moreover, a transistor having an organic semiconductor or a carbon nanotube or other transistors can be used. As a result, a transistor can be formed over a flexible substrate.

It is to be noted that hydrogen or halogen may be contained in an amorphous semiconductor film. Moreover, as a substrate over which a transistor is provided, various kinds of substrates can be used without limitation to a specific type. Therefore, for example, a single crystal substrate, an SOI substrate, a glass substrate, a quartz substrate, a plastic substrate, a paper substrate, a cellophane substrate, a stone substrate, a stainless steel substrate, a substrate formed of stainless steel foil, and the like can be used. Alternatively, a transistor may be formed over a certain substrate and then transferred to another substrate. By using these substrates, a transistor with favorable characteristics, a transistor with less power consumption, a transistor which is not easily broken, or a transistor with high heat resistance can be formed.

It is to be noted that a transistor can have various modes without limitation to a specific type. For example, a multi-gate structure having two or more gate electrodes may be employed. With a multi-gate structure, channel regions are connected in series, which is the same as a plurality of transistors connected in series. As a result, an off current can be reduced, reliability can be improved by enhancing a withstand voltage of a transistor, or flat characteristics can be obtained, where a drain-source current does not change much even when a drain-source voltage is changed in an operation in a saturation region. A gate electrode may be provided over and under a channel. In such a structure, a channel region is increased, which can increase a current value or improve an S value as a depletion layer is easily formed. When a gate electrode is formed over and under a channel, the structure is the same as a plurality of transistors connected in parallel.

Alternatively, a gate electrode may be provided over or under a channel. A forward staggered structure or an inversely staggered structure may be employed, or a channel region may be divided into a plurality of regions, connected in parallel, or in series. Further, a source electrode or a drain electrode may overlap a channel (or a part of it). In such a structure, an unstable operation due to a charge accumulated in a part of a channel can be prevented. Moreover, an LDD region may be provided as well. In such a structure, an off current can be reduced, reliability can be improved by enhancing a withstand voltage of a transistor, or flat characteristics can be obtained, where a drain-source current does not change much even when a drain-source voltage is changed in an operation in a saturation region.

It is to be noted that various types of transistors can be used as a transistor of the invention, and the transistor can be formed over various substrates. Therefore, a whole circuit may be formed over a glass substrate, a plastic substrate, a single crystal substrate, an SOI substrate, or any substrate. In such a structure, the cost can be reduced by reducing the number of components, or reliability can be improved by reducing the number of connections with circuit components. Alternatively, a part of a circuit may be formed over a certain substrate while another part thereof is formed over another substrate. That is to say, a whole circuit is not required to be formed over the same substrate. For example, a part of a circuit may be formed over a glass substrate using transistors while another part thereof may be formed over a single crystal substrate, thereby an IC chip formed in this manner may be provided over a glass substrate by COG (Chip On Glass) to be connected. As a further alternative, the IC chip may be connected to a glass substrate by using TAB (Tape-Automated-Bonding) or a printed substrate. In this manner, when a part of a circuit is formed over the same substrate, the cost can be reduced by reducing the number of components or reliability can be improved by reducing the number of connections with circuit components. Furthermore, a portion with a high driving voltage or a portion with a high driving frequency which tends to consume much power had better not to be formed over the same substrate to prevent an increase in power consumption.

It is to be noted in the invention that one pixel corresponds to one element to control brightness. For example, one pixel expresses one color element by which brightness is expressed. Therefore, at that time, in the case of a color display device formed of color elements of R (red), G (green), and B (blue), the minimum unit of an image is formed of three pixels of an R pixel, a G pixel, and a B pixel.

It is to be noted that a color element is not limited to three colors, and three or more colors or other colors than RGB may be used as well. For example, by adding white, RGBW (W corresponds to white) may be employed. Alternatively, for example, one or more of yellow, cyan, magenta, emerald green, vermillion, and the like may be additionally employed. Further, for example, a color which is similar to at least one of RGB may be additionally employed. For example, R, G, B1, and B2 may be employed. B1 and B2 are both blue with slightly different frequencies. With such color elements, a display which is closer to the original object can be performed or power consumption can be reduced.

As another example, in the case of controlling the brightness of one color element by using a plurality of regions, one of the plurality of regions corresponds to one pixel. Therefore, for example, in the case of an area gray scale display, a plurality of regions to control brightness are provided for one color element to express a gray scale, in which one of the plurality of regions to control the brightness corresponds to one pixel. Therefore, in that case, one color element is formed of a plurality of pixels. In that case, regions contributing to display may have different sizes for each pixel in some cases. Moreover, in a plurality of regions to control brightness of one color element, namely a plurality of pixels which constitute one color element, signals supplied to each pixel may be set slightly different so as to expand a viewing angle.

It is to be noted that description "one pixel (three colors)" corresponds to one pixel formed of three pixels of R, G, and B. Description "one pixel (one color)" corresponds to one pixel formed of a plurality of pixels for one color element.

It is to be noted that the invention includes the case where pixels are arranged (aligned) in matrix. Here, the matrix arrangement (alignment) of pixels includes the case where pixels are arranged linearly in vertical or horizontal direction or the case where pixels are arranged in zigzag. Therefore, in the case of performing full color display by three color components (for example, R, G, and B), a stripe arrangement or a delta arrangement of dots of three color components are included. Moreover, a Bayer arrangement is also included. It is to be noted that a color component is not limited to three colors, and three or more colors may be employed. For example, RGBW (W corresponds to white) or RGB with one or more of yellow, cyan, magenta, and the like may be employed. Further, the size of a display region may be different in each dot of a color component. As a result, power consumption can be reduced or the life of a display element can be extended.

It is to be noted that a transistor is an element having at least three terminals which include a gate, a drain, and a source. A channel region is provided between a drain region and a source region. A current can flow through the drain region, a channel region, and the source region. Here, the source and drain change depending on a structure or an operational condition of a transistor or the like; therefore, it is difficult to determine which is a source or a drain. In the invention, regions which function as a source and a drain may not be referred to as a source and a drain. In that case, for example, the regions may be referred to as a first terminal and a second terminal.

It is to be noted that a transistor may be an element having at least three terminals which include a base, an emitter, and a collector. In this case also, the emitter and the collector may be referred to as a first terminal and a second terminal.

It is to be noted that a gate includes a gate electrode and a gate wire (also referred to as a gate line, a gate signal line, or the like) or a part of them. A gate electrode corresponds to a conductive film in a portion which is overlapped with a semiconductor which forms a channel region, an LDD (Lightly-Doped Drain) region, or the like with a gate insulating film interposed therebetween. The gate wire corresponds to a wire which connects between the gate electrodes of pixels or between a gate electrode and another wire.

However, there is a portion which functions as a gate electrode and a gate wire. Such a region may be referred to as a gate electrode or a gate wire. That is, there is a region which cannot be clearly distinguished as a gate electrode or a gate wire. For example, when a channel region is overlapped with a gate wire which is extended, the channel region functions as a gate wire and also as a gate electrode. Therefore, such a region may be referred to as a gate electrode or a gate wire.

Moreover, a region formed of the same material as a gate electrode and connected to the gate electrode may also be referred to as a gate electrode. Similarly, a region formed of the same material as a gate wire and connected to a gate wire may also be referred to as a gate wire. Such a region, to be exact, may not be overlapped with a channel region or may not have a function to connect to another gate electrode. However, there is a region which is formed of the same material as a gate electrode or a gate wire and connected to the gate electrode or the gate wire because of a manufacturing margin or the like. Therefore, such a region may be referred to as a gate electrode or a gate wire as well.

For example, in a multi-gate transistor, a gate electrode of one transistor and a gate electrode of another transistor are often connected through a conductive film formed of the same material as the gate electrode. Such a region is a region to connect between the gate electrodes; therefore, it may be referred to as a gate wire. However, as a multi-gate transistor can be regarded as one transistor, such a region may be referred to as a gate electrode as well. That is, the one formed of the same material as a gate electrode or a gate wire and connected thereto may be referred to as a gate electrode or a gate wire.

Further, for example, a conductive film in a portion which connects between a gate electrode and a gate wire may be referred to as a gate electrode or a gate wire.

It is to be noted that a gate terminal corresponds to a portion of a region of a gate electrode or a region electrically connected to a gate electrode.

It is to be noted that a source includes a source region, a source electrode, and a source wire (also referred to as a source line, a source signal line, or the like) or a portion thereof. A source region corresponds to a semiconductor region containing a lot of p-type impurities (boron, gallium, or the like) or n-type impurities (phosphorus, arsenic, or the like). Therefore, a region containing a small amount of p-type impurities or n-type impurities, that is an LDD (Lightly-Doped Drain) region is not included in a source region. A source electrode corresponds to a conductive layer in a portion which is formed of a different material from a source region and electrically connected to the source region. However, a source electrode including a source region is sometimes referred to as a source electrode. A source wire corresponds to a wire which connects between source electrodes of pixels or a source electrode and another wire.

However, there is a portion which functions as a source electrode and also as a source wire. Such a region may be referred to as a source electrode or a source wire. That is, there is a region which cannot be clearly distinguished as a source electrode or a source wire. For example, when a source region is overlapped with a source wire which is extended, the source region functions as a source wire and also as a source electrode. Therefore, such a region may be referred to as a source electrode or a source wire.

Moreover, a portion formed of the same material as a source electrode and connected to the source electrode or a portion which connects between source electrodes may be referred to as a source electrode. Further, a portion which is overlapped with a source region may be referred to as a source electrode. Similarly, a region formed of the same material as a source wire and connected to the source wire may be referred to as a source wire as well. Such a region, to be exact, may not have a function to connect to another source electrode. However, there is a region which is formed of the same material as a source electrode or a source wire and connected to the source electrode or the source wire because of a manufacturing margin or the like. Therefore, such a region may be referred to as a source electrode or a source wire as well.

Further, for example, a conductive film in a portion which connects between a source electrode and a source wire may be referred to as a source electrode or a source wire.

It is to be noted that a source terminal corresponds to a portion of a source region, a source electrode, or a region electrically connected to a source electrode.

Note that similar description to a source can be applied to a drain.

It is to be noted in the invention that a semiconductor device corresponds to a device which includes a circuit having a semiconductor element (a transistor, a diode, or the like), or a general device which is capable of functioning by utilizing semiconductor characteristics.

Further, a display device corresponds to a device including a display element (a liquid crystal element, a light emitting element, or the like).

It is to be noted that a display device may also correspond to a main body of a display panel constituted by a plurality of pixels each having a display element such as a liquid crystal element or an EL element or a peripheral driver circuit which drives the pixels, which are formed over the same substrate. Further, a display device may include a peripheral driver circuit arranged over a substrate by wire bonding, a bump, or the like, that is a chip-on-glass (COG). Moreover, a display device may include the one to which a flexible printed circuit (FPC) or a printed wiring board (PWB) is attached (an IC, a resistor, a capacitor, an inductor, a transistor, and the like). Furthermore, an optical sheet such as a polarizing plate, a phase change plate, or the like may also be included. Also, a backlight unit (a conductive plate, a prism sheet, an expansion sheet, a reflective sheet, a light source (an LED, a cold cathode tube, or the like) may be included) may be included.

Further, a light emitting device corresponds to, in particular, a display device including a self-light emitting type display element such as an EL element or an element used for an FED. A liquid crystal display device corresponds to a display device including a liquid crystal element.

It is to be noted in the invention that description "over" or "on" in the description "being formed over a certain object" or "being formed on a certain object" is not limited to being in direct contact with the certain object. Those descriptions include the case where objects are not directly in contact with each other, that is the case where another component is sandwiched therebetween. Therefore, for example, description "a layer B is formed over a layer A (or on a layer A)" includes the case where the layer B is formed on the layer A with direct contact and the case where another layer (for example, a layer C, D, or the like) is formed on the layer A with direct contact and the layer B is formed thereon with direct contact. Further, it is similar for the description "above", which is not limited to the case of being on a certain object with direct contact, but also includes the case where another object is sandwiched therebetween. Therefore, for example, description "a layer B is formed above a layer A" includes the case where the layer B is formed on the layer A with direct contact and the case where another layer (for example, a layer C, D, or the like) is formed over the layer A with direct contact and the layer B is formed thereon with direct contact. It is to be noted that it is similar for the descriptions "under" or "below", which includes the case where components are in direct contact and the case they are not.

In the invention, a writing period can be shortened by simultaneously obtaining a threshold voltage of a driving transistor and writing a video signal in a writing period of the video signal. As a result, a writing period per pixel can be set longer, thereby a video signal can be more accurately written and an organic EL display with higher image quality can be provided. Moreover, as a video signal can be written to more pixels in the same writing period, a large EL display and an EL display with higher resolution can be provided.

BRIEF DESCRIPTION OF DRAWINGS

FIGS. 28A and 28B are diagrams showing Embodiment 2.
FIGS. 29A and 29B are diagrams showing Embodiment 2.
FIGS. 30A and 30B are diagrams showing Embodiment 2.
FIGS. 32A-1 to 32D-2 are diagrams showing Embodiment 3.
FIGS. 33A-1 to 33C-2 are diagrams showing Embodiment 3.
FIGS. 34A-1 to 34D-2 are diagrams showing Embodiment 3.
FIGS. 35A-1 to 35D-2 are diagrams showing Embodiment 3.
FIGS. 36A-1 to 36D-2 are diagrams showing Embodiment 3.
FIGS. 37A-1 and 37B-2 are diagrams showing Embodiment 3.
FIG. 41 is a diagram showing Embodiment Mode 8.

DETAILED DESCRIPTION OF THE INVENTION

Although the present invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein.

Embodiment Mode 1

Figure 1:
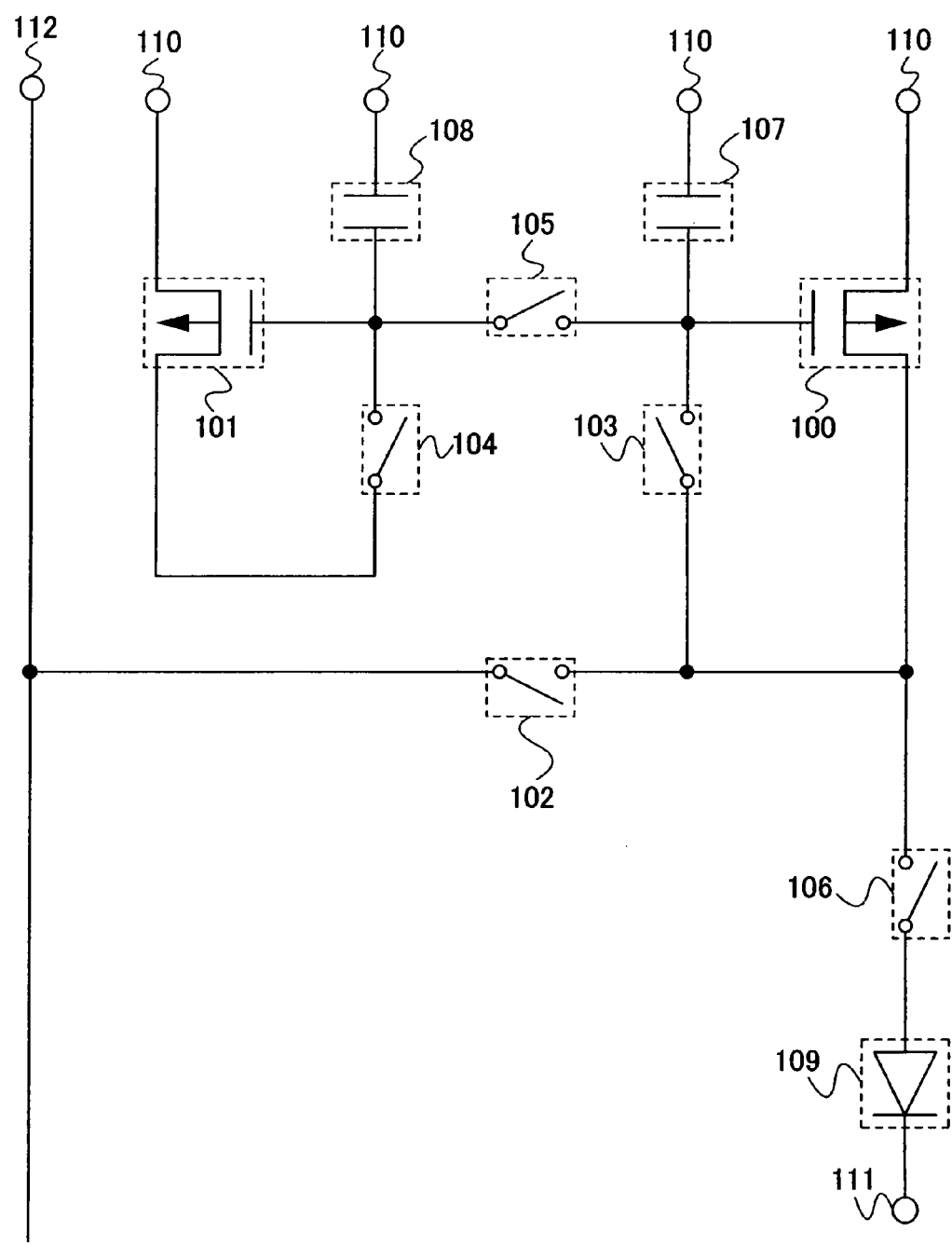
FIG. 1 is a diagram showing Embodiment Mode 1.

In this embodiment mode, description is made with reference to FIG. 1 of a configuration of a display device including a transistor for writing a video signal and controlling a current to be supplied to an EL element, and a transistor for obtaining a threshold voltage in order to shorten writing time per pixel.

In FIG. 1, a first transistor 100 is a transistor which operates in a saturation region and controls a current value flowing through an EL element 109 by a gate-source voltage thereof. A second transistor 101 is a transistor which has similar characteristics to the first transistor 100, such as a threshold voltage and mobility and is coupled with the first transistor 100. Each of a first switch 102, a second switch 103, a third switch 104, a fourth switch 105, and a fifth switch 106 has two terminals and a control terminal. They are switching elements which control conduction (on) or non-conduction (off) between the two terminals by the control terminal. A first capacitor 107 has a pair of electrodes and holds a gate-source voltage of the first transistor 100. A second capacitor 108 has a pair of electrodes and holds a gate-source voltage of the second transistor 101. An EL element 109 is an EL element having a pair of electrodes, of which luminance is determined in proportion to a current value. A power source line 110 is used in common for one row or one column for supplying a voltage to pixels. A counter electrode 111 as the other electrode of the EL element 109 is used in common for all pixels for supplying a voltage to the pixels. A source signal line 112 is used in common for one row or one column for transmitting a current signal as a video signal to pixels.

Connections in FIG. 1 are described. The power source line 110 is connected to a first terminal of the first transistor 100, a first terminal of the second transistor 101, one electrode of the first capacitor 107, and one electrode of the second capacitor 108. The other electrode of the first capacitor 107 is connected to a gate of the first transistor 100 and the other electrode of the second capacitor 108 is connected to a gate of the second transistor 101. The other electrode of the first capacitor 107 and the gate of the first transistor 100 are connected to the other electrode of the second capacitor 108 and the gate of the second transistor 101 through the fourth switch 105. A second terminal of the first transistor 100 is connected to the gate of the first transistor 100 through the second switch 103, to the source signal line 112 through the first switch 102, and to one electrode of the EL element 109 through the fifth switch 106. A second terminal of the second transistor 101 is connected to the gate of the second transistor 101 through the third switch 104.

Figure 3:
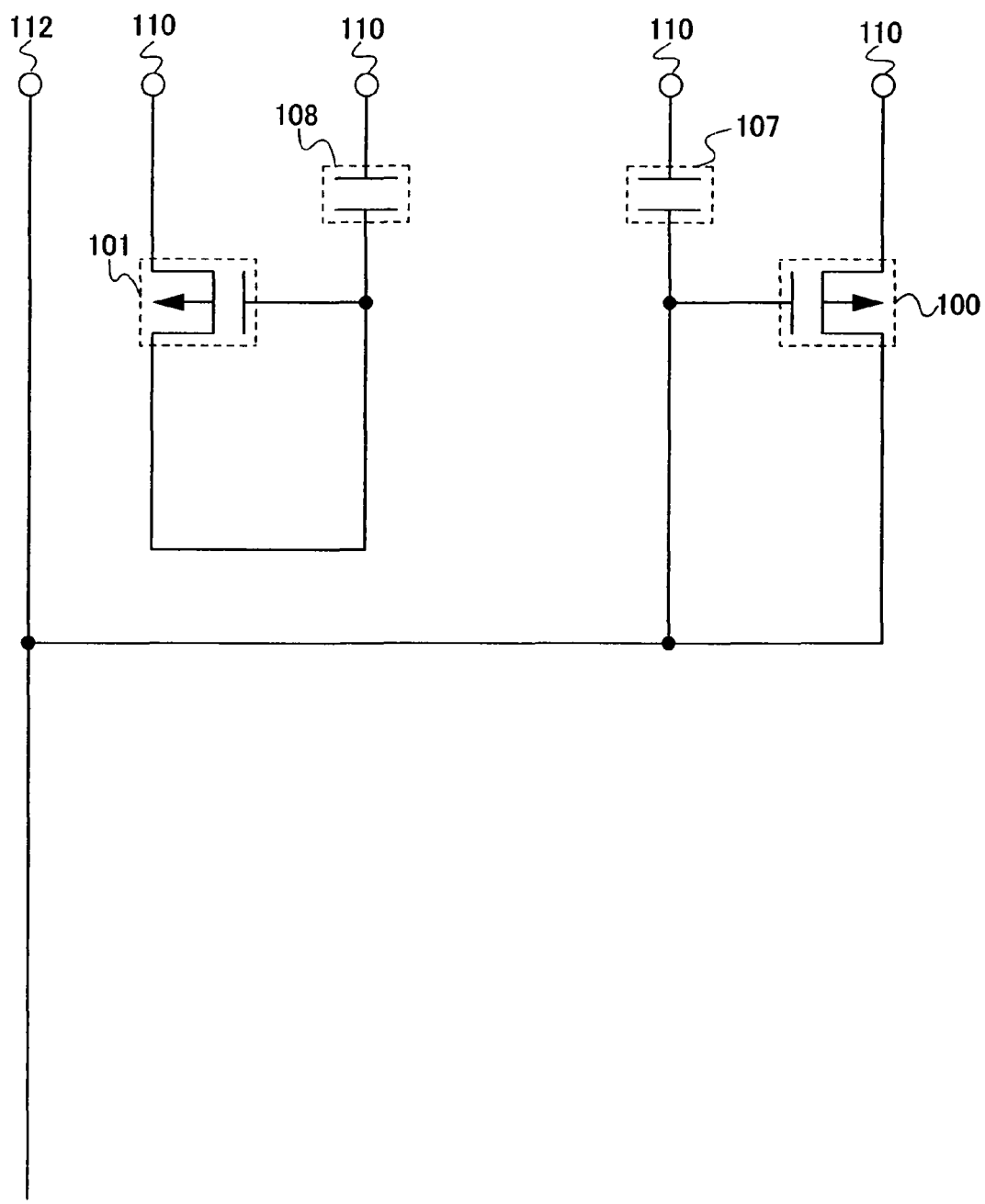
FIG. 3 is a diagram showing Embodiment Modes 1 and 2.
Figure 4:
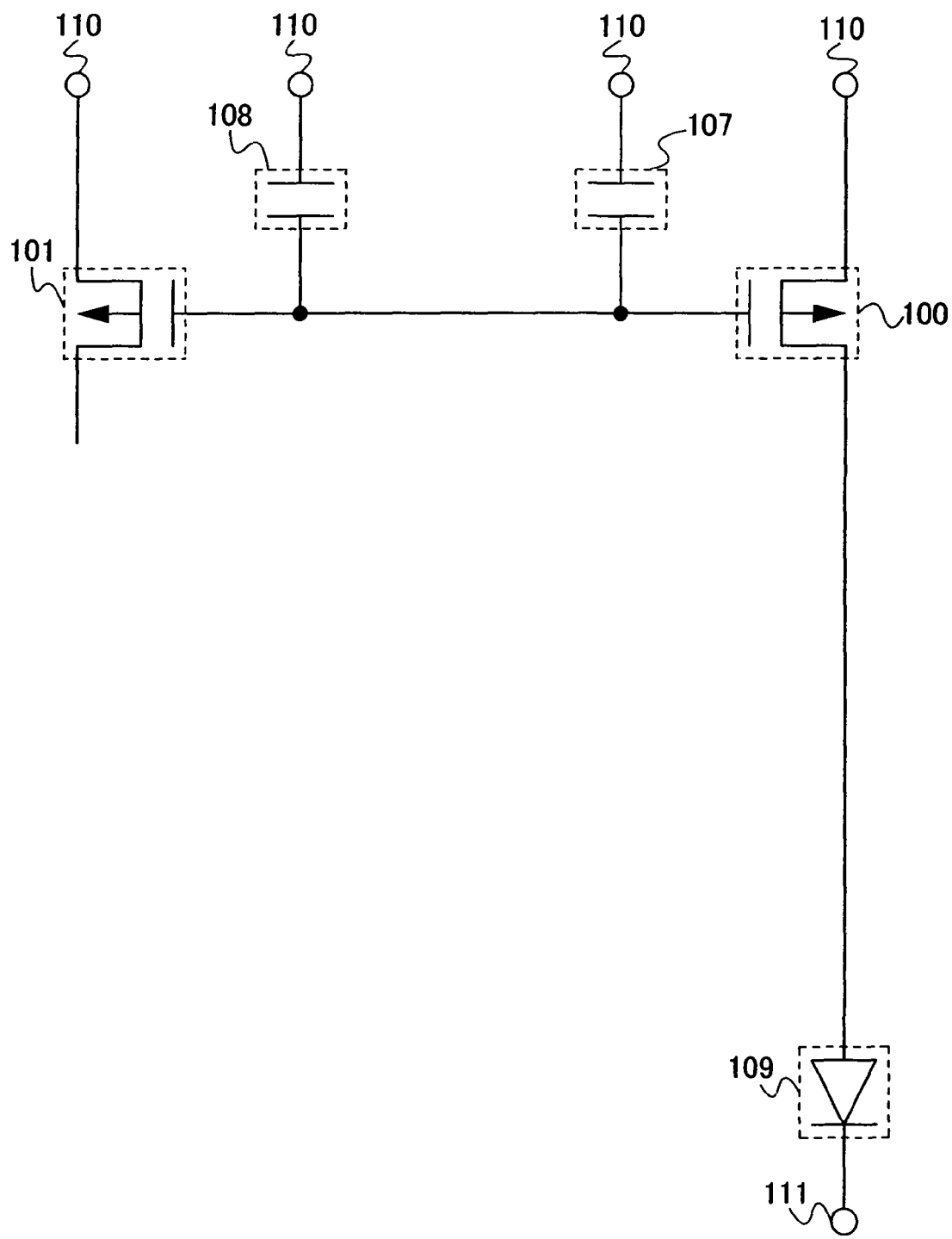
FIG. 4 is a diagram showing Embodiment Modes 1 and 2.

Here, one electrode of the first capacitor 107 and one electrode of the second capacitor 108 are only required to be connected to a terminal of which potential becomes constant in operation. For example, they may be connected to a control terminal of a first switch 102 of a preceding row or another reference line may be additionally provided to be connected. The first switch 102, the second switch 103, the third switch 104, the fourth switch 105, and the fifth switch 106 may be arranged anywhere, as long as the circuit diagram shown in FIG. 1 becomes equivalent to FIG. 3 in a period T1 of FIG. 2 and to FIG. 4 in a period T2 of FIG. 2. The number of switches may be increased as well. Further, FIG. 3 is an equivalent circuit of the pixel circuit shown in FIG. 1 in the period T1 while FIG. 4 is an equivalent circuit of the pixel circuit shown in FIG. 1 in the period T2.

An operation of the pixel circuit shown in FIG. 1 is described with reference to a timing chart shown in FIG. 2. An operation in the period T1 is described. In the period T1, the second switch 103 is turned on, thereby the first transistor 100 is diode-connected, the third switch 104 is turned on, thereby the second transistor 101 is diode-connected. The fourth switch 105 is turned off, thereby the first transistor 100 and the second transistor 101 are electrically disconnected. The fifth switch 106 is turned off, thereby a current supply to the EL element 109 is blocked. The first switch 102 is turned on and a video signal inputted by current from the source signal line 112 flows to the first transistor 100. The first capacitor 107 holds a gate-source voltage of the first transistor 100 so that the current of the video signal flows through the first transistor 100. The second capacitor 108 holds a gate-source voltage which makes no current flow to the second transistor 101. That is, as a threshold voltage of the second transistor 101 is held and characteristics such as a threshold value of the first transistor 100 and those (a threshold voltage, mobility, and the like) of the second transistor 101 are similar to each other, the second capacitor 108 holds a voltage almost equal to the threshold voltage of the first transistor 100. At this time, Idata inputted as a video signal is expressed by Formula (1) and the voltage held in the first capacitor 107 is expressed by Formula (2).

[Formula 1]

$$Idata = \frac{\beta}{2}[Vgs(T1) - Vth]^2 \quad (1)$$

[Formula 2]

$$Vgs(T1) = \sqrt{\frac{2}{\beta}Idata} + Vth \quad (2)$$

In the Formulas (1) and (2), Idata is a current value of a video signal which flows through the source signal line 112, which is inputted to a pixel in the period T1. β is a constant containing parameters such as a channel length, a channel width, mobility, or capacitance of an oxide film of the first transistor 100. Vgs (T1) is a gate-source voltage of the first transistor 100. Vth is a threshold voltage of the first transistor 100 as well as a threshold voltage of the second transistor 101 since the first transistor 100 and the second transistor 101 are paired.

An operation in the period T2 is described. In the period T2, the second switch 103 is turned off, thereby the first transistor 100 is not diode-connected. The third switch 104 is turned off, thereby the second transistor 101 is not diode-connected. The fourth switch 105 is turned on, thereby the first capacitor 107 and the second capacitor 108 are connected. The voltages held in the capacitors are divided by capacitive coupling. The fifth switch 106 is turned on and a current corresponding to the gate-source voltage of the first transistor 100 is supplied to the EL element 109. The first switch 102 is turned off and a video signal from the first source signal line 112 is blocked. At this time, a gate voltage of the first transistor 100 is expressed by Formula (3) and a current value supplied to the EL element 109 is expressed by Formula (4).

[Formula 3]

$$Vgs(T2) = \left(\frac{C107}{C107+C108}\right)[Vgs(t1) - Vth] + Vth \quad (3)$$

[Formula 4]

$$Ioled = \left(\frac{C107}{C107+C108}\right)^2 Idata \quad (4)$$

In Formulas (3) and (4), Idata, β, Vth, and Vgs (T1) are similar to those in the period T1. Ioled is a current value supplied to the EL element 109 in the period T2. That is, Ioled is equal to a current which flows through the first transistor 100 since a voltage is held between the gate and source of the first transistor 100 in the period T2. C107 is capacitance of the first capacitor 107, including gate capacitance of the first transistor 100. C108 is capacitance of the second capacitor 108, including gate capacitance of the second transistor 101.

In the aforementioned Formula (4), a current obtained by multiplying Idata by the square of [C107/(C107+C108)] can be supplied to the EL element 109. Moreover, in the period T2, a current value supplied to the EL element 109 does not vary if it is the same video voltage even when characteristics between other pixels vary, as long as the characteristics (a threshold voltage, mobility, and the like) of the first transistor 100 and those (a threshold voltage, mobility, and the like) of the second transistor 101 are similar to each other.

In this manner, a smaller current than a current of a video signal inputted to a pixel can be supplied to an EL element while compensating the variation in characteristics of driving transistors. Therefore, a certain degree of large current can be inputted even when expressing a low gray scale instead of inputting a slight amount of current as a video signal. As a result, speed to charge parasitic capacitance of a source signal line and the like can be increased. As a threshold voltage is obtained and a video signal is written simultaneously in the period T1, writing time per pixel can be shortened.

In this embodiment mode, since the second switch 103 and the third switch 104 are turned on or off at the same timing, they can have a common control terminal. In such a structure, the number of signals to be inputted to a pixel or the number of wires can be reduced. Thus, a driver circuit which controls the pixel can be simplified and a high aperture ratio can be realized.

A channel width, a channel length, and the like of the first transistor 100 are preferably more than those of the second transistor 101. It is only required that the characteristics of the first transistor 100 be similar to those (a threshold voltage, mobility, and the like) of the second transistor 101, therefore, a higher aperture ratio can be realized by making a channel width of the second transistor 101 narrower and a channel length of the second transistor 101 shorter.

Kinds of a switching element used in this embodiment mode is described. In the invention, a switching element may be an electrical switch or a mechanical switch as long as it can control a current flow. A diode or a logic circuit in which a diode and a transistor are combined may also be used.

Further, kinds of transistors applicable to the invention are not limited. A transistor using a non-single crystal semiconductor film typified by amorphous silicon or polycrystal silicon, a MOS transistor, a junction transistor, or a bipolar transistor which are formed using a semiconductor substrate or an SOI substrate, a transistor using an organic semiconductor or a carbon nanotube, or other transistors can be used. Further, kinds of substrates over which a transistor is formed are not limited and a single crystal substrate, an SOI substrate, a quartz substrate, a glass substrate, a resin substrate, or the like can be freely used.

Polarity (conductivity type) of a transistor may be either an n-channel type or a p-channel type because the transistor operates just as a switching element. It is to be noted in the case where an off current is desired to be small that a transistor with a less off current is desirably used. As such a transistor, there is a transistor provided with a region to which an impurity element imparting conductivity is added at a low concentration between a channel forming region and a source or drain region (referred to as an LDD region).

Further, in the case where a transistor operates with a source potential being close to a low potential side power source, the transistor is desirably an n-channel transistor. On the other hand, in the case where a transistor operates with a source potential being close to a high potential side power source, the transistor is desirably a p-channel transistor. With such a structure, an absolute value of a gate-source voltage of a transistor can be set larger, thereby the transistor can easily be operated as a switch. Note that a CMOS switching element may be formed by using both an n-channel transistor and a p-channel transistor.

Embodiment Mode 2

In Embodiment Mode 1, a transistor can be used as a switching element. This embodiment mode describes a configuration where a p-channel transistor is used as a switching element with reference to FIG. 5.

Figure 5:
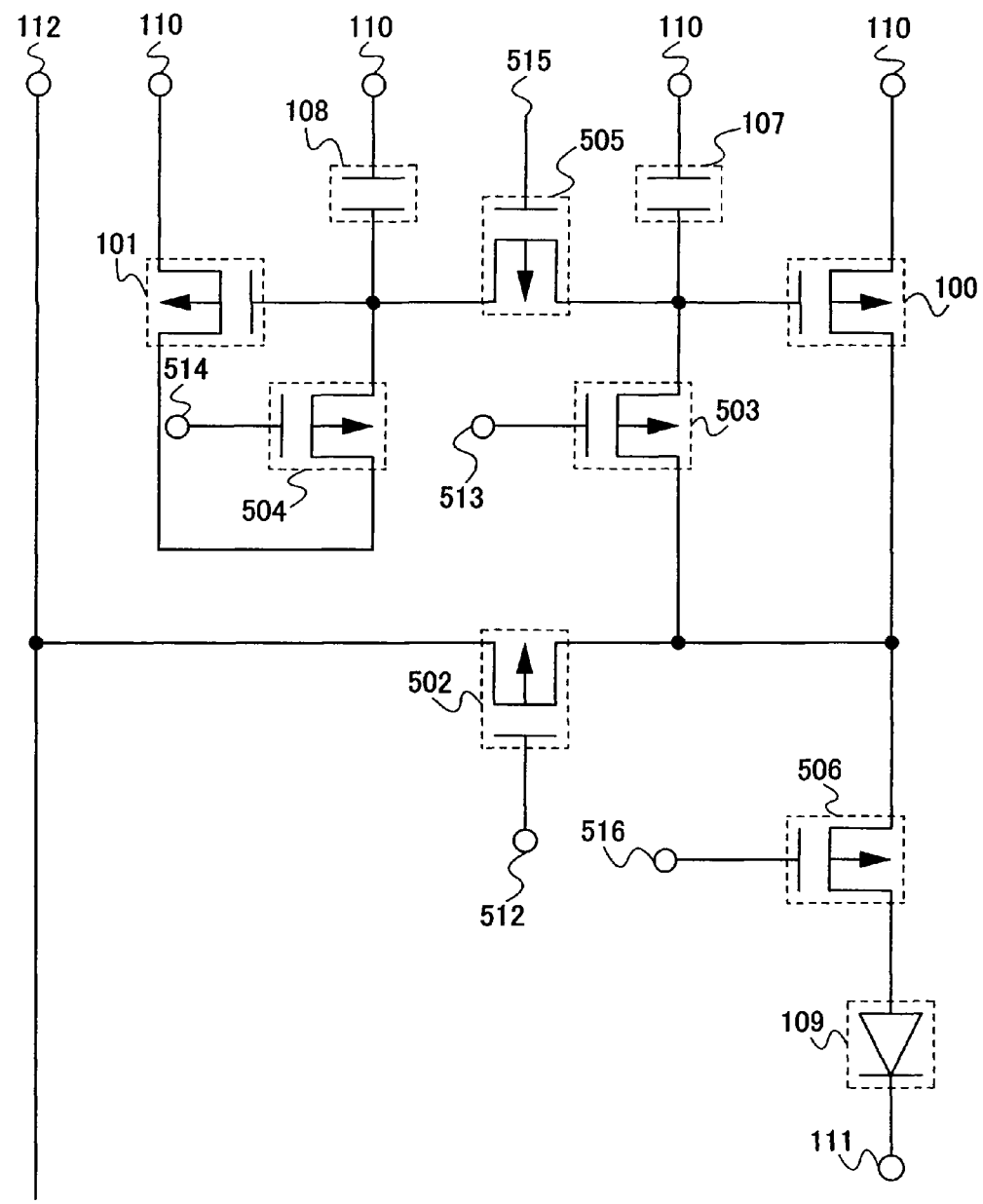
FIG. 5 is a diagram showing Embodiment Mode 2.

In FIG. 5, the first transistor 100, the second transistor 101, the first capacitor 107, the second capacitor 108, the EL element 109, the power source line 110, the counter electrode 111, and the source signal line 112 are similar to those in Embodiment Mode 1. A third transistor 502, a fourth transistor 503, a fifth transistor 504, a sixth transistor 505, and a seventh transistor 506 each has a function as a switching element and operates in a linear region. The third transistor 502, the fourth transistor 503, the fifth transistor 504, the sixth transistor 505, and the seventh transistor 506 are controlled by a digital signal from a first gate signal line 512, a second gate signal line 513, a third gate signal line 514, a fourth gate signal line 515, and a fifth gate signal line 516 respectively, which are turned off when the digital signal is High and on when the digital signal is Low. A signal voltage which makes a gate-source voltage of a transistor to be inputted higher than a threshold voltage thereof is referred to as High while a signal voltage which makes a gate-source voltage of a transistor to be inputted lower than a threshold voltage thereof is referred to as Low.

Connections in FIG. 5 are described. The power source line 110 is connected to the first terminal of the first transistor 100, the first terminal of the second transistor 101, one electrode of the first capacitor 107, and one electrode of the second capacitor 108. The other electrode of the first capacitor 107 is connected to the gate of the first transistor 100 while the other electrode of the second capacitor 108 is connected to the gate of the second transistor 101. The other electrode of the first capacitor 107 and the gate of the first transistor 100 are connected to a first terminal of the sixth transistor 505 while the other electrode of the second capacitor 108 and the gate of the second transistor 101 are connected to a second terminal of the sixth transistor 505. The second terminal of the first transistor 100 is connected to the first terminal of the fourth transistor 503 while a second terminal of the fourth transistor 503 is connected to the gate of the first transistor 100. The second terminal of the first transistor 100 is connected to the first terminal of the third transistor 502 while a second terminal of the third transistor 502 is connected to the source signal line 112. The second terminal of the first transistor 100 is connected to a first terminal of the seventh transistor 506 while a second terminal of the seventh transistor 506 is connected to one electrode of the EL element 109. The second terminal of the second transistor 101 is connected to a first terminal of the fifth transistor 504 while a second terminal of the fifth transistor 504 is connected to the gate of the second transistor 101.

Here, similarly to Embodiment Mode 1, one electrode of the first capacitor 107 and one electrode of the second capacitor 108 are only required to be connected to a terminal of which potential becomes constant in operation. For example, they may be connected to a first gate signal line 512 of a preceding row or another reference line may be additionally provided to be connected. The third transistor 502, the fourth transistor 503, the fifth transistor 504, the sixth transistor 505, and the seventh transistor 506 may be arranged anywhere, as long as the circuit diagram shown in FIG. 5 becomes equivalent to FIG. 3 in a period T1 of FIG. 6 and to FIG. 4 in a period T2 of FIG. 6. The number of transistors may be increased as well. Further, FIG. 3 is an equivalent circuit of the pixel circuit shown in FIG. 5 in the period T1 while FIG. 4 is an equivalent circuit of the pixel circuit shown in FIG. 5 in the period T2.

Figure 6:
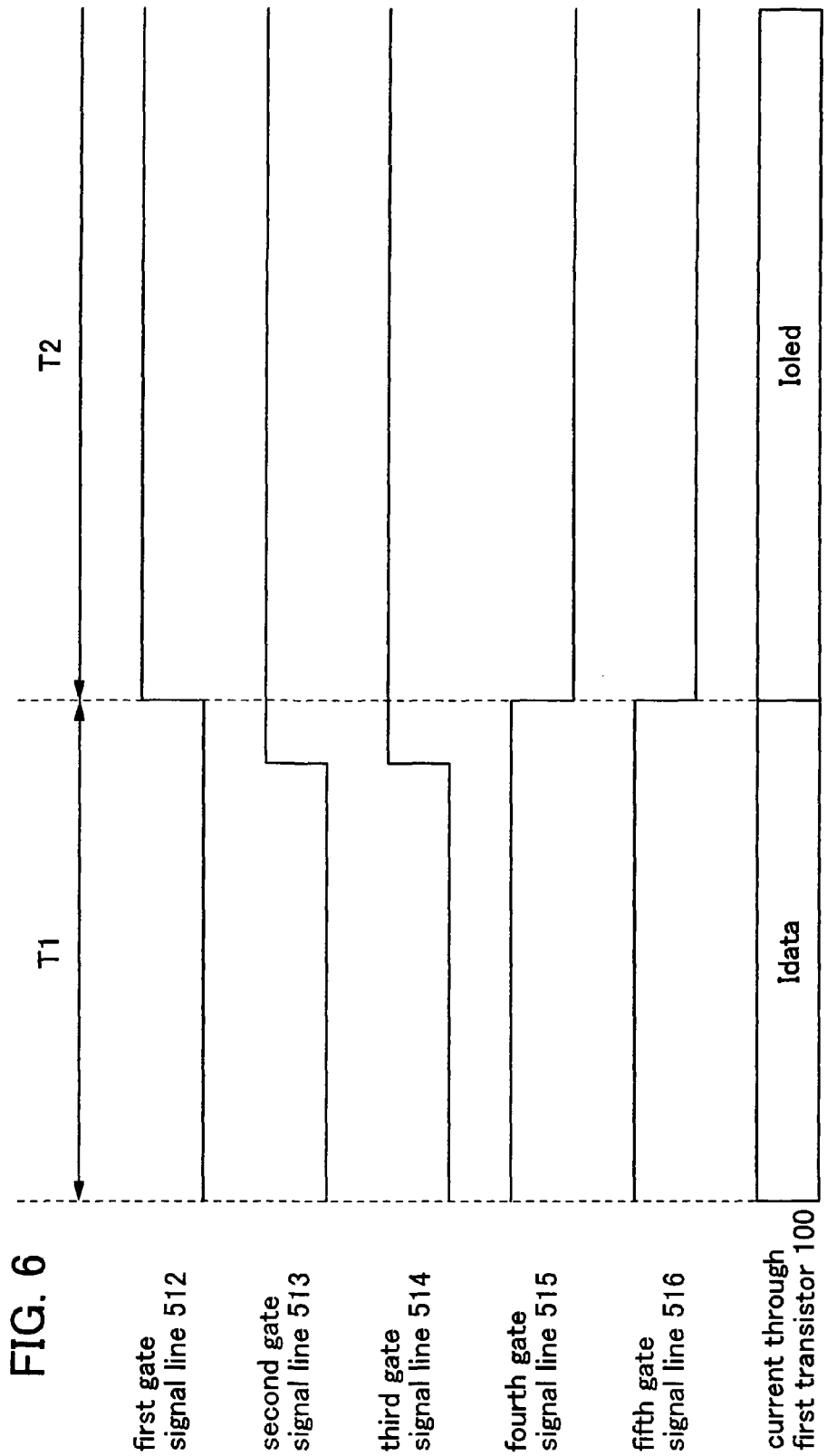
FIG. 6 is a diagram showing Embodiment Mode 2.

An operation of the circuit shown in FIG. 5 is described with reference to a timing chart of FIG. 6. An operation of the period T1 is described. In the period T1, the fourth transistor 503 is turned on, thereby the first transistor 100 is diode-connected, and the fifth transistor 504 is turned on, thereby the second transistor 101 is diode-connected. The sixth transistor 505 is turned off, thereby the first transistor 100 and the second transistor 101 are electrically disconnected. The seventh transistor 506 is turned off, thereby a current supply to the EL element 109 is blocked. The third transistor 502 is turned on and a video signal inputted by current from the source signal line 112 flows to the first transistor 100. The first capacitor 107 holds a gate-source voltage of the first transistor 100 so that the current of the video signal flows through the first transistor 100. The second capacitor 108 holds a gate-source voltage which makes no current flow through the second transistor 101. That is, as a threshold voltage of the second transistor 101 is held and characteristics (a threshold voltage, mobility, and the like) of the first transistor 100 and those of the second transistor 101 are similar to each other. Therefore, the first capacitor 107 holds a voltage almost equal to the threshold voltage of the first transistor 100. At this time, Idata inputted as a video signal is expressed by Formula (1) and the voltage held in the first capacitor 107 is expressed by Formula (2), similarly to Embodiment Mode 1.

In Formulas (1) and (2), Idata is a current value of a video signal which flows through the source signal line 112, which is inputted to a pixel in the period T1. β is a constant containing parameters such as a channel length, a channel width, mobility, or capacitance of an oxide film, of the first transistor 100. Vgs (T1) is a gate-source voltage of the first transistor 100. Vth is a threshold voltage of the first transistor 100 as well as a threshold voltage of the second transistor 101 since the first transistor 100 and the second transistor 101 are paired.

An operation in the period T2 is described. In the period T2, the fourth transistor 503 is turned off, thereby the first transistor 100 is not diode-connected. The fifth transistor 504 is turned off, thereby the second transistor 101 is not diode-connected. The sixth transistor 505 is turned on, thereby the first capacitor 107 and the second capacitor 108 are connected. The voltages held in the capacitors are divided by capacitive coupling. The seventh transistor 506 is turned on and a current corresponding to the gate-source voltage of the first transistor 100 is supplied to the EL element 109. The third switch 502 is turned off and a video signal from the source signal line 112 is blocked. At this time, a gate voltage of the first transistor 100 is expressed by Formula (3) and the current value supplied to the EL element 109 is expressed by Formula (4).

In Formulas (3) and (4), Idata, β, Vth, and Vgs (T1) are similar to those in the period T1. Ioled is a current value supplied to the EL element 109 in the period T2. That is, Ioled is equal to a current which flows through the first transistor 100 since a voltage is held between the gate and source of the first transistor 100 in the period T2. C107 is capacitance of the first capacitor 107, including gate capacitance of the first transistor 100. C108 is capacitance of the second capacitor 108, including gate capacitance of the second transistor 101.

In the aforementioned Formula (4), a current obtained by multiplying Idata by the square of [C107/(C107+C108)] can be supplied to the EL element 109. Moreover, in the period T2, a current value supplied to the EL element 109 does not vary if it is the same video signal even when characteristics between other pixels vary, as long as the characteristics (a threshold voltage, mobility, and the like) of the first transistor 100 and those of the second transistor 101 are similar to each other.

In this manner, a smaller current than a current of a video signal inputted to a pixel can be supplied to an EL element while compensating the variation in characteristics of driving transistors. Therefore, a certain degree of large current can be inputted even when expressing a low gray scale instead of inputting a slight amount of current as a video signal. As a result, speed to charge parasitic capacitance of a source signal line and the like can be increased. As a threshold voltage is obtained and a video signal is written simultaneously in the period T1, writing time per pixel can be shortened.

By using a p-channel transistor for all the switching elements, a doping step for an n-channel transistor is not required. Therefore, manufacturing steps can be simplified and inexpensively performed.

In this embodiment mode, as a common signal flows through the second gate signal line 513 and the third gate signal line 514, the second gate signal line 513 and the third gate signal line 514 can be used in common. By using the gate signal line in common, the number of signals inputted to a pixel and the number of wires can be reduced. Thus, a driver circuit which controls the pixel can be simplified and a high aperture ratio can be realized.

A channel width, a channel length, and the like of the first transistor 100 are preferably more than those of the second transistor 101. It is only required that the characteristics of the first transistor 100 be similar to those (a threshold voltage, mobility, and the like) of the second transistor 101, therefore, a higher aperture ratio can be realized by making a channel width of the second transistor 101 narrower and a channel length of the second transistor 101 shorter.

Although a p-channel transistor is used as a switching element here, an n-channel transistor may also be used. In that case, a signal inputted to a gate of the transistor which operates as a switching element is to be reversed.

Embodiment Mode 3

Figure 7:
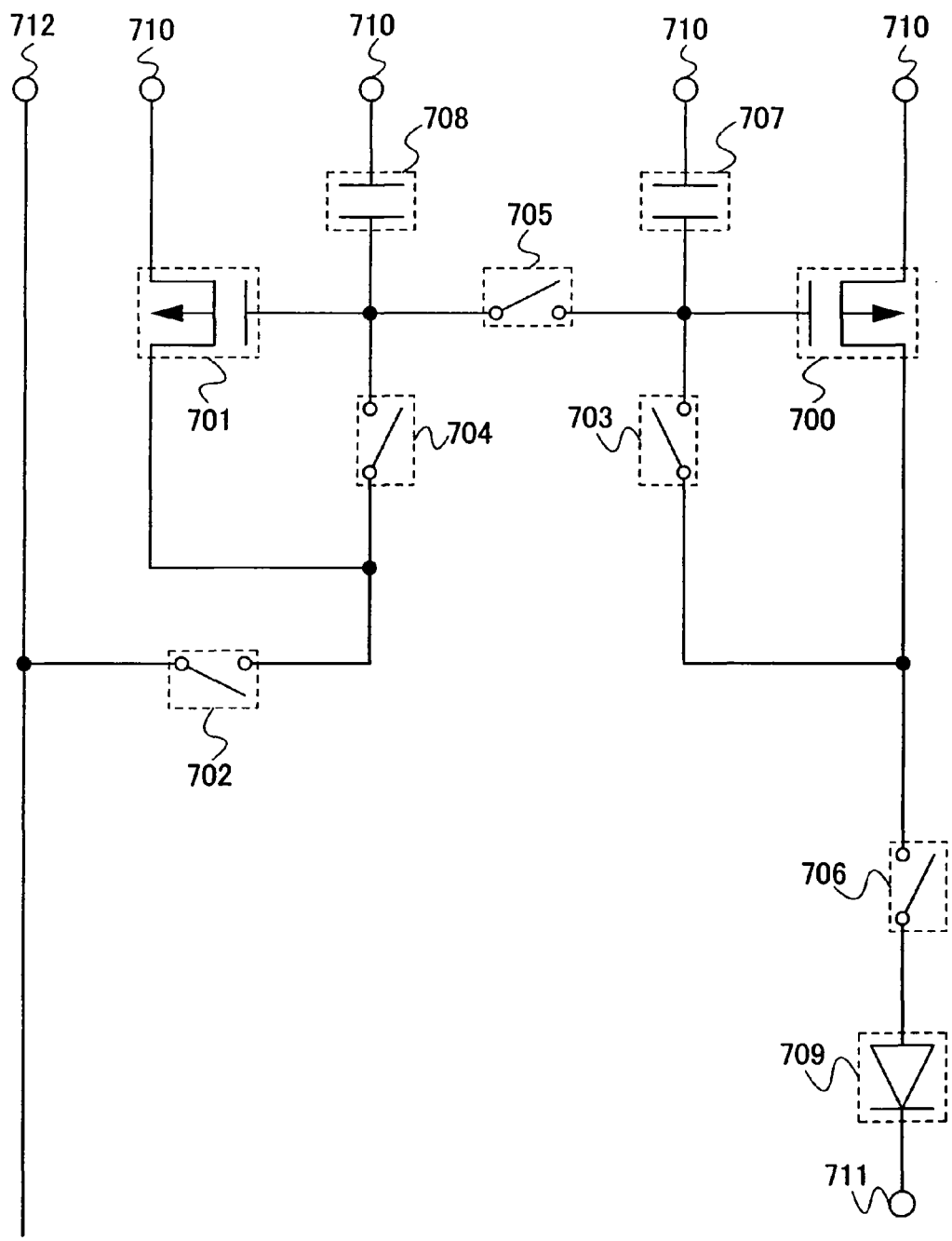
FIG. 7 is a diagram showing Embodiment Mode 3.

This embodiment mode describes a configuration of a display device for controlling a current supplied to an EL element by using a transistor which obtains a threshold voltage in order to prevent characteristics deterioration of a transistor due to the concentration of current to one of the transistors with reference to FIG. 7.

In FIG. 7, the first transistor 700 is a driving transistor which operates in a saturation region and controls a current value supplied to an EL element 709 by a gate-source voltage. The second transistor 701 has characteristics such as a threshold voltage and mobility similar to those of the first transistor 700 and is paired with the first transistor 700. The first switch 702, the second switch 703, the third switch 704, the fourth switch 705, and the fifth switch 706 are switching elements each having two terminals and a control terminal, which are controlled to be conductive (on) or non-conductive (off) between the two terminals by the control terminal. A first capacitor 707 has a pair of electrodes and holds a gate-source voltage of the first transistor 700. A second capacitor 708 has a pair of electrodes and holds a gate-source voltage of the second transistor 701. The EL element 709 has a pair of electrodes, of which luminance is determined in proportion to a current value. A power source line 710 is used in common for one row or one column for supplying a voltage to pixels. A counter electrode 711 as the other electrode of the EL element 709 is used in common for all pixels for supplying a voltage to the pixels. A source signal line 712 is used in common for one row or one column for transmitting a current signal as a video signal to pixels.

A connection of a circuit shown in FIG. 7 is described. The power source line 710 is connected to a first terminal of the first transistor 700, a first terminal of the second transistor 701, one electrode of the first capacitor 707, and one electrode of the second capacitor 708. The other electrode of the first capacitor 707 is connected to a gate of the first transistor 700 while the other electrode of the second capacitor 708 is connected to a gate of the second transistor 701. The other electrode of the first capacitor 707 and the gate of the first transistor 700 are connected to the other electrode of the second capacitor 708 and the gate of the second transistor 701 through the fourth switch 705. The second terminal of the first transistor 700 is connected to the gate of the first transistor 700 through the second switch 703 and to one electrode of the EL element 709 through the fifth switch 706. The second terminal of the second transistor 701 is connected to the gate of the second transistor 701 through the third switch 704 and to the source signal line 712 through the first switch 702.

Figure 8:
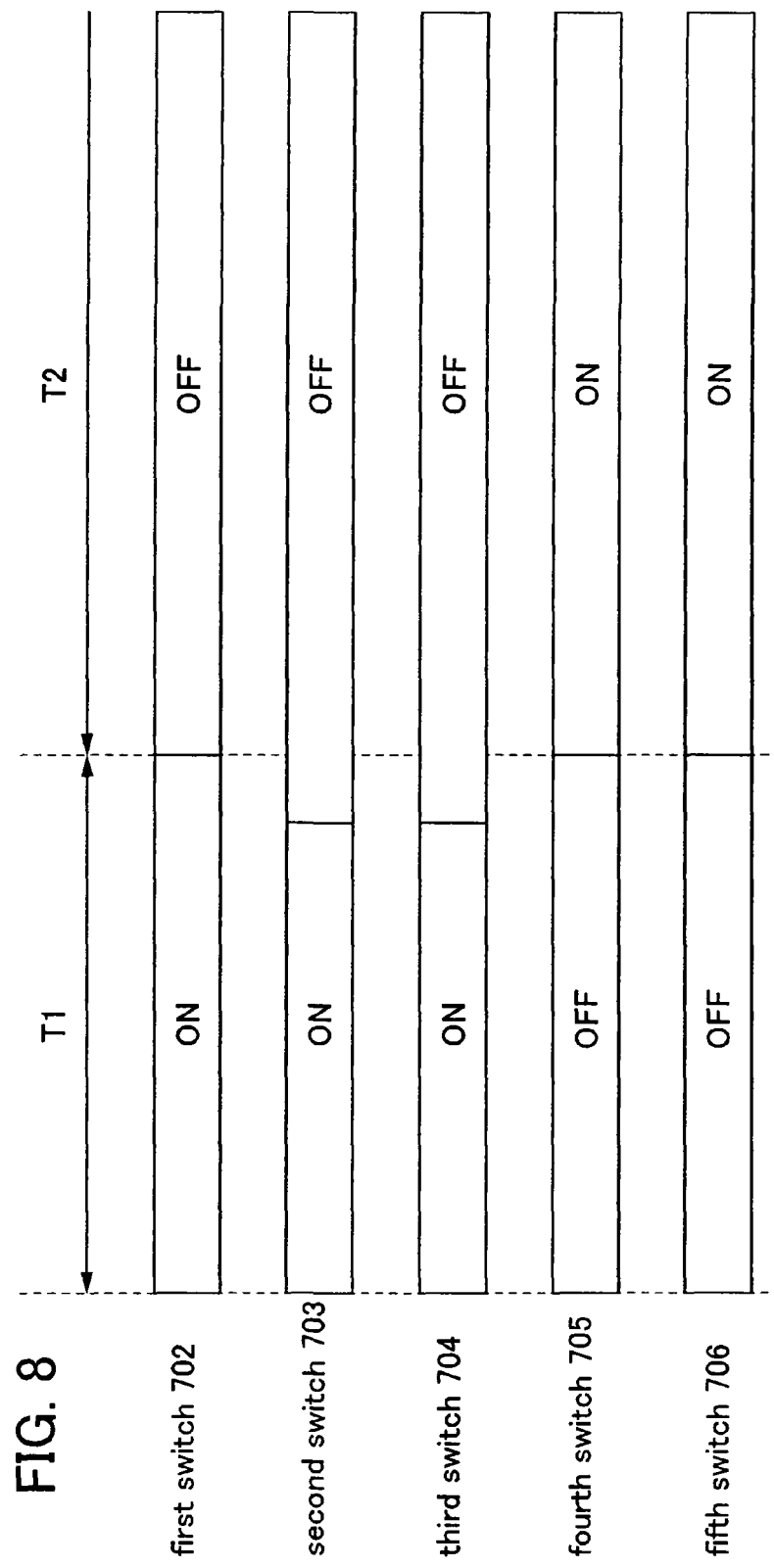
FIG. 8 is a diagram showing Embodiment Mode 3.
Figure 9:
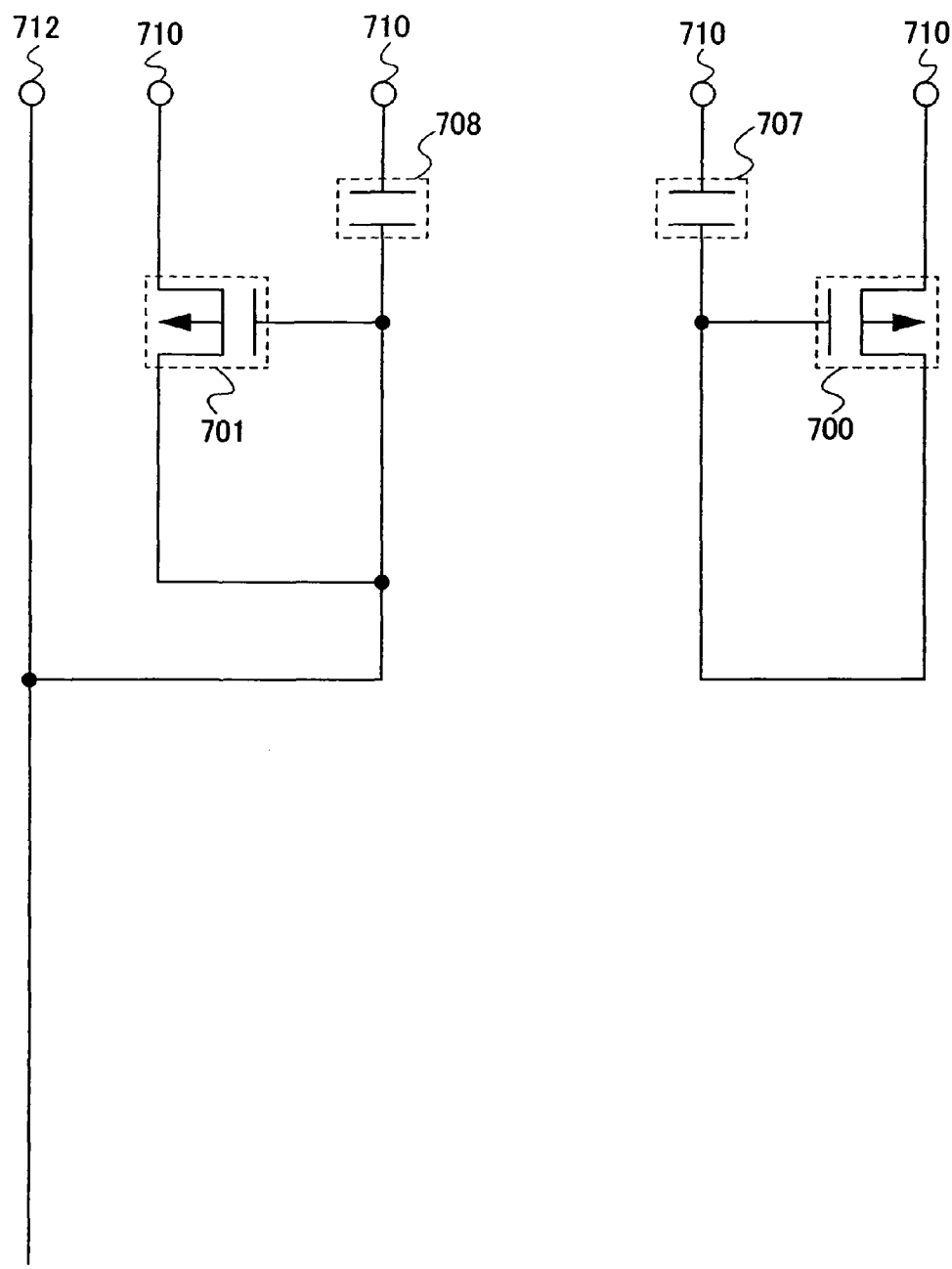
FIG. 9 is a diagram showing Embodiment Modes 3 and 4.
Figure 10:
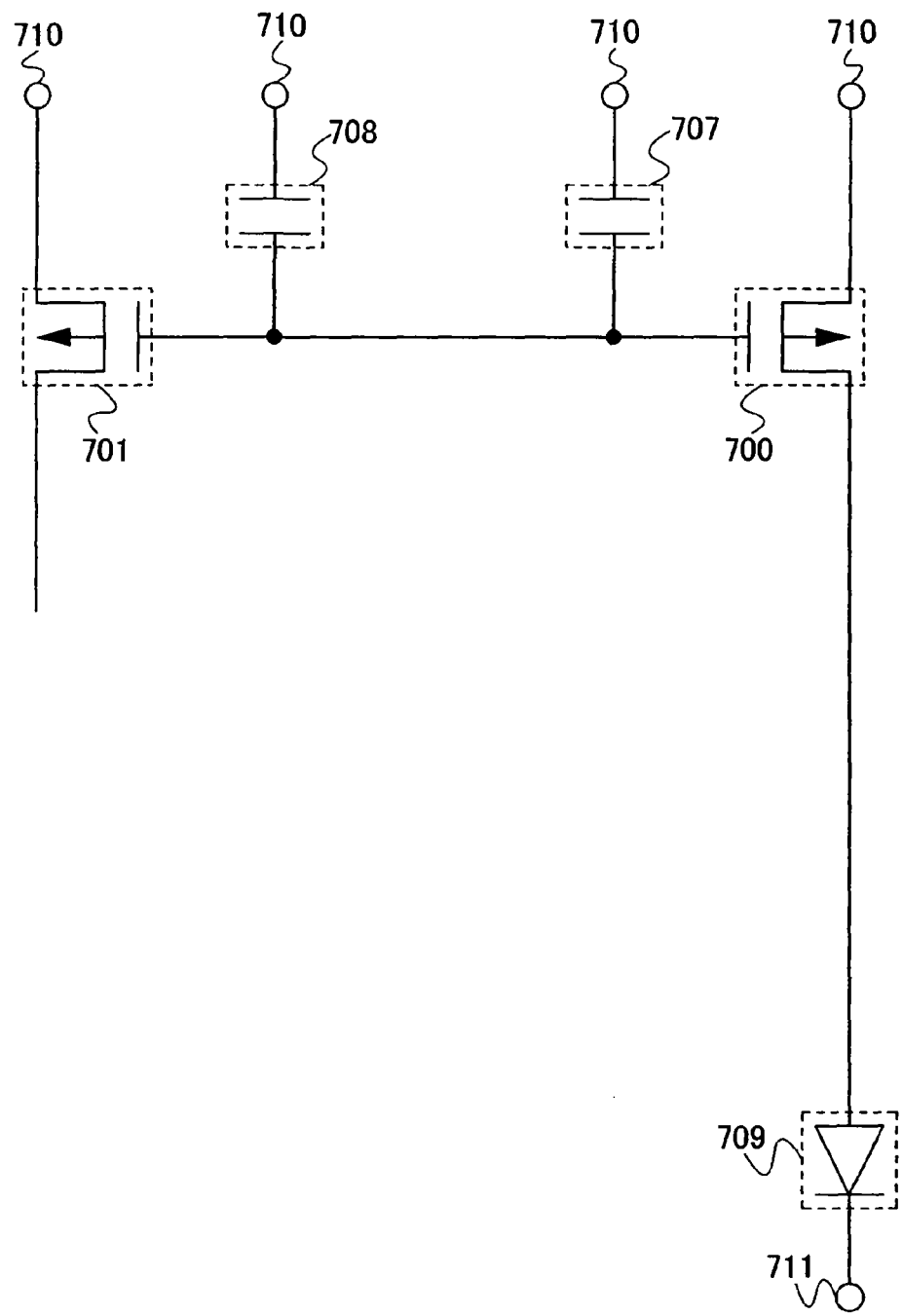
FIG. 10 is a diagram showing Embodiment Modes 3 and 4.

Here, one electrode of the first capacitor 707 and one electrode of the second capacitor 708 are only required to be connected to a terminal of which potential becomes constant in operation. For example, they may be connected to a control terminal of a first switch 702 of a preceding row or another reference line may be additionally provided to be connected. The first switch 702, the second switch 703, the third switch 704, the fourth switch 705, and the fifth switch 706 may be arranged anywhere, as long as the circuit diagram shown in FIG. 7 becomes equivalent to FIG. 9 in a period T1 of FIG. 8 and to FIG. 10 in a period T2 of FIG. 8. The number of switches may be increased as well. Further, FIG. 9 is an equivalent circuit of the pixel circuit shown in FIG. 7 in the period T1 while FIG. 10 is an equivalent circuit of the pixel circuit shown in FIG. 7 in the period T2.

An operation of the circuit shown in FIG. 7 is described with reference to a timing chart of FIG. 8. An operation in the period T1 is described. In the period T1, the second switch 703 is turned on, thereby the first transistor 700 is diode-connected, and the third switch 704 is turned on, thereby the second transistor 701 is diode-connected. The fourth switch 705 is turned off, thereby the first transistor 700 and the second transistor 701 are electrically disconnected. The fifth switch 706 is turned off, thereby a current supply to the EL element 709 is blocked. The first switch 702 is turned on and a video signal inputted by current from the source signal line 712 flows to the second transistor 701. The second capacitor 708 holds a gate-source voltage of the second transistor 701 so that the current of the video signal flows through the second transistor 701. The first capacitor 707 holds a gate-source voltage which makes no current flow through the first transistor 700. That is, as a threshold voltage of the first transistor 700 is held, characteristics (a threshold voltage, mobility, and the like) of the first transistor 700 and those of the second transistor 701 are similar to each other, the second capacitor 708 holds a voltage almost equal to the threshold voltage of the second transistor 701. At this time, Idata inputted as a video signal is expressed by Formula (5) and the voltage held in the second capacitor 708 is expressed by Formula (6).

[Formula 5]

$$Idata = \frac{\beta}{2}[Vgs(T1) - Vth]^2 \quad (5)$$

[Formula 6]

$$Vgs(T1) = \sqrt{\frac{2}{\beta}Idata} + Vth \quad (6)$$

In Formulas (5) and (6), Idata is a current value of a video signal which flows through the source signal line 712, which is inputted to a pixel in the period T1. β is a constant containing parameters such as a channel length, a channel width, mobility, or capacitance of an oxide film of the second transistor 701. Vgs (T1) is a gate-source voltage of the second transistor 701. Vth is a threshold voltage of the first transistor 700 as well as a threshold voltage of the second transistor 701 since the first transistor 700 and the second transistor 701 are paired.

An operation in the period T2 is described. In the period T2, the second switch 703 is turned off, thereby the first transistor 700 is not diode-connected. The third switch 704 is turned off, thereby the second transistor 701 is not diode-connected. The fourth switch 705 is turned on, thereby the first capacitor 707 and the second capacitor 708 are connected. The voltages held in the capacitors are divided by capacitive coupling. The fifth switch 706 is turned on and a current corresponding to the gate-source voltage of the first transistor 700 is supplied to the EL element 709. The first switch 702 is turned off and a video signal from the source signal line 712 is blocked. At this time, a gate voltage of the first transistor 700 is expressed by Formula (7) and the current value supplied to the EL element 709 is expressed by Formula (8).

[Formula 7]

$$Vgs(T2) = \left(\frac{C708}{C707 + C708}\right)[Vgs(T1) - Vth] + Vth \quad (7)$$

[Formula 8]

$$Ioled = \left(\frac{C708}{C707 + C708}\right)^2 Idata \quad (8)$$

In Formulas (7) and (8), Idata, β, Vth, and Vgs (T1) are similar to those in the period T1. Ioled is a current value supplied to the EL element 709 in the period T2. That is, Ioled is equal to a current which flows through the first transistor 700 since a voltage is held between the gate and source of the first transistor 700 in the period T2. C707 is capacitance of the first capacitor 707, including gate capacitance of the first transistor 700. C708 is capacitance of the second capacitor 708, including gate capacitance of the second transistor 701.

In the aforementioned Formula (8), a current obtained by multiplying Idata by the square of [C708/(C707+C708)] can be supplied to the EL element 709. Moreover, in the period T2, a current value supplied to the EL element 709 does not vary if it is the same video signal even when characteristics between other pixels vary, as long as the characteristics (a threshold voltage, mobility, and the like) of the first transistor 700 and those of the second transistor 701 are similar to each other.

In this manner, a smaller current than a current of a video signal inputted to a pixel can be supplied to an EL element while compensating the variation in characteristics of driving transistors. Therefore, a certain degree of large current can be inputted even when expressing a low gray scale instead of inputting a slight amount of current as a video signal. As a result, speed to charge parasitic capacitance of a source signal line and the like can be increased. As a threshold voltage is obtained and a video signal is written simultaneously in the period T1, writing time per pixel can be shortened.

By providing the first transistor 700 as a driving transistor and the second transistor 701 for writing a video signal, a current can be prevented from continuing to flow through either of the transistors. As a result, difference between the first transistor 700 and the second transistor 701 in characteristics deterioration can be prevented from being large and the characteristics are prevented from being different from each other. In this manner, an organic EL display with high image quality and less variations in luminance among pixels can be provided.

In this embodiment mode, since the second switch 703 and the third switch 704 are turned on or off at the same timing, they can have a common control terminal. In such a structure, the number of signals to be inputted to a pixel or the number of wires can be reduced. Thus, a driver circuit which controls the pixel can be simplified and a high aperture ratio can be realized.

A channel width, a channel length, and the like of the first transistor 700 are preferably more than those of the second transistor 701. It is only required that the characteristics (a threshold voltage, mobility, and the like) of the first transistor 700 be similar to those of the second transistor 701, therefore, a higher aperture ratio can be realized by making a channel width of the second transistor 701 narrower and a channel length of the second transistor 701 shorter.

The switching element described in this embodiment mode can be similar to that described in Embodiment Mode 1.

Embodiment Mode 4

In Embodiment Mode 3, a transistor can be used as a switching element. In this embodiment mode, a configuration in which a p-channel transistor is used as a switching element is described with reference to FIG. 11.

Figure 11:
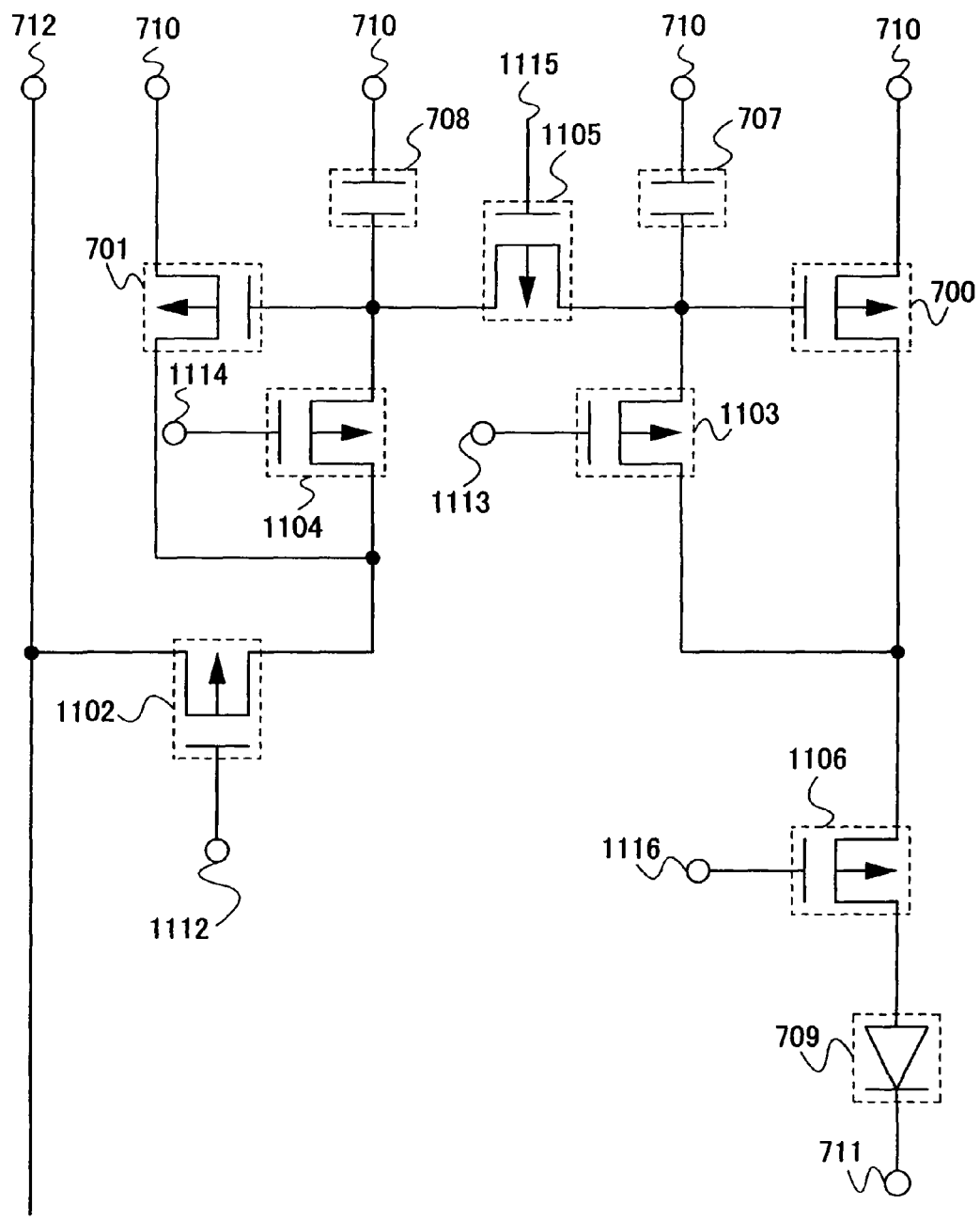
FIG. 11 is a diagram showing Embodiment Mode 4.

In FIG. 11, the first transistor 700, the second transistor 701, the first capacitor 707, the second capacitor 708, the EL element 709, the power source line 710, the counter electrode 711, and the source signal line 712 are similar to those in Embodiment Mode 3. A third transistor 1102, a fourth transistor 1103, a fifth transistor 1104, a sixth transistor 1105, and a seventh transistor 1106 each has a function as a switching element and operates in a linear region. The third transistor 1102, the fourth transistor 1103, the fifth transistor 1104, the sixth transistor 1105, and the seventh transistor 1106 are controlled by a digital signal from a first gate signal line 1112, a second gate signal line 1113, a third gate signal line 1114, a fourth gate signal line 1115, and a fifth gate signal line 1116 respectively, which are turned off when the digital signal is High and on when the digital signal is Low. A signal voltage which makes a gate-source voltage of a transistor to be inputted higher than a threshold voltage thereof is referred to as High while a signal voltage which makes a gate-source voltage of a transistor to be inputted lower than a threshold voltage thereof is referred to as Low.

Connections in FIG. 11 are described. The power source line 710 is connected to the first terminal of the first transistor 700, the first terminal of the second transistor 701, one electrode of the first capacitor 707, and one electrode of the second capacitor 708. The other electrode of the first capacitor 707 is connected to the gate of the first transistor 700 while the other electrode of the second capacitor 708 is connected to the gate of the second transistor 701. The other electrode of the first capacitor 707 and the gate of the first transistor 700 are connected to a first terminal of the sixth transistor 1105 while the other electrode of the second capacitor 708 and the gate of the second transistor 701 are connected to a second terminal of the sixth transistor 1105. The second terminal of the first transistor 700 is connected to a first terminal of the fourth transistor 1103 while a second terminal of the fourth transistor 1103 is connected to the gate of the first transistor 700. The second terminal of the first transistor 700 is connected to the first terminal of the seventh transistor 1106 while a second terminal of the seventh transistor 1106 is connected to one electrode of the EL element 709. The second terminal of the second transistor 701 is connected to a first terminal of the fifth transistor 1104 while a second terminal of the fifth transistor 1104 is connected to the gate of the second transistor 701. The second terminal of the second transistor 701 is connected to a first terminal of the third transistor 1102 while a second terminal of the third transistor 1102 is connected to the source signal line 712.

Figure 15:
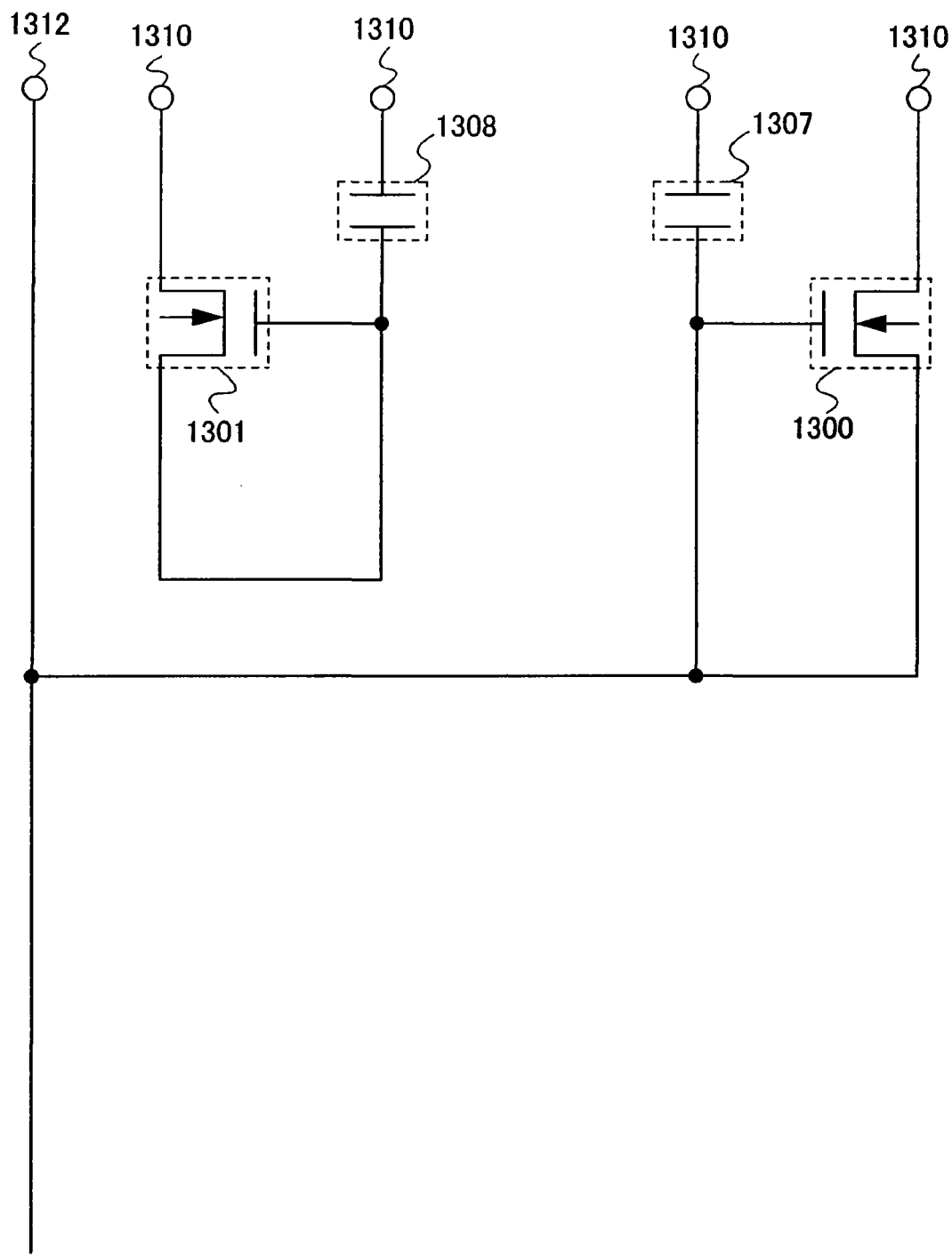
FIG. 15 is a diagram showing Embodiment Modes 5 and 6.
Figure 16:
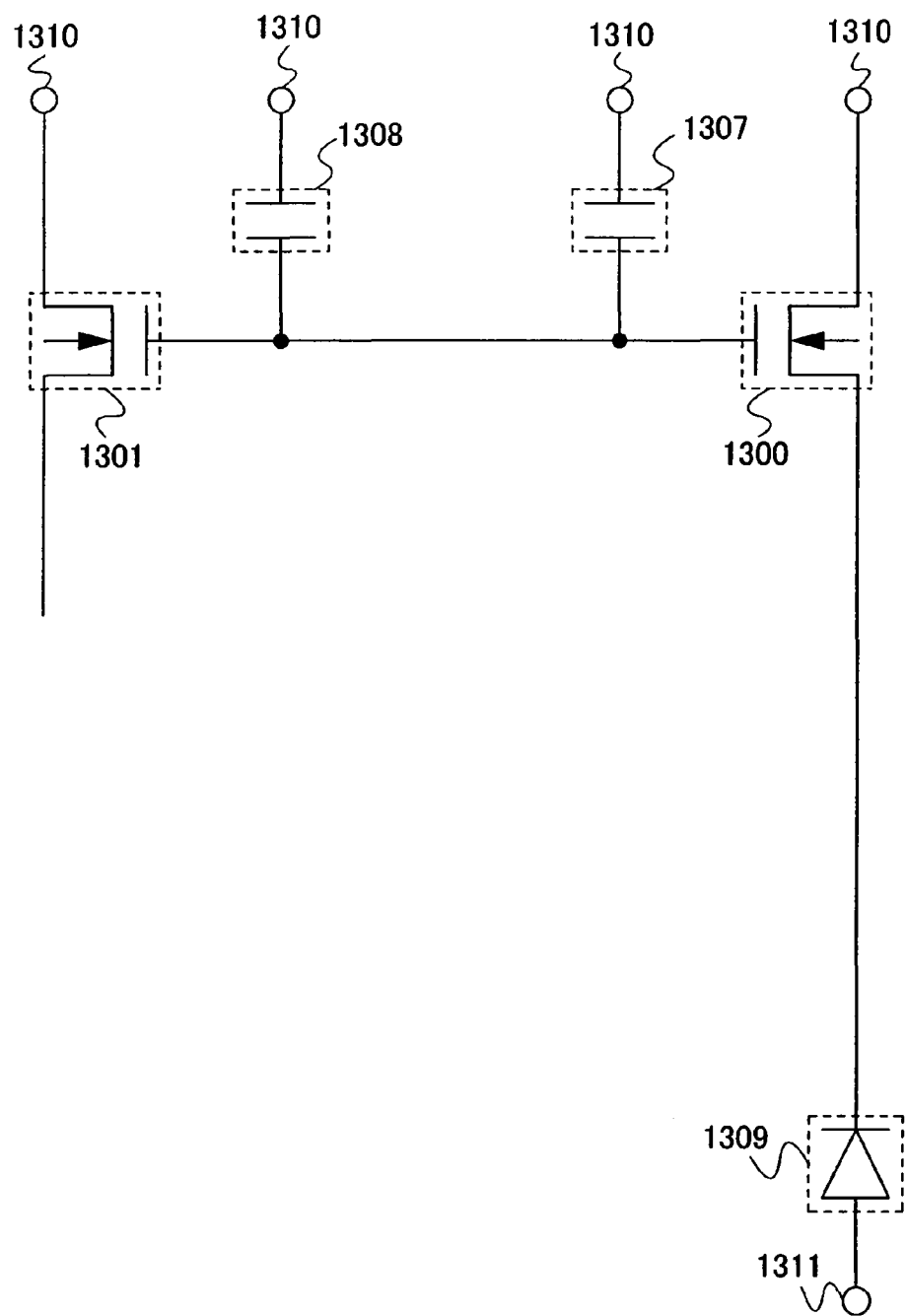
FIG. 16 is a diagram showing Embodiment Modes 5 and 6.

Here, similarly to Embodiment Mode 3, one electrode of the first capacitor 707 and one electrode of the second capacitor 708 are only required to be connected to a terminal of which potential becomes constant in operation. For example, they may be connected to a first gate signal line 1112 of a preceding row or another reference line may be additionally provided to be connected. The third transistor 1102, the fourth transistor 1103, the fifth transistor 1104, the sixth transistor 1105, and the seventh transistor 1106 may be arranged anywhere, as long as the circuit diagram shown in FIG. 11 becomes equivalent to FIG. 15 in a period T1 of FIG. 12 and to FIG. 16 in a period T2 of FIG. 12. The number of transistors may be increased as well. Further, FIG. 15 is an equivalent circuit of the pixel circuit shown in FIG. 11 in the period T1 while FIG. 16 is an equivalent circuit of the pixel circuit shown in FIG. 11 in the period T2.

Figure 12:
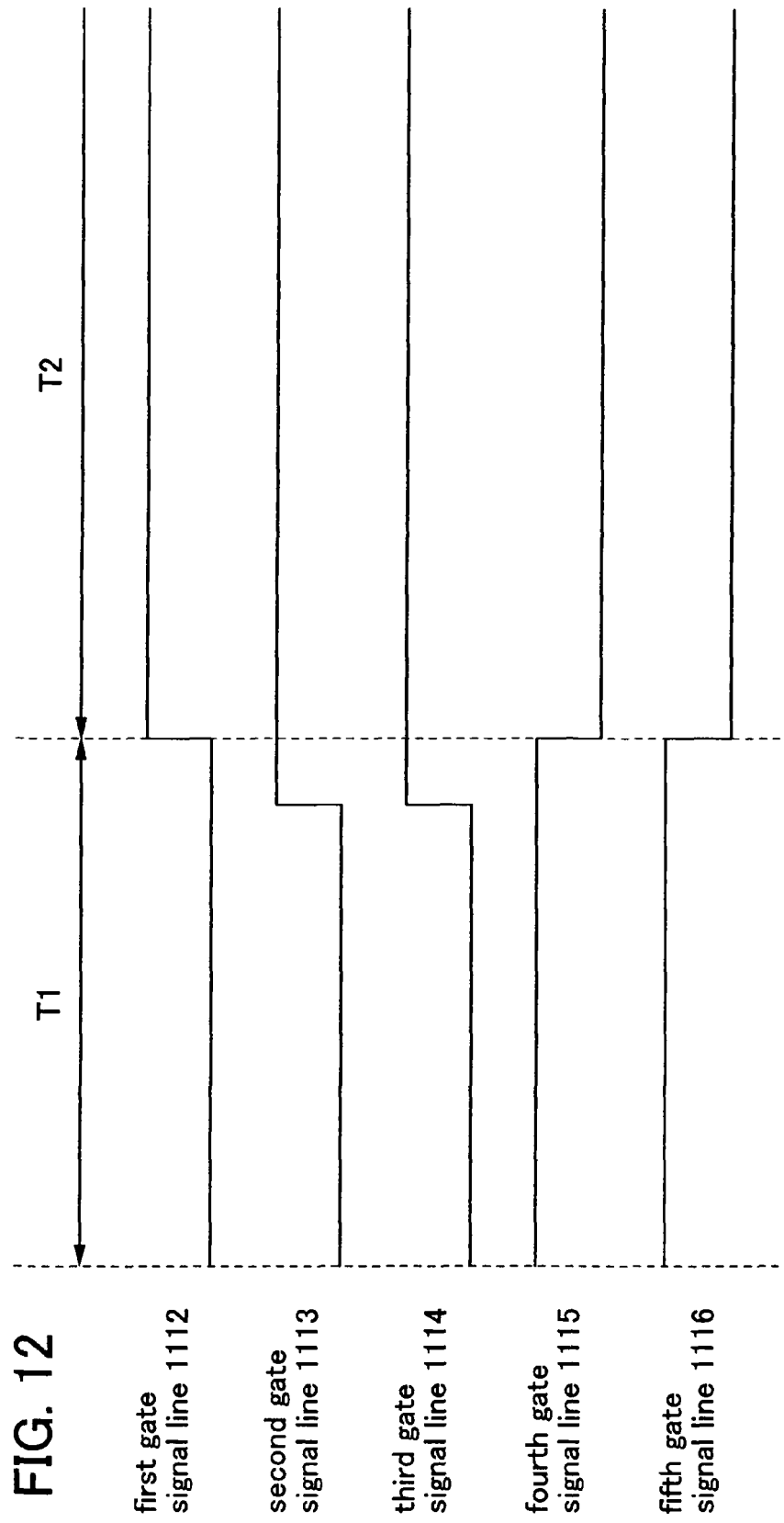
FIG. 12 is a diagram showing Embodiment Mode 4.

An operation of the circuit shown in FIG. 11 is described with reference to a timing chart of FIG. 12. An operation of the period T1 is described. In the period T1, the fourth transistor 1103 is turned on, thereby the first transistor 700 is diode-connected, and the fifth transistor 1104 is turned on, thereby the second transistor 701 is diode-connected. The sixth transistor 1105 is turned off, thereby the first transistor 700 and the second transistor 701 are electrically disconnected. The seventh transistor 1106 is turned off, thereby a current supply to the EL element 709 is blocked. The third transistor 1102 is turned on and a video signal inputted by current from the source signal line 712 flows to the second transistor 701. The second capacitor 708 holds a gate-source voltage of the second transistor 701 so that the current of the video signal flows through the second transistor 701. The first capacitor 707 holds a gate-source voltage which makes no current flow through the first transistor 700. That is, as a threshold voltage of the first transistor 700 is held, characteristics (a threshold voltage, mobility, and the like) of the first transistor 700 and those of the second transistor 701 are similar to each other. Therefore, the first capacitor 707 holds a voltage almost equal to the threshold voltage of the second transistor 701. At this time, Idata inputted as a video signal is expressed by Formula (5) and the voltage held in the second capacitor 708 is expressed by Formula (6), similarly to Embodiment Mode 3.

In Formulas (5) and (6), Idata is a current value of a video signal which flows through the source signal line 712, which is inputted to a pixel in the period T1. $\beta$ is a constant containing parameters such as a channel length, a channel width, mobility, or capacitance of an oxide film, or the like of the second transistor 701. Vgs (T1) is a gate-source voltage of the second transistor 701. Vth is a threshold voltage of the first transistor 700 as well as a threshold voltage of the second transistor 701 since the first transistor 700 and the second transistor 701 are paired.

An operation in the period T2 is described. In the period T2, the fourth transistor 1103 is turned off, thereby the first transistor 700 is not diode-connected. The fifth transistor 1104 is turned off, thereby the second transistor 701 is not diode-connected. The sixth transistor 1105 is turned on, thereby the first capacitor 707 and the second capacitor 708 are connected. The voltages held in the capacitors are divided by capacitive coupling. The seventh transistor 1106 is turned on and a current corresponding to the gate-source voltage of the first transistor 700 is supplied to the EL element 709. The third transistor 1102 is turned off and a video signal from the source signal line 712 is blocked. At this time, a gate voltage of the first transistor 700 is expressed by Formula (7) and the current value supplied to the EL element 709 is expressed by Formula (8) similarly to Embodiment Mode 3.

In Formulas (7) and (8), Idata, $\beta$, Vth, and Vgs (T1) are similar to those in the period T1. Ioled is a current value supplied to the EL element 709 in the period T2. That is, Ioled is equal to a current which flows through the first transistor 700 since a voltage is held between the gate and source of the first transistor 700 in the period T2. C707 is capacitance of the first capacitor 707, including gate capacitance of the first transistor 700. C708 is capacitance of the second capacitor 708, including gate capacitance of the second transistor 701.

In the aforementioned Formula (8), a current obtained by multiplying Idata by the square of [C708/(C707+C708)] can be supplied to the EL element 709. Moreover, in the period T2, a current value supplied to the EL element 709 does not vary if it is the same video signal voltage even when characteristics between other pixels vary, as long as the characteristics (a threshold voltage, mobility, and the like) of the first transistor 700 and those of the second transistor 701 are similar to each other.

In this manner, a smaller current than a current of a video signal inputted to a pixel can be supplied to an EL element while compensating the variation in characteristics of driving transistors. Therefore, a certain degree of large current can be inputted even when expressing a low gray scale instead of inputting a slight amount of current as a video signal. As a result, speed to charge parasitic capacitance of a source signal line and the like can be increased. As a threshold voltage is obtained and a video signal is written simultaneously in the period T1, writing time per pixel can be shortened.

By using a p-channel transistor for all the switching elements, a doping step for an n-channel transistor is not required. Therefore, the manufacturing steps can be simplified and inexpensively performed.

By providing the first transistor 700 as a driving transistor and the second transistor 701 for writing a video signal, a current can be prevented from continuing to flow through either of the transistors. As a result, difference between the first transistor 700 and the second transistor 701 in characteristics deterioration can be prevented from being large and the characteristics are prevented from being different from each other. In this manner, an organic EL display with high image quality and less variations in luminance among pixels can be provided.

In this embodiment mode, since the second gate signal line 1113 and the third gate signal line 1114 use a common control signal, they can be used in common. In such a structure, the number of signals to be inputted to a pixel and the number of wires can be reduced. Thus, a driver circuit which controls the pixel can be simplified and a high aperture ratio can be realized.

A channel width, a channel length, and the like of the first transistor 700 are preferably more than those of the second transistor 701. It is only required that the characteristics of the first transistor 700 be similar to those (a threshold voltage, mobility, and the like) of the second transistor 701, therefore, a higher aperture ratio can be realized by making a channel width of the second transistor 701 narrower and a channel length of the second transistor 701 shorter.

Although a p-channel transistor is used as a switching element here, an n-channel transistor may also be used. In that case, a signal inputted to a gate of the transistor which operates as a switching element is to be reversed.

Embodiment Mode 5

Figure 13:
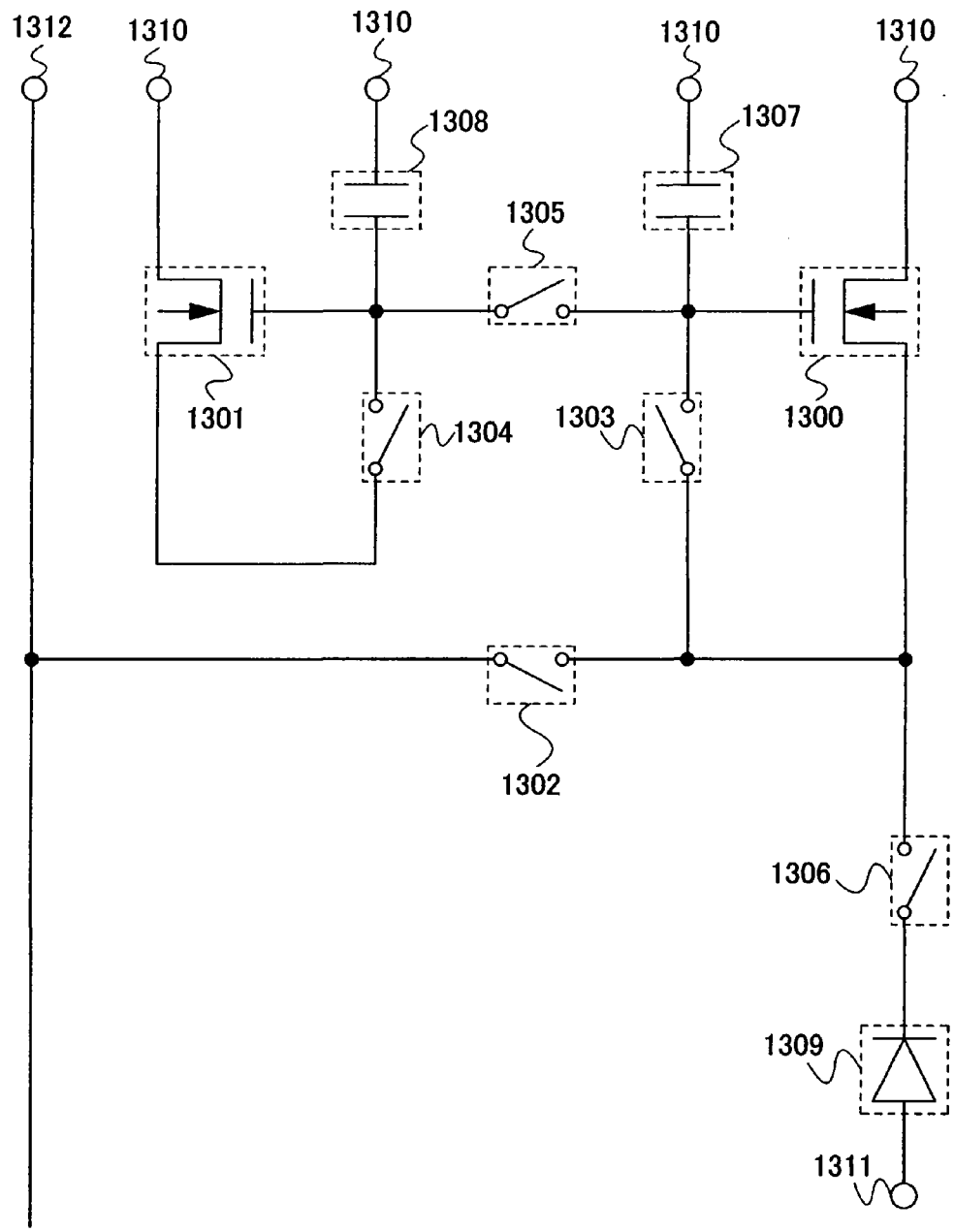
FIG. 13 is a diagram showing Embodiment Mode 5.

This embodiment mode describes a configuration of a display device in which n-channel transistors are used as a transistor for writing a video signal and controlling a current supplied to an EL element and a transistor for obtaining a threshold voltage with reference to FIG. 13.

In FIG. 13, a first transistor 1300 is a driving transistor which operates in a saturation region and controls a current value supplied to an EL element 1309 by a gate-source voltage thereof. A second transistor 1301 is a transistor which has similar characteristics to the first transistor 1300, such as a threshold voltage or mobility and is coupled with the first transistor 1300. Each of a first switch 1302, a second switch 1303, a third switch 1304, a fourth switch 1305, and a fifth switch 1306 has two terminals and a control terminal. They are switching elements which control conduction (on) or non-conduction (off) between the two terminals by the control terminal. A first capacitor 1307 has a pair of electrodes and holds a gate-source voltage of the first transistor 1300. A second capacitor 1308 has a pair of electrodes and holds a gate-source voltage of the second transistor 1301. An EL element 1309 is an EL element having a pair of electrodes, of which luminance is determined in proportion to a current value. A power source line 1310 is used in common for one row or one column for supplying a voltage to pixels. A counter electrode 1311 as the other electrode of the EL element 1309 is used in common for all pixels for supplying a voltage to the pixels. A source signal line 1312 is used in common for one row or one column for transmitting a current signal as a video signal to pixels.

Connections of a circuit shown in FIG. 13 are described. The power source line 1310 is connected to a first terminal of the first transistor 1300, a first terminal of the second transistor 1301, one electrode of the first capacitor 1307, and one electrode of the second capacitor 1308. The other electrode of the first capacitor 1307 is connected to a gate of the first transistor 1300 while the other electrode of the second capacitor 1308 is connected to a gate of the second transistor 1301. The other electrode of the first capacitor 1307 and the gate of the first transistor 1300 are connected to the other electrode of the second capacitor 1308 and the gate of the second transistor 1301 through the fourth switch 1305. A second terminal of the first transistor 1300 is connected to the gate of the first transistor 1300 through the second switch 1303, to the source signal line 1312 through the first switch 1302, and to one electrode of the EL element 1309 through the fifth switch 1306. A second terminal of the second transistor 1301 is connected to the gate of the second transistor 1301 through the third switch 1304.

Here, one electrode of the first capacitor 1307 and one electrode of the second capacitor 1308 are only required to be connected to a terminal of which potential becomes constant in operation. For example, they may be connected to a control terminal of the first switch 1302 of a preceding row or another reference line may be additionally provided to be connected. The first switch 1302, the second switch 1303, the third switch 1304, the fourth switch 1305, and the fifth switch 1306 may be arranged anywhere, as long as the circuit diagram shown in FIG. 13 becomes equivalent to FIG. 15 in a period T1 of FIG. 14 and to FIG. 16 in a period T2 of FIG. 14. The number of switches may be increased as well. Further, FIG. 15 is an equivalent circuit of the pixel circuit shown in FIG. 13 in the period T1 while FIG. 16 is an equivalent circuit of the pixel circuit shown in FIG. 13 in the period T2.

Figure 14:
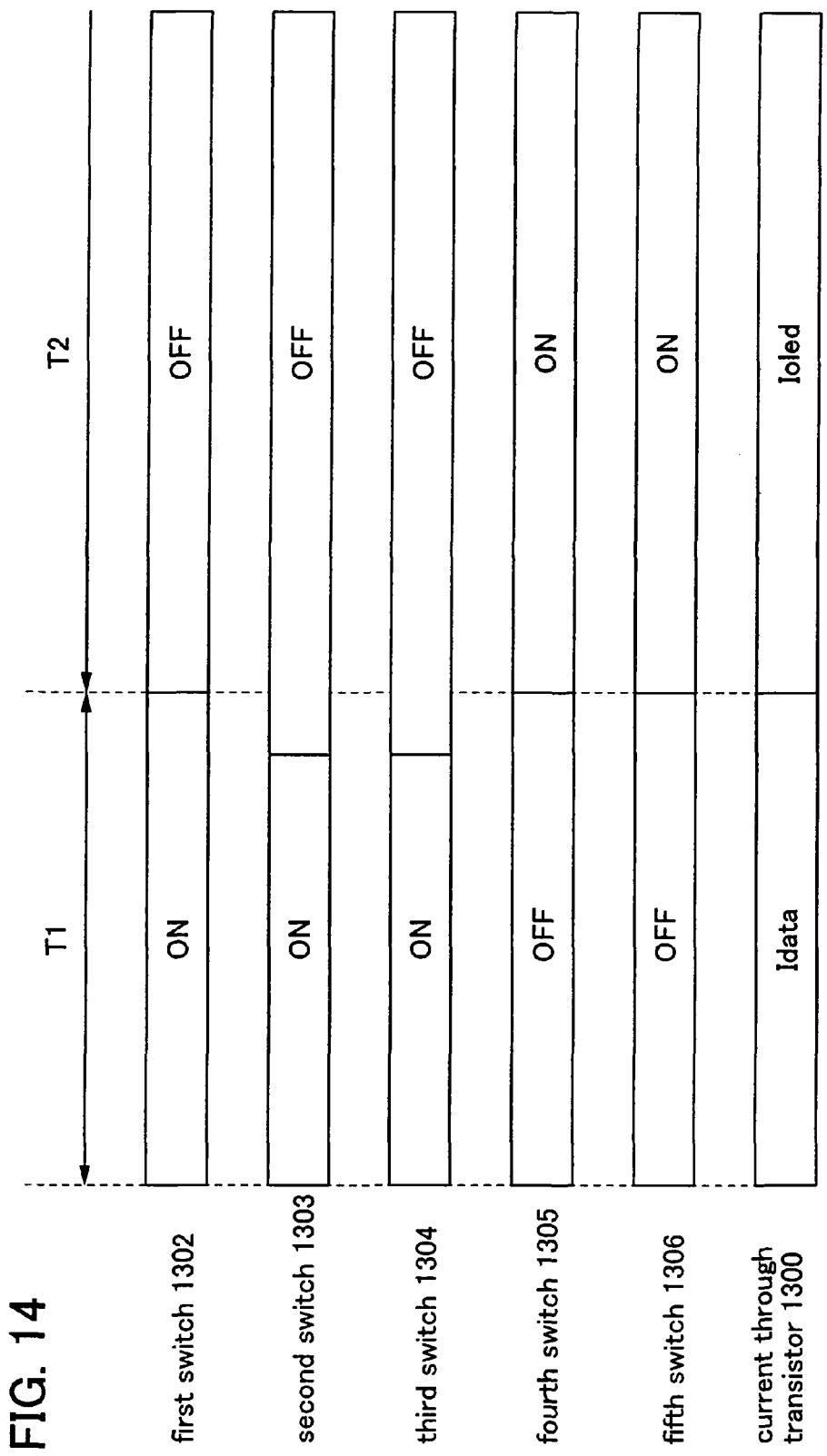
FIG. 14 is a diagram showing Embodiment Mode 5.

An operation of the circuit shown in FIG. 13 is described with reference to a timing chart of FIG. 14. An operation of the period T1 is described. In the period T1, a second switch 1303 is turned on, thereby the first transistor 1300 is diode-connected and a third switch 1304 is turned on, thereby the second transistor 1301 is diode-connected. The fourth switch 1305 is turned off, thereby the first transistor 1300 and the second transistor 1301 are electrically disconnected. The fifth switch 1306 is turned off, thereby a current supply to the EL element 1309 is blocked. The first switch 1302 is turned on and a video signal inputted by current from the source signal line 1312 flows to the first transistor 1300. The first capacitor 1307 holds a gate-source voltage of the first transistor 1300 so that the current of the video signal flows through the first transistor 1300. The second capacitor 1308 holds a gate-source voltage which makes no current flow through the second transistor 1301. That is, as a threshold voltage of the second transistor 1301 is held and characteristics (a threshold voltage, mobility, and the like) of the first transistor 1300 and those of the second transistor 1301 are similar to each other, the second capacitor 1308 holds a voltage almost equal to the threshold voltage of the first transistor 1300. At this time, Idata inputted as a video signal is expressed by Formula (9) and the voltage held in the first capacitor 1307 is expressed by Formula (10).

[Formula 9]
$$Idata = \frac{\beta}{2}[Vgs(T1) - Vth]^2 \quad (9)$$

[Formula 10]
$$Vgs(T1) = \sqrt{\frac{2}{\beta}Idata} + Vth \quad (10)$$

In Formulas (9) and (10), Idata is a current value of a video signal which flows through the source signal line 1312, which is inputted to a pixel in the period T1. β is a constant containing parameters such as a channel length, a channel width, mobility, or capacitance of an oxide film of the first transistor 1300. Vgs (T1) is a gate-source voltage of the first transistor 1300. Vth is a threshold voltage of the first transistor 1300 as well as a threshold voltage of the second transistor 1301 since the first transistor 1300 and the second transistor 1301 are paired.

An operation in the period T2 is described. In the period T2, the second switch 1303 is turned off, thereby the first transistor 1300 is not diode-connected. The third switch 1304 is turned off, thereby the second transistor 1301 is not diode-connected. The fourth switch 1305 is turned on, thereby the first capacitor 1307 and the second capacitor 1308 are connected. The voltages held in the capacitors are divided by capacitive coupling. The fifth switch 1306 is turned on and a current corresponding to the gate-source voltage of the first transistor 1300 is supplied to the EL element 1309. The first switch 1302 is turned off and a video signal from the source signal line 1312 is blocked. At this time, a gate voltage of the first transistor 1300 is expressed by Formula (11) and the current value supplied to the EL element 1309 is expressed by Formula (12).

[Formula 11]
$$Vgs(T2) = \left(\frac{C1307}{C1307 + C1308}\right)[Vgs(T1) - Vth] + Vth \quad (11)$$

[Formula 12]
$$Ioled = \left(\frac{C1307}{C1307 + C1308}\right)^2 Idata \quad (12)$$

In Formulas (11) and (12), Idata, β, Vth, and Vgs (T1) are similar to those in the period T1. Ioled is a current value supplied to the EL element 1309 in the period T2. That is, Ioled is equal to a current which flows through the first transistor 1300 since a voltage is held between the gate and source of the first transistor 1300 in the period T2. C1307 is capacitance of the first capacitor 1307, including gate capacitance of the first transistor 1300. C1308 is capacitance of the second capacitor 1308, including gate capacitance of the second transistor 1301.

In the aforementioned Formula (12), a current obtained by multiplying Idata by the square of [C1307/(C1307+C1308)] can be supplied to the EL element 1309. Moreover, in the period T2, a current value supplied to the EL element 1309 does not vary if it is the same video signal even when characteristics between other pixels vary, as long as the characteristics (a threshold voltage, mobility, and the like) of the first transistor 1300 and those of the second transistor 1301 are similar to each other.

In this manner, a smaller current than a current of a video signal inputted to a pixel can be supplied to an EL element while compensating the variation in characteristics of driving transistors. Therefore, a certain degree of large current can be inputted even when expressing a low gray scale instead of inputting a slight amount of current as a video signal. As a result, speed to charge parasitic capacitance of a source signal line and the like can be increased. As a threshold voltage is obtained and a video signal is written simultaneously in the period T1, writing time per pixel can be shortened.

In this embodiment mode, since the second switch 1303 and the third switch 1304 are turned on or off at the same timing, they can have a common control terminal. In such a structure, the number of signals to be inputted to a pixel and the number of wires can be reduced. Thus, a driver circuit which controls the pixel can be simplified and a high aperture ratio can be realized.

A channel width, a channel length, and the like of the first transistor 1300 are preferably more than those of the second transistor 1301. It is only required that the characteristics (a threshold voltage, mobility, and the like) of the first transistor 1300 be similar to those of the second transistor 1301, therefore, a higher aperture ratio can be realized by making a channel width of the second transistor 1301 narrower and a channel length of the second transistor 1301 shorter.

The switching element described in this embodiment mode can be similar to that described in Embodiment Mode 1.

Embodiment Mode 6

As the switching element in Embodiment Mode 5, a transistor can be used. This embodiment mode describes a configuration of the case of using an n-channel transistor as the switching element with reference to FIG. 17.

Figure 17:
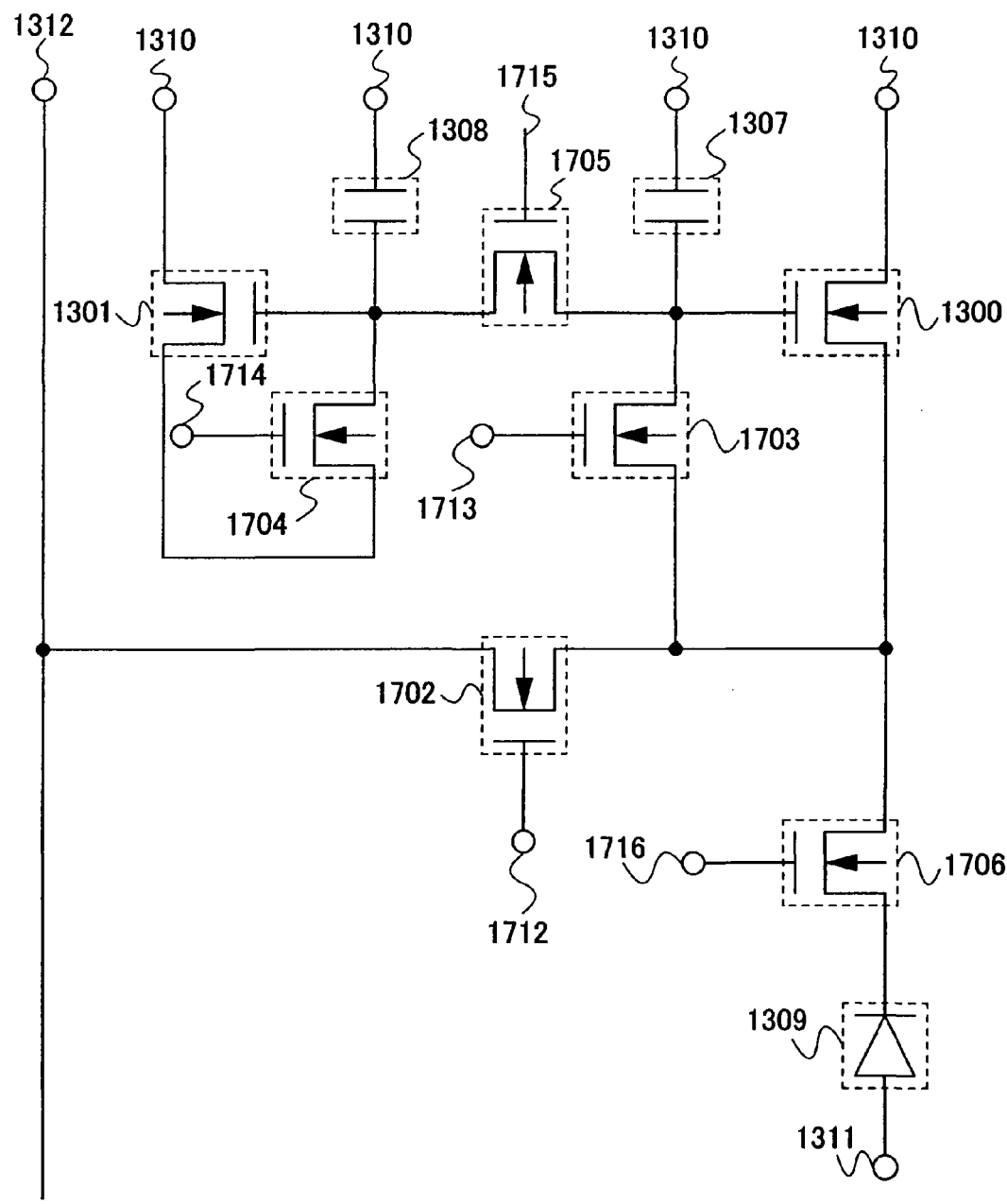
FIG. 17 is a diagram showing Embodiment Mode 6.

In FIG. 17, the first transistor 1300, the second transistor 1301, the first capacitor 1307, the second capacitor 1308, the EL element 1309, the power source line 1310, the counter electrode 1311, and the source signal line 1312 are similar to those in Embodiment Mode 5. A third transistor 1702, a fourth transistor 1703, a fifth transistor 1704, a sixth transistor 1705, and a seventh transistor 1706 each has a function as a switching element and operates in a linear region. The third transistor 1702, the fourth transistor 1703, the fifth transistor 1704, the sixth transistor 1705, and the seventh transistor 1706 are controlled by a digital signal from a first gate signal line 1712, a second gate signal line 1713, a third gate signal line 1714, a fourth gate signal line 1715, and a fifth gate signal line 1716 respectively, which are turned on when the digital signal is High and off when the digital signal is Low. A signal voltage which makes a gate-source voltage of a transistor to be inputted higher than a threshold voltage thereof is referred to as High while a signal voltage which makes a gate-source voltage of a transistor to be inputted lower than a threshold voltage thereof is referred to as Low.

Connections in FIG. 17 are described. The power source line 1310 is connected to the first terminal of the first transistor 1300, the first terminal of the second transistor 1301, one electrode of the first capacitor 1307, and one electrode of the second capacitor 1308. The other electrode of the first capacitor 1307 is connected to the gate of the first transistor 1300 while the other electrode of the second capacitor 1308 is connected to the gate of the second transistor 1301. The other electrode of the first capacitor 1307 and the gate of the first transistor 1300 are connected to the first terminal of the sixth transistor 1705 while the other electrode of the second capacitor 1308 and the gate of the second transistor 1301 are connected to a second terminal of the sixth transistor 1705. The second terminal of the first transistor 1300 is connected to a first terminal of the fourth transistor 1703 while a second terminal of the fourth transistor 1703 is connected to the gate of the first transistor 1300. The second terminal of the first transistor 1300 is connected to the first terminal of the third transistor 1702 while a second terminal of the third transistor 1702 is connected to the source signal line 1312. The second terminal of the first transistor 1300 is connected to a first terminal of the seventh transistor 1706 while a second terminal of the seventh transistor 1706 is connected to one electrode of the EL element 1309. The second terminal of the second transistor 1301 is connected to a first terminal of the fifth transistor 1704 while a second terminal of the fifth transistor 1704 is connected to the gate of the second transistor 1301.

Here, similarly to Embodiment Mode 5, one electrode of the first capacitor 1307 and one electrode of the second capacitor 1308 are only required to be connected to a terminal of which potential becomes constant in operation. For example, they may be connected to the first gate signal line 1712 of a preceding row or another reference line may be additionally provided to be connected. The third transistor 1702, the fourth transistor 1703, the fifth transistor 1704, the sixth transistor 1705, and the seventh transistor 1706 may be arranged anywhere, as long as the circuit diagram shown in FIG. 17 becomes equivalent to FIG. 15 in a period T1 of FIG. 18 and to FIG. 16 in a period T2 of FIG. 18. The number of transistors may be increased as well. Further, FIG. 15 is an equivalent circuit of the pixel circuit shown in FIG. 17 in the period T1 while FIG. 16 is an equivalent circuit of the pixel circuit shown in FIG. 17 in the period T2.

Figure 18:
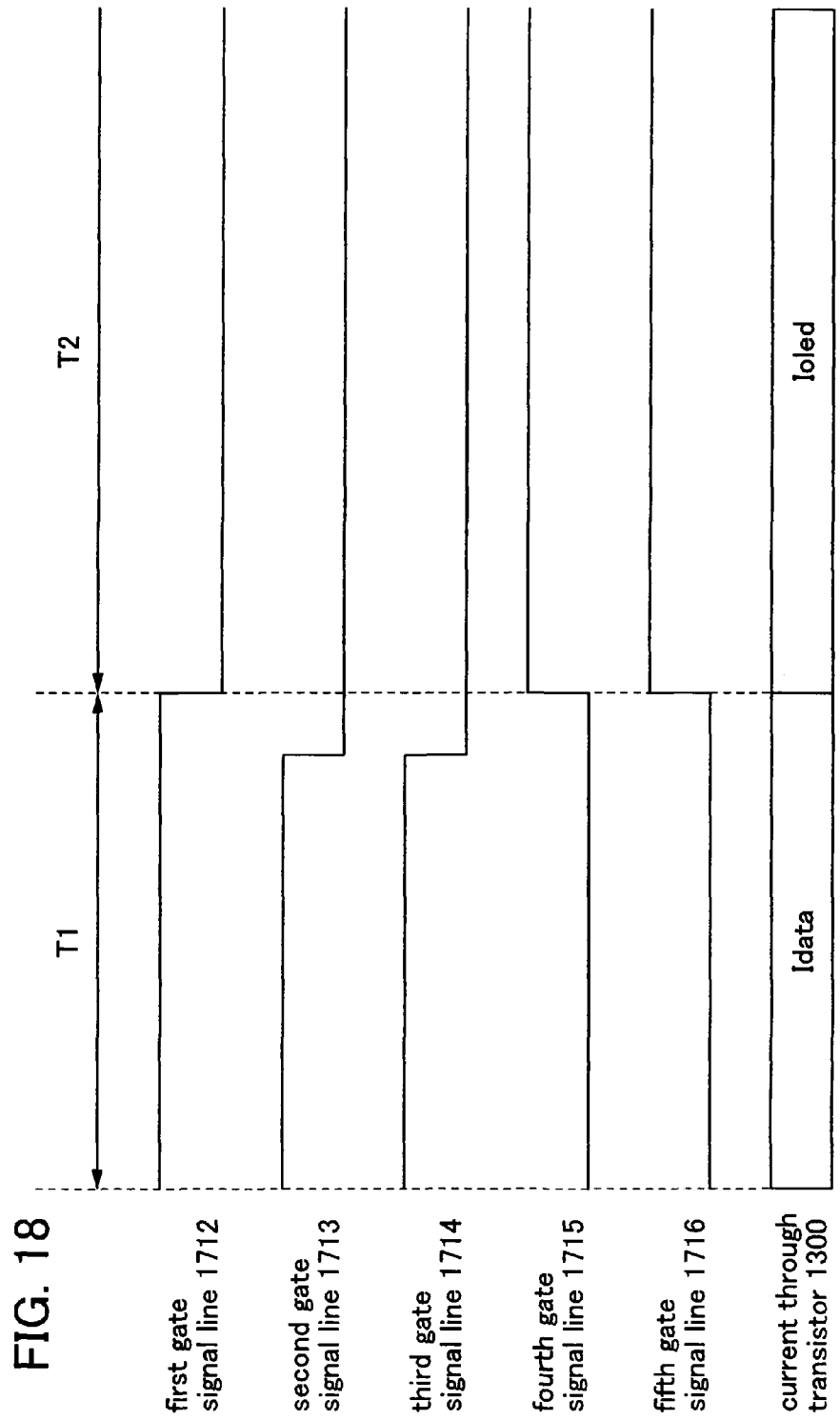
FIG. 18 is a diagram showing Embodiment Mode 6.

An operation of the circuit shown in FIG. 17 is described with reference to a timing chart of FIG. 18. An operation of the period T1 is described. In the period T1, the fourth transistor 1703 is turned on, thereby the first transistor 1300 is diode-connected, and a fifth transistor 1704 is turned on, thereby the second transistor 1301 is diode-connected. The sixth transistor 1705 is turned off, thereby the first transistor 1300 and the second transistor 1301 are electrically disconnected. The seventh transistor 1706 is turned off, thereby a current supply to the EL element 1309 is blocked. The third transistor 1702 is turned on and a video signal inputted by current from the source signal line 1312 flows to the first transistor 1300. The first capacitor 1307 holds a gate-source voltage of the first transistor 1300 so that the current of the video signal flows through the first transistor 1300. The second capacitor 1308 holds a gate-source voltage of the second transistor 1301 so that no current flows to the second transistor 1301. That is, as a threshold voltage of the second transistor 1301 is held and characteristics of the first transistor 1300 and those of the second transistor 1301 are similar to each other, the second capacitor 1308 holds a voltage almost equal to the threshold voltage of the first transistor 1300. At this time, Idata inputted as a video signal is expressed by Formula (9) and the voltage held in the first capacitor 1307 is expressed by Formula (10) similarly to Embodiment Mode 5.

In Formulas (9) and (10), Idata is a current value of a video signal which flows through the source signal line 1312, which is inputted to a pixel in the period T1. β is a constant containing parameters such as a channel length, a channel width, mobility, or capacitance of an oxide film of the first transistor 1300. Vgs (T1) is a gate-source voltage of the first transistor 1300. Vth is a threshold voltage of the first transistor 1300 as well as a threshold voltage of the second transistor 1301 since the first transistor 1300 and the second transistor 1301 are paired.

An operation in the period T2 is described. In the period T2, the fourth transistor 1703 is turned off, thereby the first transistor 1300 is not diode-connected. The fifth transistor 1704 is turned off, thereby the second transistor 1301 is not diode-connected. The sixth transistor 1705 is turned on, thereby the first capacitor 1307 and the second capacitor 1308 are connected. The voltages held in the capacitors are divided by capacitive coupling. The seventh transistor 1706 is turned on and a current corresponding to the gate-source voltage of the first transistor 1300 is supplied to the EL element 1309. The third transistor 1702 is turned off and a video signal from the source signal line 1312 is blocked. At this time, similarly to Embodiment Mode 5, a gate voltage of the first transistor 1300 is expressed by Formula (11) and the current value supplied to the EL element 1309 is expressed by Formula (12).

In Formulas (11) and (12), Idata, β, Vth, and Vgs (T1) are similar to those in the period T1. Ioled is a current value supplied to the EL element 1309 in the period T2. That is, Ioled is equal to a current which flows through the first transistor 1300 since a voltage is held between the gate and source of the first transistor 1300 in the period T2. C1307 is capacitance of the first capacitor 1307, including gate capacitance of the first transistor 1300. C1308 is capacitance of the second capacitor 1308, including gate capacitance of the second transistor 1301.

In the aforementioned Formula (12), a current obtained by multiplying Idata by the square of [(C1307/(C1307+C1308)] can be supplied to the EL element 1309. Moreover, in the period T2, a current value supplied to the EL element 1309 does not vary if it is the same video signal even when characteristics between other pixels vary, as long as the characteristics (a threshold voltage, mobility, and the like) of the first transistor 1300 and those of the second transistor 1301 are similar to each other.

In this manner, a smaller current than a current of a video signal inputted to a pixel can be supplied to an EL element while compensating the variation in characteristics of driving transistors. Therefore, a certain degree of large current can be inputted even when expressing a low gray scale instead of inputting a slight amount of current as a video signal. As a result, speed to charge parasitic capacitance of a source signal line and the like can be increased. As a threshold voltage is obtained and a video signal is written simultaneously in the period T1, writing time per pixel can be shortened.

Although an n-channel transistor is used as a switching element here, a p-channel transistor may also be used. In that case, a signal inputted to a gate of the transistor which operates as a switching element is to be reversed.

By using an n-channel transistor for all the switching elements, a doping step for a p-channel transistor is not required. Therefore, the manufacturing steps can be simplified and inexpensively performed. Moreover, as only an n-channel transistor is employed, amorphous silicon can be used to form a transistor. In that case, the manufacturing steps are easy and suitable for an enlargement of a substrate, therefore, an inexpensive and large organic EL display can be manufactured.

In this embodiment mode, since the second gate signal line 1713 and the third gate signal line 1714 use a common control signal, they can be used in common. In such a structure, the number of signals to be inputted to a pixel and the number of wires can be reduced. Thus, a driver circuit which controls the pixel can be simplified and a high aperture ratio can be realized.

A channel width, a channel length, and the like of the first transistor 1300 are preferably more than those of the second transistor 1301. It is only required that the characteristics (a threshold voltage, mobility, and the like) of the first transistor 1300 be similar to those of the second transistor 1301, therefore, a higher aperture ratio can be realized by making a channel width of the second transistor 1301 narrower and a channel length of the second transistor 1301 shorter.

Although an n-channel transistor is used as a switching element here, a p-channel transistor may also be used. In that case, a signal inputted to a gate of the transistor which operates as a switching element is to be reversed.

Embodiment Mode 7

Figure 19:
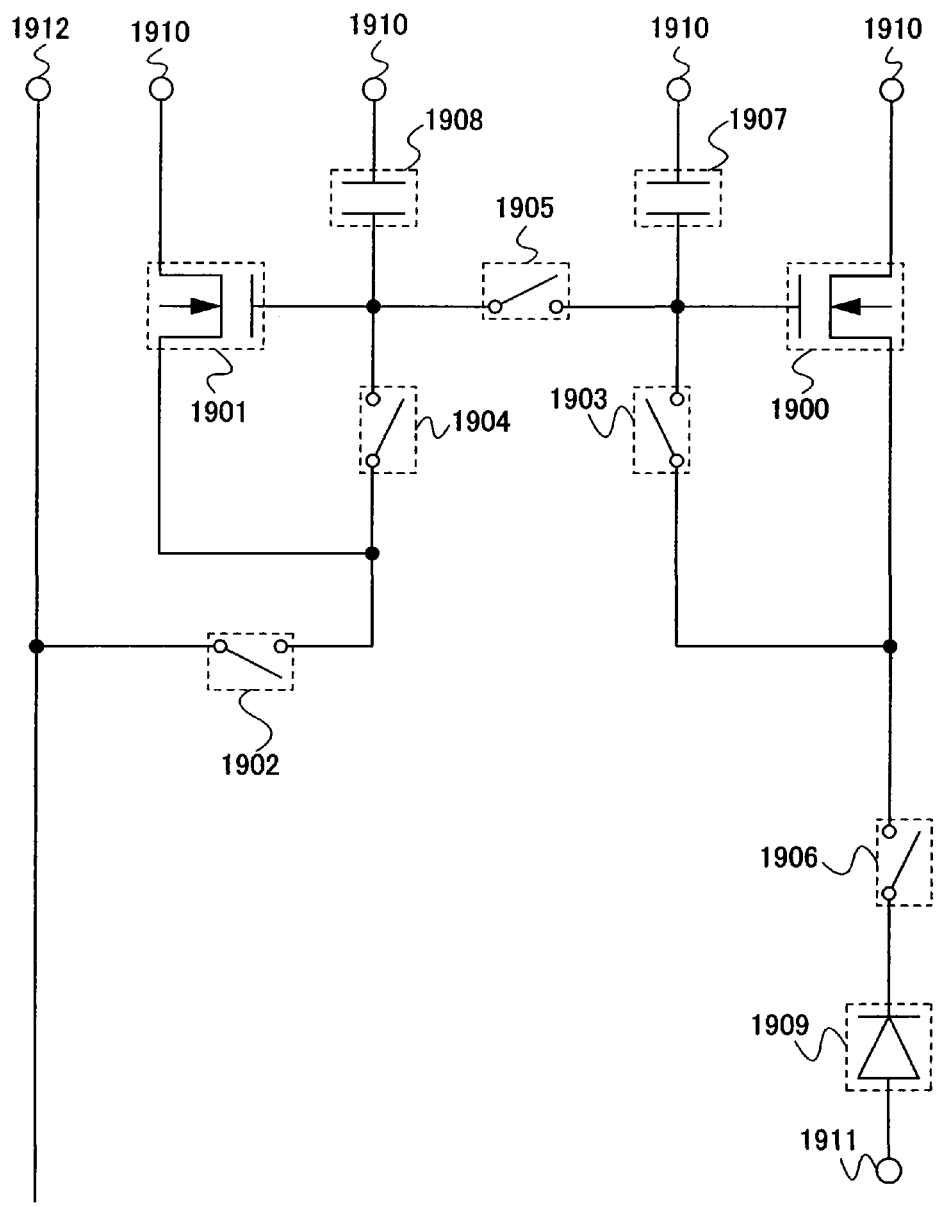
FIG. 19 is a diagram showing Embodiment Mode 7.

This embodiment mode describes a configuration of a display device for controlling a current supplied to an EL element by using a transistor which obtains a threshold voltage in order to prevent characteristics deterioration of a transistor due to the concentration of current to one of the transistors with reference to FIG. 19.

In FIG. 19, a first transistor 1900 is a driving transistor which operates in a saturation region and controls a current value supplied to an EL element 1909 by a gate-source voltage. A second transistor 1901 has characteristics such as a threshold voltage and mobility similar to those of the first transistor 1900 and is paired with the first transistor 1900. A first switch 1902, a second switch 1903, a third switch 1904, a fourth switch 1905, and a fifth switch 1906 are switching elements each having two terminals and a control terminal, which are controlled to be conductive (on) or non-conductive (off) of the two terminals by the control terminal. A first capacitor 1907 has a pair of electrodes and holds a gate-source voltage of the first transistor 1900. A second capacitor 1908 has a pair of electrodes and holds a gate-source voltage of the second transistor 1901. The EL element 1909 has a pair of electrodes, of which luminance is determined in proportion to a current value. A power source line 1910 is used in common for one row or one column for supplying a voltage to pixels. A counter electrode 1911 as the other electrode of the EL element 1909 is used in common for all pixels for supplying a voltage to the pixels. A source signal line 1912 is used in common for one row or one column for transmitting a current signal as a video signal to pixels.

Connections of a circuit shown in FIG. 19 are described. The power source line 1910 is connected to a first terminal of the first transistor 1900, a first terminal of the second transistor 1901, one electrode of a first capacitor 1907, and one electrode of a second capacitor 1908. The other electrode of the first capacitor 1907 is connected to a gate of the first transistor 1900 while the other electrode of the second capacitor 1908 is connected to a gate of the second transistor 1901. The other electrode of the first capacitor 1907 and the gate of the first transistor 1900 are connected to the other electrode of the second capacitor 1908 and the gate of the second transistor 1901 through the fourth switch 1905. The second terminal of the first transistor 1900 is connected to the gate of the first transistor 1900 through the second switch 1903 and to one electrode of the EL element 1909 through the fifth switch 1906. The second terminal of the second transistor 1901 is connected to the gate of the second transistor 1901 through the third switch 1904 and to the source signal line 1912 through the first switch 1902.

Here, one electrode of the first capacitor 1907 and one electrode of the second capacitor 1908 are only required to be connected to a terminal of which potential becomes constant in operation. For example, they may be connected to a control terminal of the first switch 1902 of a preceding row or another reference line may be additionally provided to be connected. The first switch 1902, the second switch 1903, the third switch 1904, the fourth switch 1905, and the fifth switch 1906 may be arranged anywhere, as long as the circuit diagram shown in FIG. 19 becomes equivalent to FIG. 21 in a period T1 of FIG. 20 and to FIG. 22 in a period T2 of FIG. 20. The number of switches may be increased as well. Further, FIG.

Figure 22:
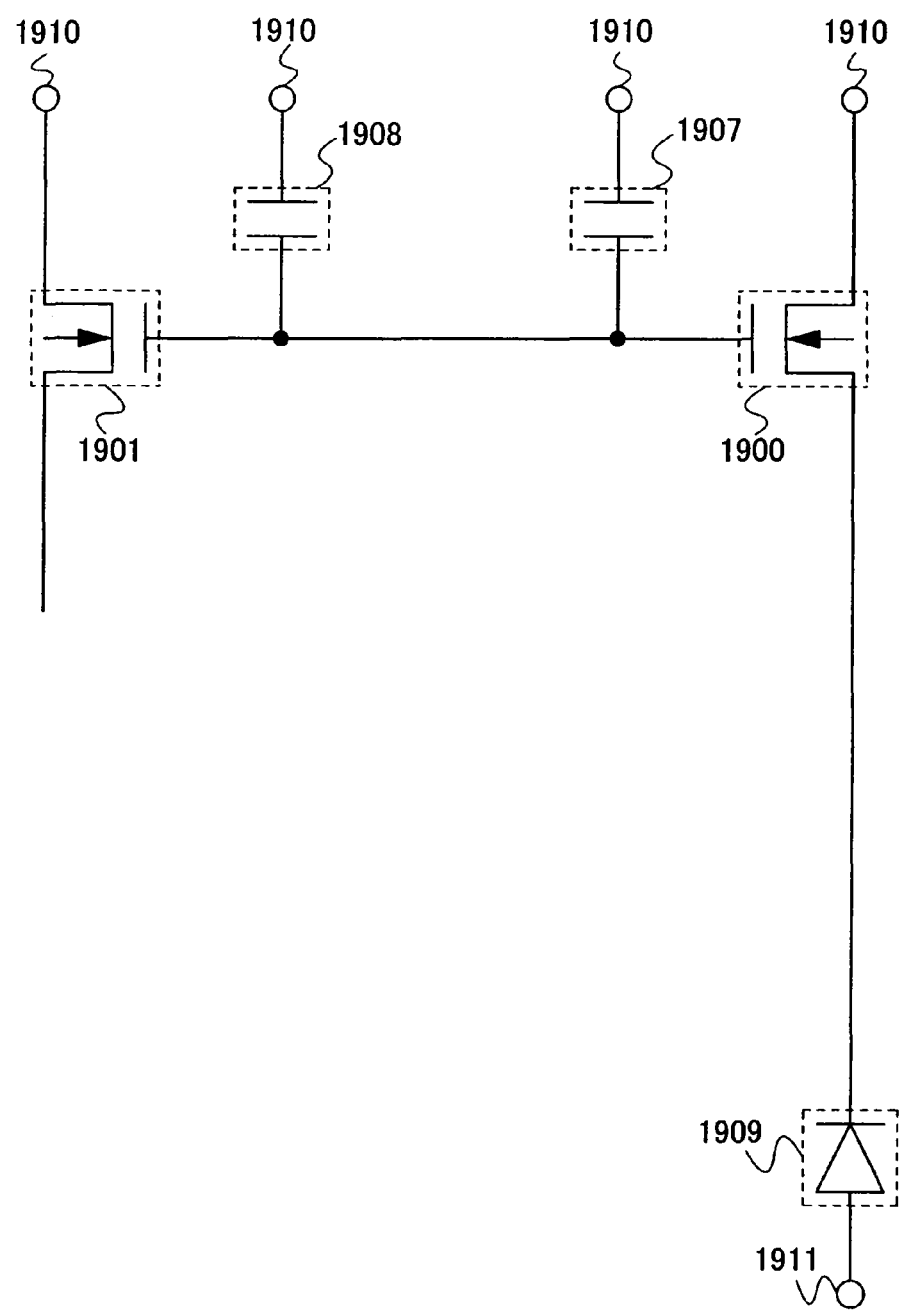
FIG. 22 is a diagram showing Embodiment Modes 7 and 8.

21 is an equivalent circuit of the pixel circuit shown in FIG. 19 in the period T1 while FIG. 22 is an equivalent circuit of the pixel circuit shown in FIG. 19 in the period T2.

Figure 20:
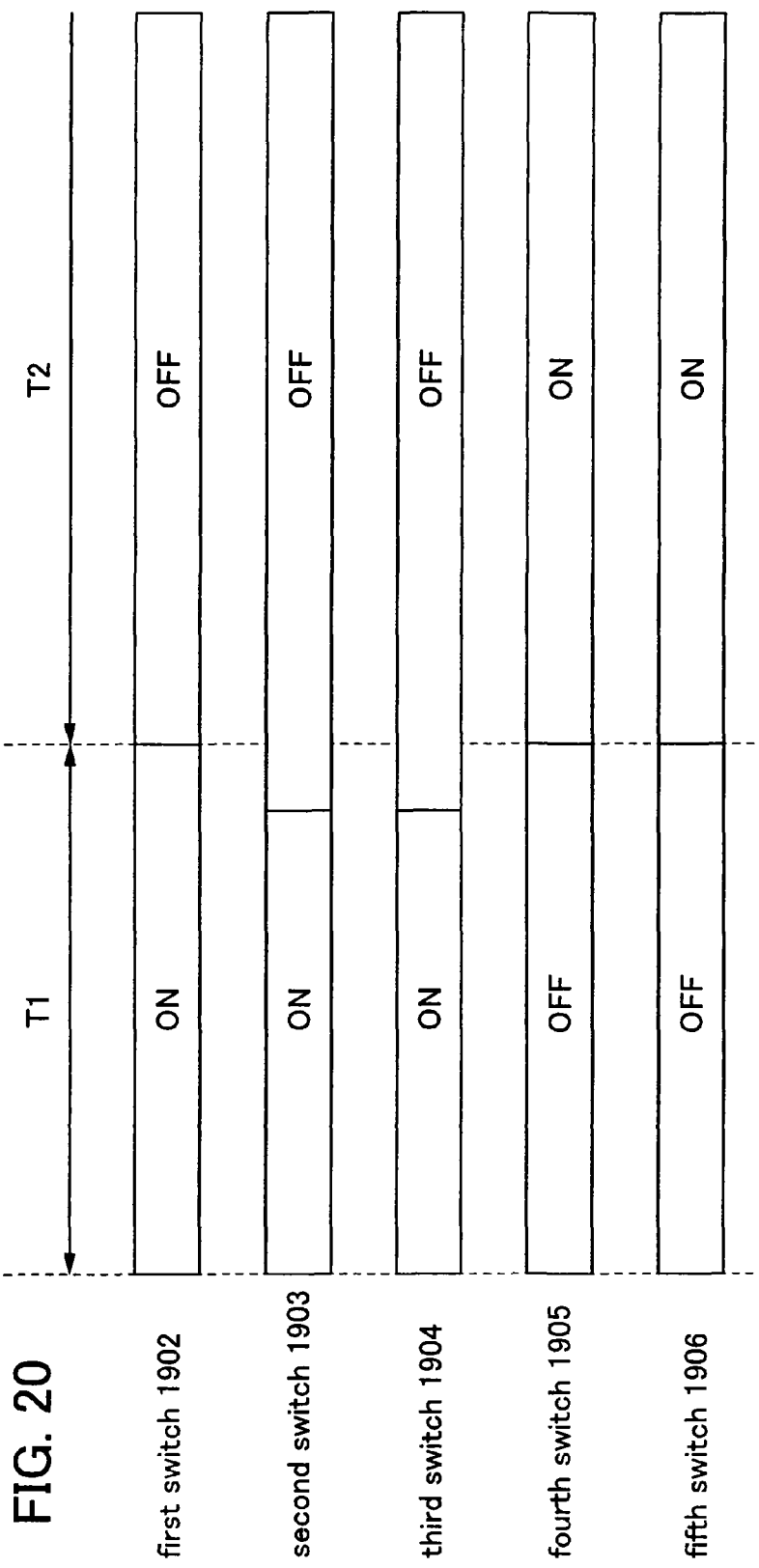
FIG. 20 is a diagram showing Embodiment Mode 7.

An operation of the circuit shown in FIG. 19 is described with reference to a timing chart of FIG. 20. An operation of the period T1 is described. In the period T1, the second switch 1903 is turned on, thereby the first transistor 1900 is diode-connected, a third switch 1904 is turned on, thereby the second transistor 1901 is diode-connected. The fourth switch 1905 is turned off, thereby the first transistor 1900 and the second transistor 1901 are electrically disconnected. The fifth switch 1906 is turned off, thereby a current supply to the EL element 1909 is blocked. The first switch 1902 is turned on and a video signal inputted by current from the source signal line 1912 flows to the second transistor 1901. The second capacitor 1908 holds a gate-source voltage of the second transistor 1901 so that the current of the video signal flows through the second transistor 1901. The first capacitor 1907 holds a gate-source voltage of the first transistor 1900 so that no current flows to the first transistor 1900. That is, as a threshold voltage of the first transistor 1900 is held, and characteristics of the first transistor 1900 and those of the second transistor 1901 are similar to each other, the first capacitor 1907 holds a voltage almost equal to the threshold voltage of the second transistor 1901. At this time, Idata inputted as a video signal is expressed by Formula (13) and the voltage held in the second capacitor 1908 is expressed by Formula (14).

[Formula 13]

$$Idata = \frac{\beta}{2}[Vgs(T1) - Vth]^2 \quad (13)$$

[Formula 14]

$$Vgs(T1) = \sqrt{\frac{2}{\beta}Idata} + Vth \quad (14)$$

In Formulas (13) and (14), Idata is a current value of a video signal which flows through the source signal line 1912, which is inputted to a pixel in the period T1. β is a constant containing parameters such as a channel length, a channel width, mobility, or capacitance of an oxide film, of the second transistor 1901. Vgs (T1) is a gate-source voltage of the second transistor 1901. Vth is a threshold voltage of the first transistor 1900 as well as a threshold voltage of the second transistor 1901 since the first transistor 1900 and the second transistor 1901 are paired.

An operation in the period T2 is described. In the period T2, the second switch 1903 is turned off, thereby the first transistor 1900 is not diode-connected. The third switch 1904 is turned off, thereby the second transistor 1901 is not diode-connected. The fourth switch 1905 is turned on, thereby the first capacitor 1907 and the second capacitor 1908 are connected. The voltages held in the capacitors are divided by capacitive coupling. The fifth switch 1906 is turned on and a current corresponding to the gate-source voltage of the first transistor 1900 is supplied to the EL element 1909. The first switch 1902 is turned off and a video signal from the source signal line 1912 is blocked. At this time, a gate voltage of the first transistor 1900 is expressed by Formula (15) and the current value supplied to the EL element 1909 is expressed by Formula (16).

[Formula 15]

$$Vgs(T2) = \left(\frac{C1908}{C1907 + C1908}\right)[Vgs(T1) - Vth] + Vth \quad (15)$$

[Formula 16]

$$Ioled = \left(\frac{C1908}{C1907 + C1908}\right)^2 Idata \quad (16)$$

In Formulas (15) and (16), Idata, β, Vth, and Vgs (T1) are similar to those in the period T1. Ioled is a current value supplied to the EL element 1909 in the period T2. That is, Ioled is equal to a current which flows through the first transistor 1900 since a voltage is held between the gate and source of the first transistor 1900 in the period T2. C1907 is capacitance of the first capacitor 1907, including gate capacitance of the first transistor 1900. C1908 is capacitance of the second capacitor 1908, including gate capacitance of the second transistor 1901.

In the aforementioned Formula (16), a current obtained by multiplying Idata by the square of [C1908/(C1907+C1908)] can be supplied to the EL element 1909. Moreover, in the period T2, a current value supplied to the EL element 1909 does not vary if it is the same video signal even when characteristics between other pixels vary, as long as the characteristics (a threshold voltage, mobility, and the like) of the first transistor 1900 and those of the second transistor 1901 are similar to each other.

In this manner, a smaller current than a current of a video signal inputted to a pixel can be supplied to an EL element while compensating the variation in characteristics of driving transistors. Therefore, a certain degree of large current can be inputted even when expressing a low gray scale instead of inputting a slight amount of current as a video signal. As a result, speed to charge parasitic capacitance of a source signal line and the like can be increased. As a threshold voltage is obtained and a video signal is written simultaneously in the period T1, writing time per pixel can be shortened.

By providing the first transistor 1900 as a driving transistor and the second transistor 1901 for writing a video signal, a current can be prevented from continuing to flow through either of the transistors. As a result, difference between the first transistor 1900 and the second transistor 1901 in characteristics deterioration can be prevented from being large and the characteristics are prevented from being different from each other. In this manner, an organic EL display with high image quality and less variations in luminance among pixels can be provided. Further, it is known that characteristics of a transistor notably deteriorate when it is formed of amorphous silicon.

In this embodiment mode, since the second switch 1903 and the third switch 1904 are turned on or off at the same timing, they can have a common control terminal. In such a structure, the number of signals to be inputted to a pixel or the number of wires can be reduced. Thus, a driver circuit which controls the pixel can be simplified and a high aperture ratio can be realized.

A channel width, a channel length, and the like of the first transistor 1900 are preferably more than those of the second transistor 1901. It is only required that the characteristics of the first transistor 1900 be similar to those (a threshold voltage, mobility, and the like) of the second transistor 1901, therefore, a higher aperture ratio can be realized by making a channel width of the second transistor 1901 narrower and a channel length of the second transistor 1901 shorter.

The switching element described in this embodiment mode can be similar to that described in Embodiment Mode 1.

Embodiment Mode 8

As the switching element in Embodiment Mode 7, a transistor can be used. This embodiment mode describes a configuration of the case of using an n-channel transistor as the switching element with reference to FIG. 23.

Figure 23:
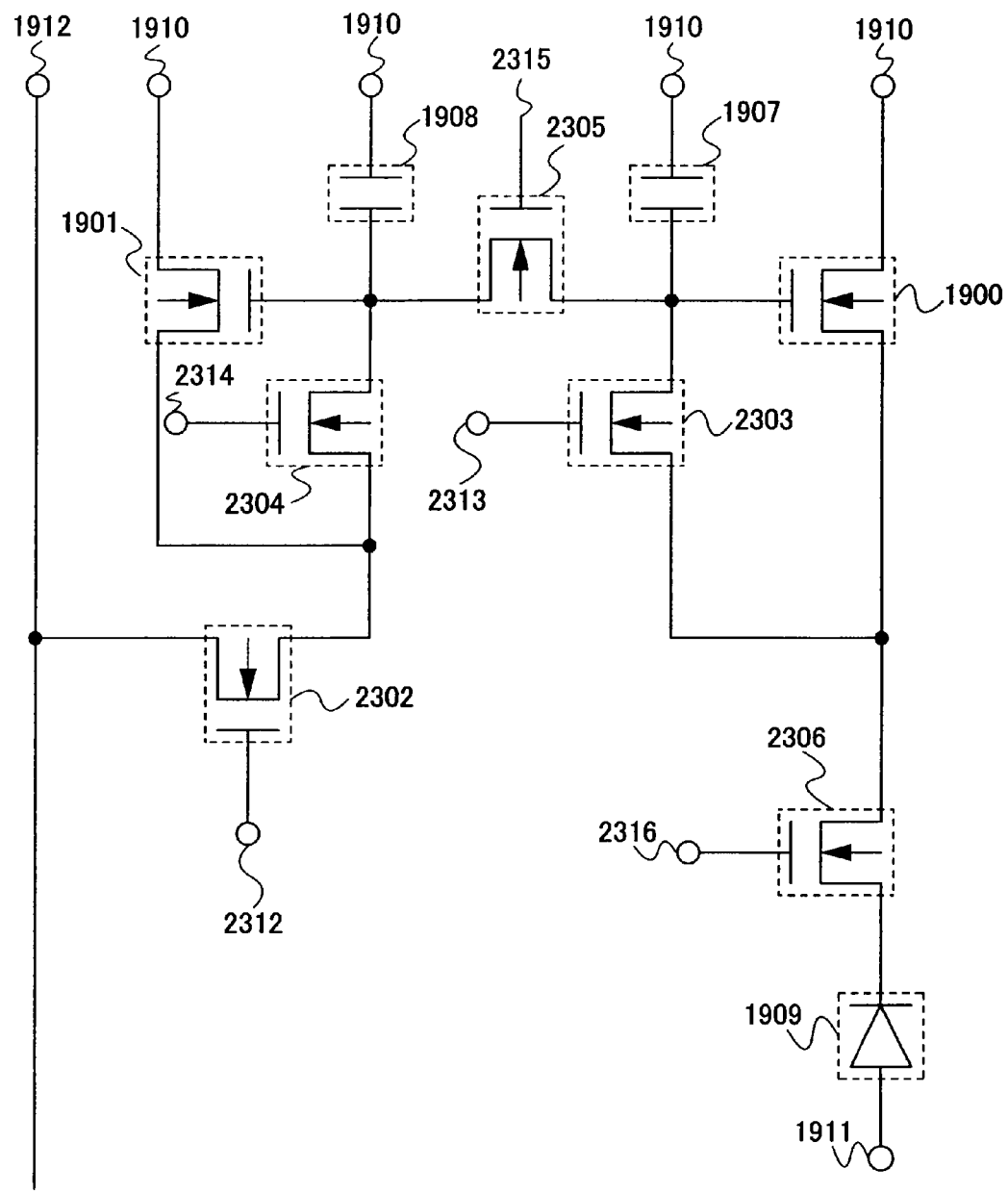
FIG. 23 is a diagram showing Embodiment Mode 8.

In FIG. 23, the first transistor 1900, the second transistor 1901, the first capacitor 1907, the second capacitor 1908, the EL element 1909, the power source line 1910, the counter electrode 1911, and the source signal line 1912 are similar to those in Embodiment Mode 7. A third transistor 2302, a fourth transistor 2303, a fifth transistor 2304, a sixth transistor 2305, and a seventh transistor 2306 each has a function as a switching element and operates in a linear region. The third transistor 2302, the fourth transistor 2303, the fifth transistor 2304, the sixth transistor 2305, and the seventh transistor 2306 are controlled by a digital signal from a first gate signal line 2312, a second gate signal line 2313, a third gate signal line 2314, a fourth gate signal line 2315, and a fifth gate signal line 2316 respectively, which are turned on when the digital signal is High and off when the digital signal is Low. A signal voltage which makes a gate-source voltage of a transistor to be inputted higher than a threshold voltage thereof is referred to as a High potential while a signal voltage which makes a gate-source voltage of a transistor to be inputted lower than a threshold voltage thereof is referred to as a Low potential.

Connections in FIG. 23 are described. The power source line 1910 is connected to the first terminal of the first transistor 1900, the first terminal of the second transistor 1901, one electrode of the first capacitor 1907, and one electrode of the second capacitor 1908. The other electrode of the first capacitor 1907 is connected to the gate of the first transistor 1900 while the other electrode of the second capacitor 1908 is connected to the gate of the second transistor 1901. The other electrode of the first capacitor 1907 and the gate of the first transistor 1900 are connected to a first terminal of the sixth transistor 2305 while the other electrode of the second capacitor 1908 and the gate of the second transistor 1901 are connected to a second terminal of the sixth transistor 2305. The second terminal of the first transistor 1900 is connected to a first terminal of the fourth transistor 2303 while a second terminal of the fourth transistor 2303 is connected to the gate of the first transistor 1900. The second terminal of the first transistor 1900 is connected to the first terminal of the seventh transistor 2306 while a second terminal of the seventh transistor 2306 is connected to one electrode of the EL element 1909. The second terminal of the second transistor 1901 is connected to a first terminal of the fifth transistor 2304 while a second terminal of the fifth transistor 2304 is connected to the gate of the second transistor 1901. The second terminal of the second transistor 1901 is connected to a first terminal of the third transistor 2302 while a second terminal of the third transistor 2302 is connected to the source signal line 1912.

Here, one electrode of the first capacitor 1907 and one electrode of the second capacitor 1908 are only required to be connected to a terminal of which potential becomes constant in operation. For example, they may be connected to the first gate signal line 2312 of a preceding row or another reference line may be additionally provided to be connected. The third transistor 2302, the fourth transistor 2303, the fifth transistor 2304, the sixth transistor 2305, and the seventh transistor 2306 may be arranged anywhere, as long as the circuit diagram shown in FIG. 23 becomes equivalent to FIG. 21 in a period T1 of FIG. 41 and to FIG. 22 in a period T2 of FIG. 41.

Figure 21:
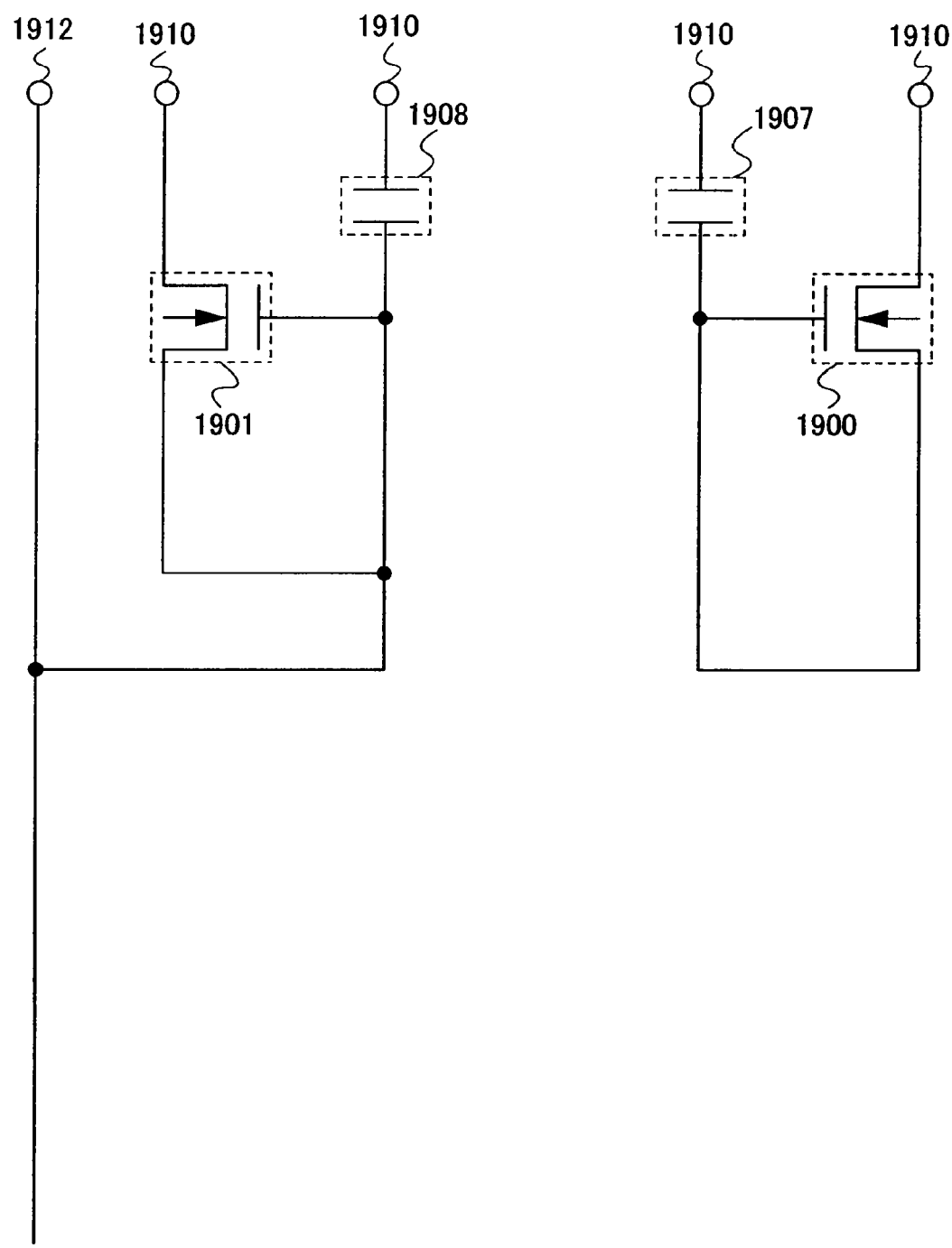
FIG. 21 is a diagram showing Embodiment Modes 7 and 8.

The number of transistors may be increased as well. Further, FIG. 21 is an equivalent circuit of the pixel circuit shown in FIG. 41 in the period T1 while FIG. 22 is an equivalent circuit of the pixel circuit shown in FIG. 41 in the period T2.

An operation of the period T1 is described. In the period T1, the fourth transistor 2303 is turned on, thereby the first transistor 1900 is diode-connected, and the fifth transistor 2304 is turned on, thereby the second transistor 1901 is diode-connected. The sixth transistor 2305 is turned off, thereby the first transistor 1900 and the second transistor 1901 are electrically disconnected. The seventh transistor 2306 is turned off, thereby a current supply to the EL element 1909 is blocked. The third transistor 2302 is turned on and a video signal inputted by current from the source signal line 1912 flows to the second transistor 1901. The second capacitor 1908 holds a gate-source voltage of the second transistor 1901 so that the current of the video signal flows through the second transistor 1901. The first capacitor 1907 holds a gate-source voltage of the first transistor 1900 so that no current flows to the first transistor 1900. That is, as a threshold voltage of the first transistor 1900 is held and characteristics (a threshold voltage, mobility, and the like) of the first transistor 1900 and those of the second transistor 1901 are similar to each other, the first capacitor 1907 holds a voltage almost equal to the threshold voltage of the second transistor 1901. At this time, similarly to Embodiment Mode 7, Idata inputted as a video signal is expressed by Formula (13) and the voltage held in the second capacitor 1908 is expressed by Formula (14).

In Formulas (13) and (14), Idata is a current value of a video signal which flows through the source signal line 1912, which is inputted to a pixel in the period T1. β is a constant containing parameters such as a channel length, a channel width, mobility, or capacitance of an oxide film, of the second transistor 1901. Vgs (T1) is a gate-source voltage of the second transistor 1901. Vth is a threshold voltage of the first transistor 1900 as well as a threshold voltage of the second transistor 1901 since the first transistor 1900 and the second transistor 1901 are paired.

An operation in the period T2 is described. In the period T2, the first transistor 2303 is turned off, thereby the first transistor 1900 is not diode-connected. The fifth transistor 2304 is turned off, thereby the second transistor 1901 is not diode-connected. The sixth transistor 2305 is turned on, thereby the first capacitor 1907 and the second capacitor 1908 are connected. The voltages held in the capacitors are divided by capacitive coupling. The seventh transistor 2306 is turned on and a current corresponding to the gate-source voltage of the first transistor 1900 is supplied to the EL element 1909. The third transistor 2302 is turned off and a video signal from the source signal line 1912 is blocked. At this time, similarly to Embodiment Mode 7, a gate voltage of the first transistor 1900 is expressed by Formula (14) and the current value supplied to the EL element 1909 is expressed by Formula (16).

In Formulas (14) and (16), Idata, β, Vth, and Vgs (T1) are similar to those in the period T1. Ioled is a current value supplied to the EL element 1909 in the period T2. That is, Ioled is equal to a current which flows through the first transistor 1900 since a voltage is held between the gate and source of the first transistor 1900 in the period T2. C1907 is capacitance of the first capacitor 1907, including gate capacitance of the first transistor 1900. C1908 is capacitance of the second capacitor 1908, including gate capacitance of the second transistor 1901.

In the aforementioned Formula (16), a current obtained by multiplying Idata by the square of [C1908/(C1907+C1908)]

can be supplied to the EL element 1909. Moreover, in the period T2, a current value supplied to the EL element 1909 does not vary if it is the same video signal even when characteristics between other pixels vary, as long as the characteristics (a threshold voltage, mobility, and the like) of the first transistor 1900 and those of the second transistor 1901 are similar to each other.

In this manner, a smaller current than a current of a video signal inputted to a pixel can be supplied to an EL element while compensating the variation in characteristics of driving transistors. Therefore, a certain degree of large current can be inputted even when expressing a low gray scale instead of inputting a slight amount of current as a video signal. As a result, speed to charge parasitic capacitance of a source signal line and the like can be increased. As a threshold voltage is obtained and a video signal is written simultaneously in the period T1, writing time per pixel can be shortened.

By providing the first transistor 1900 as a driving transistor and the second transistor 1901 for writing a video signal, a current can be prevented from continuing to flow through either of the transistors. As a result, difference between the first transistor 1900 and the second transistor 1901 in characteristics deterioration can be prevented from being large, and the characteristics are prevented from being different from each other. In this manner, an organic EL display with high image quality and less variation in luminance among pixels can be provided. Further, it is known that characteristics of a transistor notably deteriorate when it is formed of amorphous silicon.

By using an n-channel transistor for all the switching elements, a doping step for a p-channel transistor is not required. Therefore, the manufacturing steps can be simplified and inexpensively performed. Moreover, as only an n-channel transistor is employed, amorphous silicon can be used to form a transistor. In that case, the manufacturing steps are easy and suitable for an enlargement of a substrate, therefore, an inexpensive and large organic EL display can be manufactured.

In this embodiment mode, since the second gate signal line 2313 and the third gate signal line 2314 use a common control signal, they can be used in common. In such a structure, the number of signals to be inputted to a pixel or the number of wires can be reduced. Thus, a driver circuit which controls the pixel can be simplified and a high aperture ratio can be realized.

A channel width, a channel length, and the like of the first transistor 1900 are preferably more than those of the second transistor 1901. It is only required that the characteristics (a threshold voltage, mobility, and the like) of the first transistor 1900 be similar to those of the second transistor 1901, therefore, a higher aperture ratio can be realized by making a channel width of the second transistor 1901 narrower and a channel length of the second transistor 1901 shorter.

Although an n-channel transistor is used as a switching element here, a p-channel transistor may also be used. In that case, a signal inputted to a gate of the transistor which operates as a switching element is to be reversed.

Embodiment Mode 9

This embodiment mode describes a display device having the pixel described in Embodiment Modes 1 to 8, a configuration example of a source driver, a gate driver, or the like included in the display device, and an operation thereof.

First, a display device having the pixel described in Embodiment Modes 1 to 8 is described with reference to FIG. 42.

Figure 42:
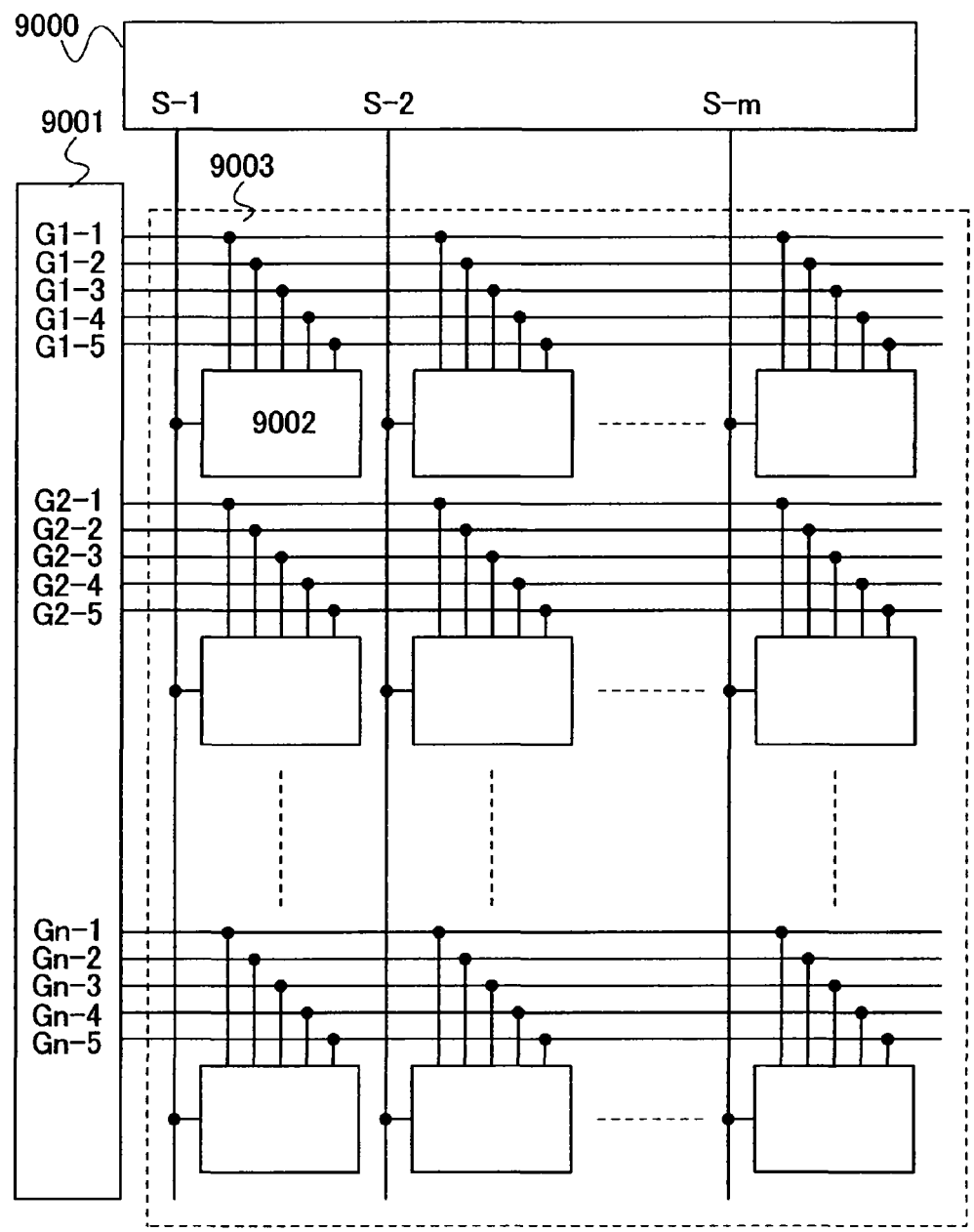
FIG. 42 is a diagram showing Embodiment Mode 9.

In FIG. 42, a source driver 9000 is a driver circuit which sequentially outputs a current signal as a video signal to a pixel portion 9003. Source signal lines S-1, S-2, and S-m are signal lines for transmitting the video signal which is outputted from the source driver 9000 to a pixel 9002, and there are m (m is a natural number of 2 or larger) rows of source signal lines. The gate driver 9001 is a driver circuit which sequentially outputs control signals to the pixel portion 9003 to scan and control the pixel 9002. Gate signal lines G1-1, G1-2, G1-3, G1-4, G1-5, G2-1, G2-2, G2-3, G2-4, G2-5, Gn-1, Gn-2, Gn-3, Gn-4, and Gn-5 are signal lines for transmitting the control signals which are outputted from the gate driver 9001 to the pixel 9002, and there are n (n is a natural number of 2 or larger) rows of gate signal lines. The pixel 9002 has the pixel configuration described in Embodiment Modes 1 to 8. In the display device shown in FIG. 42, a wire such as a power source line is not shown for convenience, but it may be additionally provided as required.

In the operation shown in FIG. 42, the source driver 9000 outputs a video signal and the gate driver 9001 outputs a control signal so that the operation described in Embodiment Modes 1 to 8 can be performed. In FIG. 42, moreover, the gate driver 9001 transmits control signals by using five gate signal lines, however, gate signal lines may be used in common if control signals thereof can be used in common. Further, if the gate driver 9001 can realize the control signals described in Embodiment Modes 1 to 8, for example, a shift register or a decoder circuit may be used. It is needless to say that a waveform or a voltage may be changed by using a buffer circuit, a level shifter circuit, a pulse width control circuit, or the like.

Here, a configuration example of the source driver 9000 shown in FIG. 42 is described with reference to FIG. 43.

Figure 43:
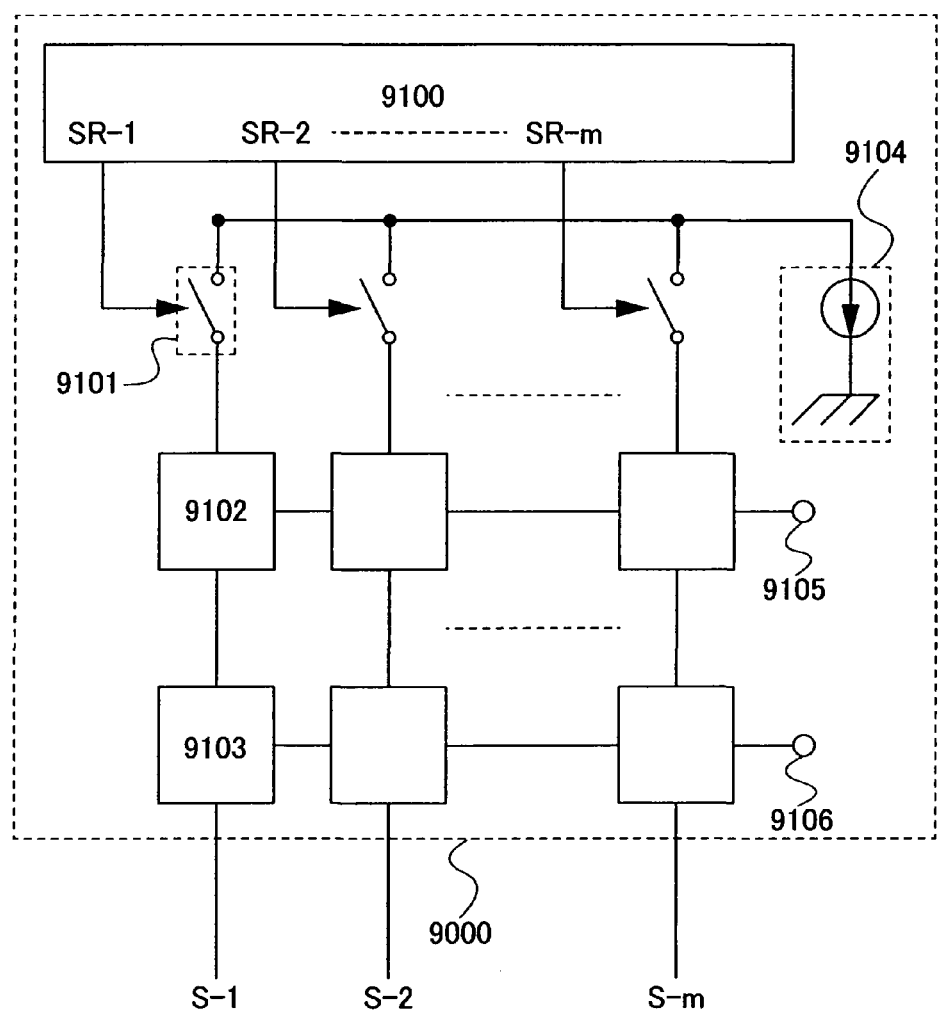
FIG. 43 is a diagram showing Embodiment Mode 9.

In FIG. 43, a shift register 9100 is a circuit which outputs scan signals sequentially from a first row at an arbitrary timing to select on or off of a switch 9101. The shift register 9100 starts scanning by a start pulse which is not shown. A current source 9104 is a current source which generates a video signal and can change a current value of the video signal in accordance with the luminance of the pixel. The switch 9101 is controlled to be on or off by the scan signal outputted from the shift register 9100. When the switch 9101 is on, a video signal is transmitted therethrough to a first latch circuit 9102. The first latch circuit 9102 sequentially holds the video signal transmitted through the switch 9101 from a first column. When the signals of all the columns are held, the first latch circuit 9102 outputs the held video signal of all the columns at the same time to a second latch circuit 9103. Further, the first latch circuit 9102 is controlled by a control signal which is transmitted by a first latch circuit control line 9105. A second latch circuit 9103 holds a video signal outputted from the first latch circuit 9102 and outputs the held video signal of all the columns at the same time to the source signal line. Moreover, the second latch circuit 9103 is controlled by a second latch circuit control line 9106.

Operations of FIG. 43 in a first period and a second period are described separately. The first period is described. In the first period, the switch 9101 is sequentially turned on by a scan signal outputted from the shift register 9100. In a column where the switch 9101 is turned on, a video signal is transmitted through the switch 9101 and held in the first latch circuit 9102. This operation is repeated until a video signal is held in the first latch circuit 9102 in the last column. At this time, the first latch circuit 9102 and the second latch circuit 9103 are not electrically connected. An output of the first latch circuit 9102 is not inputted to the second latch circuit 9103. The second latch circuit 9103 outputs a current corresponding to a video signal held in the preceding operation to a source signal line.

The second period is described. In the second period, a scan signal is not outputted from the shift register 9100 and every switch 9101 is off. Therefore, a video signal is not inputted to any first latch circuit 9102. The first latch circuit 9102 outputs the video signal held in the preceding operation to the second latch circuit 9103 all columns at the same time. The second latch circuit 9103 holds the inputted video signal. At this time, the second latch circuit 9103 and the source signal line are not electrically connected, thus the video signal is not outputted to the source signal line. In this manner, by repeating the first period and the second period, a video signal can be transmitted to the pixel.

In FIG. 43, a direction of current of the current source 9104 is a direction with which current in the source signal line flows from each of pixels to the second latch circuit 9103. This direction is advantageous in the case where a driving transistor of a pixel is a p-channel transistor. Further, in the case where a driving transistor of a pixel is an n-channel transistor, the direction of current of the current source 9104 may be reversed.

In the case of forming the current source 9104 over a glass substrate using a transistor, a current mirror circuit may be employed as a configuration of the current source. When the current mirror circuit is used, a current inputted from an external circuit such as a controller can be easily amplified or reduced, therefore, a more accurate current can be used as a video signal.

In FIG. 43, there is only one current source which generates a video signal, however, the invention is not limited to this. For example, when two current sources are provided, two video signals can be generated at the same time, therefore, the switches 9101 of two columns can be turned on at the same time by the scan signals outputted from the shift register 9100, and the two columns can be operated at the same time. That is, as a circuit scale of the shift register 9100 and time to scan all the columns can be reduced to half, even a large display device with many columns can be operated.

A video signal outputted from the second latch circuit 9103 is outputted to the source signal line, however, it may be outputted through an analog buffer circuit or the like. As a result, a video signal highly resistant to noise can be written to a pixel more accurately.

As a control signal inputted to a first latch circuit control line 9105 which controls the first latch circuit 9102 and a second latch circuit control line 9106 which controls the second latch circuit 9103, an output pulse of the shift register 9100 may be used. Alternatively, the start pulse of the shift register 9100 may also be used. By using the output pulse or the start pulse of the shift register 9100, the number of signals inputted from the controller is reduced. Therefore, an external circuit can be easily formed, which can save space and power consumption.

Here, a configuration example of the source driver 9000 shown in FIG. 42 is described with reference to FIG. 44.

Figure 44:
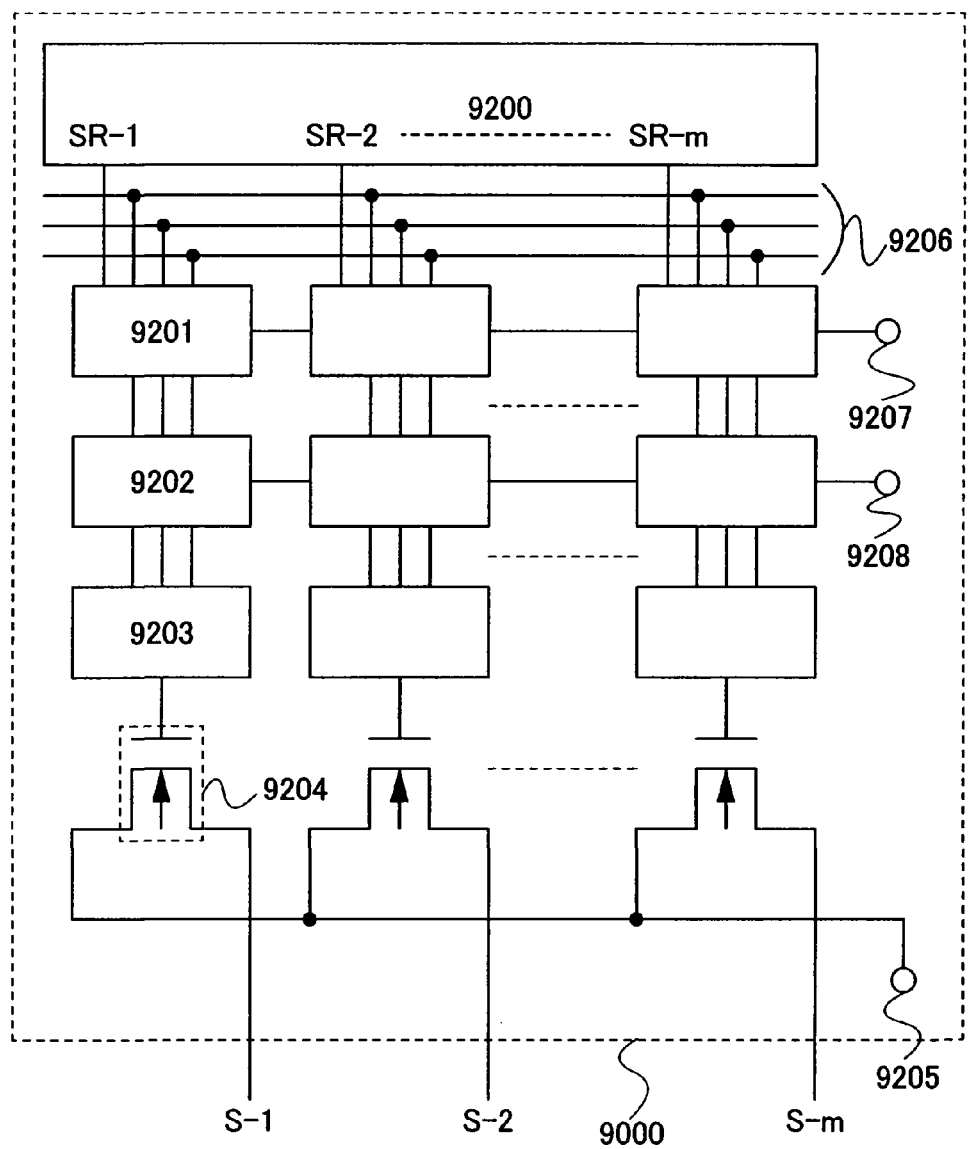
FIG. 44 is a diagram showing Embodiment Mode 9.

In FIG. 44, a shift register 9200 is a circuit which sequentially outputs scan signals from a first column at an arbitrary timing to select if the first latch circuit 9201 can latch or not. The shift register 9200 starts scanning by a start pulse although not shown. Video signal lines 9206 are signal lines which transmit video signals by voltage each having a digital value and can change the video signals in accordance with the luminance of a pixel. The first latch circuit 9201 sequentially holds the video signal from the first column. When the video signals are held in all the columns, the held video signals are outputted to the second latch circuit 9202 all columns at the same time. The first latch circuit 9201 is controlled by a control signal which is transmitted by a first latch circuit control line 9207. The second latch circuit 9202 holds the video signal outputted from the first latch circuit 9201 and outputs the held video signal to a DAC 9203 all columns at the same time. The second latch circuit 9202 is controlled by a second latch circuit control line 9208. The DAC 9203 is a digital-analog conversion circuit which inputs a plurality of video signals each having a digital value, which are outputted from the second latch circuit 9202, and outputs the video signals to a transistor 9204 as an analog voltage. The transistor 9204 is a transistor which operates as a current source and determines a current value outputted to a source signal line based on a potential difference between a reference voltage 9205 as a source and an analog voltage outputted from the DAC 9203.

Operations of FIG. 44 in a first period and a second period are described separately. The first period is described. In the first period, the first latch circuit 9201 sequentially holds video signals from a first column by a scan signal outputted from the shift register 9200. This operation is repeated until a video signal is held in the first latch circuit 9201 of the last column. Further, the first latch circuit 9201 and the second latch circuit 9202 are not electrically connected, therefore, an output of the first latch circuit 9201 is not inputted to the second latch circuit 9202. The second latch circuit 9202 outputs the video signal held in the preceding operation to the DAC 9203 which outputs an analog voltage corresponding to the inputted video signal to a gate of the transistor 9204. Here, the reference voltage 9205 necessarily operates as a source voltage. That is, a current value flowing through the source signal line is determined by a voltage between output voltage of the DAC 9203 and the reference voltage 9205.

The second period is described. In the second period, a scan signal is not outputted from the shift register 9200 and no first latch circuit 9201 additionally holds a video signal. The first latch circuit 9201 outputs the video signal held in the preceding operation to the second latch circuit 9202 all columns at the same time and the second latch circuit 9202 holds the inputted video signal. At this time, the source driver 9000 and the source signal line are not electrically connected.

In this manner, by repeating the first period and the second period, a video signal can be transmitted to the pixel.

In FIG. 43, the video signal lines 9206 can be divided into a plurality of groups. For example, when they are divided into two, different video signals can be held in two columns of first latch circuits 9201 at the same time by a scan signal outputted from the shift register 9200. That is, as a circuit scale of the shift register 9200 and time to scan all the columns can be reduced to half, even a large display device with many columns can be operated.

A video signal outputted from the transistor 9204 may be outputted to the source signal line through an analog buffer circuit or the like. When the video signal is outputted through the analog buffer circuit, a video signal highly resistant to noise can be more accurately written to a pixel.

The transistor 9204 employs an n-channel transistor in FIG. 44, however, a p-channel transistor may be used as well. It is advantageous to use an n-channel transistor in that a source potential is fixed when a current is outputted in a direction to the reference voltage 9205. It is advantageous to use a p-channel transistor in that a source potential is fixed when a current is outputted to the source signal line.

As a control signal inputted to a first latch circuit control line 9207 which controls the first latch circuit 9201 and a second latch circuit control line 9208 which controls the second latch circuit 9202, an output pulse of the shift register 9200 may be used. Alternatively, the start pulse of the shift register 9200 may also be used. By using the output pulse or the start pulse of the shift register 9200, the number of signals inputted from the controller is reduced. Therefore, an external circuit can be easily formed, which can save space and power consumption.

Here, a configuration example of the source driver 9000 shown in FIG. 42 is described with reference to FIG. 45.

Figure 45:
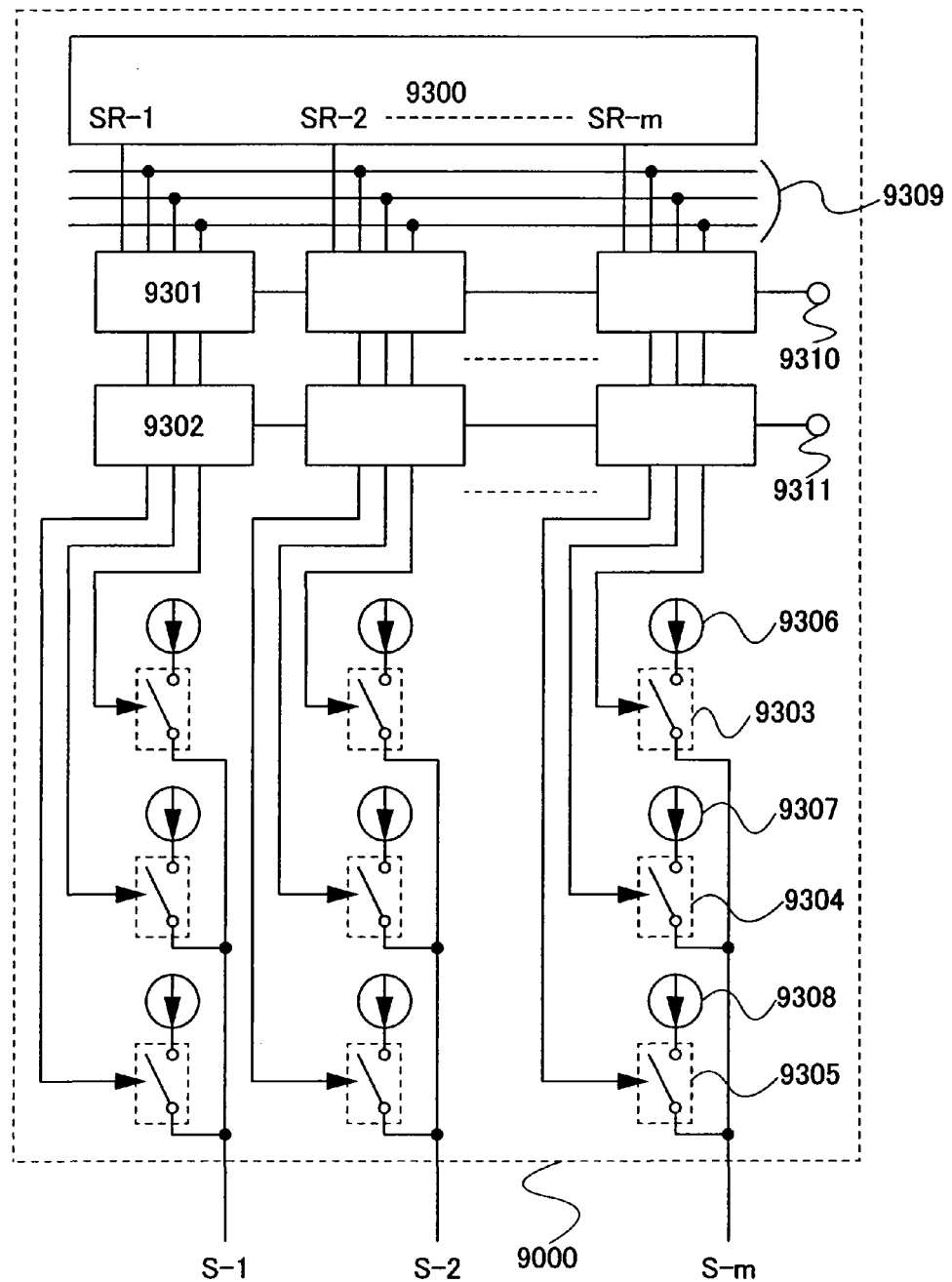
FIG. 45 is a diagram showing Embodiment Mode 9.

In FIG. 45, a shift register 9300 is a circuit which sequentially outputs scan signals from a first row at an arbitrary timing to select if a first latch circuit 9301 can latch or not. The shift register 9300 starts scanning by a start pulse although not shown. Video signal lines 9309 are signal lines which transmit video signals by voltage each having a digital value and can change the video signals in accordance with the luminance of a pixel. The first latch circuit 9301 sequentially holds the video signal from the first column. When the video signals are held in all the columns, the first latch circuit 9301 outputs the held video signals to the second latch circuit 9302 all columns at the same time. The first latch circuit 9301 is controlled by a control signal which is transmitted by a first latch circuit control line 9310. The second latch circuit 9302 holds the video signal outputted from the first latch circuit 9301 and outputs the held video signal to a first switch 9303, a second switch 9304, and a third switch 9305 all columns at the same time to control on/off of them. The second latch circuit 9302 is controlled by a second latch circuit control line 9311. The first switch 9303 has one terminal having a first current source 9306. When the first switch 9303 is turned on, it outputs a current value of the first current source 9306 to a source signal line. The second switch 9304 has one terminal having a second current source 9307. When the second switch 9304 is turned on, it outputs a current value of the second current source 9307 to a source signal line. The third switch 9305 has one terminal having a third current source 9308. When the third switch 9305 is turned on, it outputs a current value of the third current source 9308 to a source signal line.

Operations of FIG. 45 in a first period and a second period are described separately. The first period is described. In the first period, the first latch circuit 9301 sequentially holds video signals from a first column by a scan signal outputted from the shift register 9300. This operation is repeated until a video signal is held in the first latch circuit 9301 of the last column. Further, the first latch circuit 9301 and the second latch circuit 9302 are not electrically connected, therefore, an output of the first latch circuit 9301 is not inputted to the second latch circuit 9302. The second latch circuit 9302 outputs the video signal held in the preceding operation to the first switch 9303, the second switch 9304, and the third switch 9305, each of which is turned on or off by the inputted video signal. That is, a current value outputted to the source signal line corresponds to the sum of current values of the first current source 9306, the second current source 9307, and the third current source 9308 which are connected to the switches which are turned on.

The second period is described. In the second period, a scan signal is not outputted from the shift register 9300 and no first latch circuit 9301 additionally holds a video signal. The first latch circuit 9301 outputs the video signal held in the preceding operation to the second latch circuit 9302 all columns at the same time and the second latch circuit 9302 holds the inputted video signal. At this time, the source driver 9000 and the source signal line are not electrically connected. In this manner, by repeating the first period and the second period, a video signal can be transmitted to the pixel.

In FIG. 45, the video signal lines 9309 can be divided into a plurality of lines. For example, when they are divided into two, different video signals can be held in two columns of first latch circuits 9301 at the same time by a scan signal outputted from the shift register 9300. That is, as a circuit scale of the shift register 9300 and time to scan all the columns can be reduced to half, even a large display device with many columns can be operated.

As a control signal inputted to a first latch circuit control line 9310 which control the first latch circuit 9301 and a second latch circuit control line 9311 which controls the second latch circuit 9302, an output pulse of the shift register 9300 may be used. Alternatively, the start pulse of the shift register 9300 may also be used. By using the output pulse or the start pulse of the shift register 9300, the number of signals inputted from the controller is reduced. Therefore, an external circuit can be easily formed, which can save space and power consumption.

The switching element described in this embodiment mode may be similar to that described in Embodiment Mode 1.

Embodiment 1

Figure 24A:
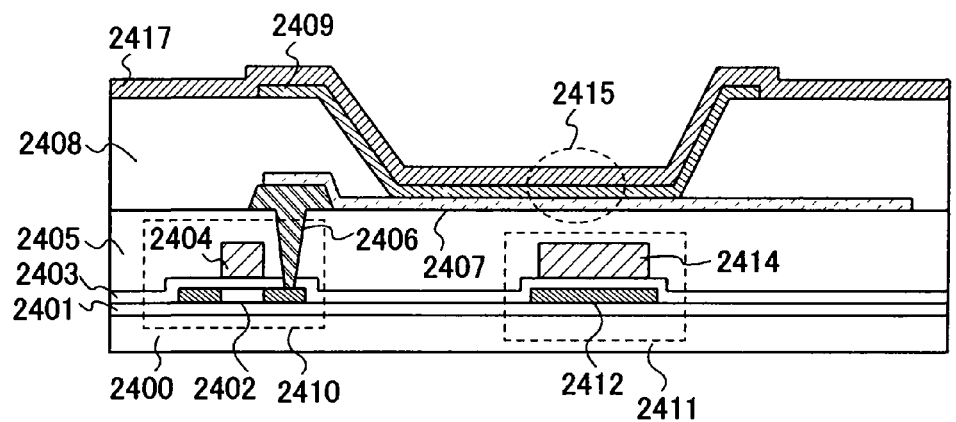
FIGS. 24A and 24B are diagrams showing Embodiment 1.
Figure 24B:
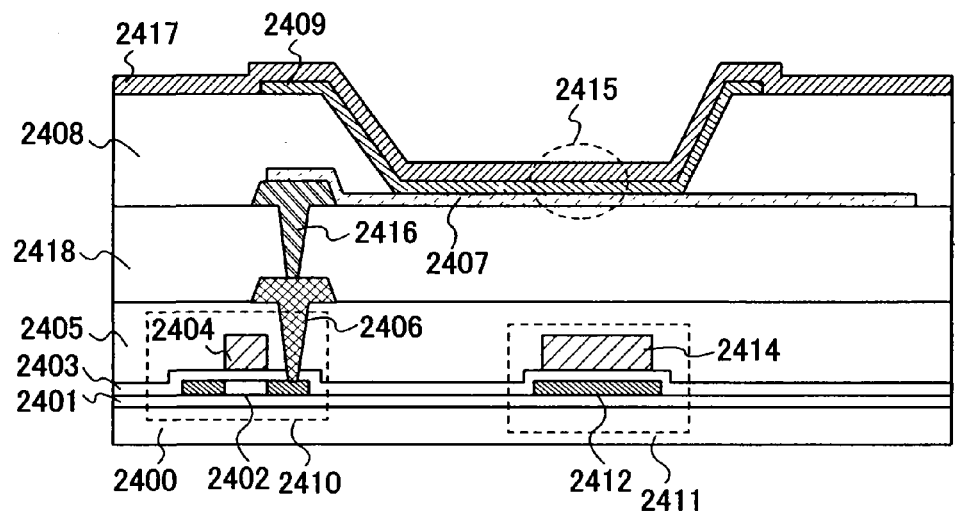

In this embodiment, a pixel configuration example is described. FIGS. 24A and 24B are sectional views of a pixel in a panel of the invention. In this example, a transistor is used as a switching element provided in the pixel and a light emitting element is used as a display medium provided in the pixel.

In FIGS. 24A and 24B, a reference numeral 2400 denotes a substrate, 2401 denotes a base film, 2402 denotes a first semiconductor layer, 2412 denotes a second semiconductor layer, 2403 denotes a first insulating film, 2404 denotes a gate electrode, 2414 denotes a third electrode, 2405 denotes a second insulating film, 2406 denotes a first electrode, 2407 denotes a second electrode, 2408 denotes a third insulating film, 2409 denotes a light emitting layer, and 2416 denotes a fifth electrode. A reference numeral 2410 denotes a transistor, 2415 denotes a light emitting element, and 2411 denotes a capacitor. In FIGS. 24A and 24B, the transistor 2410 and the capacitor 2411 are shown as representatives of elements which constitute the pixel. The configuration of FIG. 24A is described.

As the substrate 2400, for example, a glass substrate formed of barium borosilicate glass, alumino borosilicate glass, or the like, a quartz substrate, a ceramic substrate, or the like can be used. Further, a metal substrate including a stainless steel substrate or a semiconductor substrate which has a surface covered with an insulating film may also be used. A substrate formed of a flexible synthetic resin such as plastic may be used as well. The surface of the substrate 2400 may be planarized by polishing by a CMP method or the like.

As the base film 2401, an insulating film formed of silicon oxide, silicon nitride, silicon nitride oxide, or the like can be used. The base film 2401 can prevent an alkali metal such as Na or an alkaline earth metal contained in the substrate 2400 from dispersing over the first semiconductor layer 2402 and adversely affecting the characteristics (a threshold voltage, mobility, and the like) of the transistor 2410. In FIGS. 24A and 24B, the base film 2401 has a single-layer structure, however, it may be formed of a plurality of layers of two or more. It is to be noted that the base film 2401 is not necessarily provided when dispersion of an impurity is not a big problem, such as the case of using a quartz substrate.

As the first semiconductor layer 2402 and the second semiconductor layer 2412, a crystalline semiconductor film or an amorphous semiconductor film which are patterned can be used. A crystalline semiconductor film can be formed by crystallizing an amorphous semiconductor film. As a crystallization method, a laser crystallization method, a thermal crystallization method using an RTA or an annealing furnace, a thermal crystallization method using a metal element which promotes crystallization, or the like can be used. The first semiconductor layer 2402 has a channel forming region and a pair of impurity regions to which impurity elements which impart a conductivity type are added. It is to be noted that an impurity region to which an impurity element is added at a low concentration may be provided between the channel forming region and the pair of impurity regions. An impurity element imparting a conductivity type may be added to the whole second semiconductor layer 2412.

As the first insulating film 2403, a single layer or a plurality of stacked layers of silicon oxide, silicon nitride, silicon nitride oxide, or the like can be used. It is to be noted that a film containing hydrogen is used as the first insulating film 2403, thereby the first semiconductor layer 2402 may be dehydrogenated.

As the gate electrode and the fourth electrode 2414, a single layer or a stacked-layer structure of an element selected from Ta, W, Ti, Mo, Al, Cu, Cr, and Nd, or an alloy or a compound containing a plurality of the elements can be used.

The transistor 2410 is formed of the first semiconductor layer 2402, the gate electrode 2404, and the first insulating film 2403 between the first semiconductor layer 2402 and the gate electrode 2404. In FIGS. 24A and 24B, only the transistor 2410 connected to the second electrode 2407 of the light emitting element 2915 is shown as a transistor to constitute a pixel, however, a plurality of transistors may be used as well. Further, in this embodiment, the transistor 2410 is shown as a top gate type transistor, however, it may be a bottom gate type transistor having a gate electrode under the semiconductor layer or a dual gate type transistor having gate electrodes over and under the semiconductor layer.

In the capacitor 2411, the first insulating film 2403 is used as a dielectric, and the second semiconductor layer 2412 and the fourth electrode 2414 opposing to each other sandwiching the first insulating film 2403 are used as a pair of electrodes. It is to be noted that FIGS. 24A and 24B show examples where the second semiconductor layer 2412 which is formed at the same times as the first semiconductor layer 2402 is used as one of the pair of electrodes, and the fourth electrode 2414 which is formed at the same time as the gate electrode 2404 of the transistor 2410 is used as the other electrode, however, the invention is not limited to this structure.

As the second insulating film 2405, a single layer or stacked layers of an inorganic insulating film or an organic insulating film can be used. As the inorganic insulating film, a silicon oxide film formed by a CVD method, a silicon oxide film formed by an SOG (Spin On Glass) method, or the like can be used. As the organic insulating film, a film formed of polyimide, polyamide, BCB (benzocyclobutene), acrylic, a positive type photosensitive organic resin, a negative type photosensitive organic resin, or the like can be used.

As the second insulating film 2405, a material having a skeleton structure of a bond of silicon (Si) and oxygen (O) can be used. As a substituent of this material, an organic group containing at least hydrogen (for example, an alkyl group or aromatic hydrocarbon) is used. As a substituent, a fluoro group may also be used. Alternatively, an organic group containing at least hydrogen and a fluoro group may be used.

The surface of the second insulating film 2405 may be treated by high density plasma to be nitrided. The high density plasma is generated by using a high frequency microwave of, for example, 2.45 GHz. Note that, as the high density plasma, a high density plasma whose electron density is $1\times10^{11}$ to $1\times10^{13}$ cm$^{-3}$ and an electron temperature is 0.2 to 2.0 eV (more preferably, 0.5 to 1.5 eV) is used. Since such high density plasma featuring the low electron temperature has low kinetic energy of active species, a film having less defects can be formed with less plasma damage as compared to the conventional plasma treatment. In high density plasma treatment, a temperature of the substrate 2400 is set at 350 to 450° C. Further, in an apparatus for generating high density plasma, a distance between an antenna for generating a microwave and the substrate 2400 is set 20 to 80 mm (preferably 20 to 60 mm).

In an atmosphere of nitrogen (N) and a rare gas (containing at least one of He, Ne, Ar, Kr, and Xe), or an atmosphere of nitrogen, hydrogen (H), and a rare gas, or an atmosphere of ammonium (NH$_3$) and a rare gas, the above described high density plasma treatment is performed to nitride the surface of the second insulating film 2405. The surface of the second insulating film 2405 formed by the nitriding treatment with the high density plasma is mixed with an element such as H, He, Ne, Ar, Kr, or Xe. For example, a silicon oxide film or a silicon oxynitride film is used as the second insulating film 2405 and its surface is subjected to treatment with high density plasma to form a silicon nitride film. By utilizing hydrogen contained in the thus formed silicon nitride film, the first semiconductor layer 2402 of the transistor 2410 may be hydrogenated. Further, the hydrogenation treatment may be combined with the aforementioned hydrogenation treatment using hydrogen contained in the first insulating film 2403. It is to be noted that an insulating film may further be formed over the nitride film formed by the aforementioned high density plasma treatment to be used as the second insulating film 2405.

As the first electrode 2406, a single layer or stacked layers formed of one element selected from Al, Ni, C, W, Mo, Ti, Pt, Cu, Ta, Au, and Mn, or an alloy containing a plurality of the elements can be used.

One or both of the second electrode 2407 and the fourth electrode 2417 can be formed of a transparent electrode. For a transparent electrode, indium oxide containing tungsten oxide (IWO), indium oxide containing tungsten oxide and zinc oxide (IWZO), indium oxide containing titanium oxide (ITiO), indium tin oxide containing titanium oxide (ITTiO), or the like can be used. It is needless to say that indium tin oxide (ITO), indium zinc oxide (IZO), indium tin oxide to which silicon oxide is added (ITSO), or the like can also be used.

It is preferable to form a light emitting layer using a plurality of layers having different functions, such as a hole injecting/transporting layer, a light emitting layer, and an electron injecting/transporting layer.

It is preferable to form a hole injecting/transporting layer using a composite material containing an organic compound material having a hole transporting property and an inorganic compound material having an electron accepting property against the organic compound material. As a result, many hole carriers are generated in the organic compound which originally has few internal carriers, and thus a superior hole injecting/transporting property can be obtained. By this effect, a driving voltage can be lowered than before. Further, as the hole injecting/transporting layer can be formed thick without increasing a driving voltage, a short-circuit of the light emitting element caused by dust or the like can be suppressed as well.

As an organic compound material having a hole transporting property, 4,4',4"-tris[N-(3-methylphenyl)-N-phenylamino]triphenylamine (abbreviation: MTDATA); 1,3,5-tris

[N,N'-di(m-tolyl)amino]benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); and the like can be given. However, the invention is not limited to these.

As an inorganic compound material having an electron accepting property, titanium oxide, zirconium oxide, vanadium oxide, molybdenum oxide, tungsten oxide, rhenium oxide, ruthenium oxide, zinc oxide, and the like can be given. In particular, vanadium oxide, molybdenum oxide, tungsten oxide, and rhenium oxide are preferable since they are capable of vacuum evaporation and can be easily handled.

An electron injecting/transporting layer is formed by using an organic compound material having an electron transporting property. In specific, tris(8-quinolinolato)aluminum (abbreviation: Alq$_3$), tris(4-methyl-8-quinolinolato) aluminum (abbreviation: Almq$_3$), and the like can be given; however, the invention is not limited to these.

As for a light emitting layer, 9,10-di(2-naphthyl)anthracene (abbreviation: DNA); 9,10-di(2-naphthyl)-2-tert-butylanthracene (abbreviation: t-BuDNA); 4,4'-bis(2,2-diphenylvinyl)biphenyl (abbreviation: DPVBi); coumarin 30; coumarin 6; coumarin 545; coumarin 545T; perylene; rubrene; periflanthene; 2,5,8,11-tetra(tert-buthyl)perylene (abbreviation: TBP); 9,10-diphenylanthracene (abbreviation: DPA); 5,12-diphenyltetracene; 4-(dicyanomethylene)-2-methyl-[p-(dimethylamino)styryl]-4H-pyran (abbreviation: DCM1); 4-(dicyanomethylene)-2-methyl-6-[2-(julolidine-9-yl)ethenyl]-4H-pyran (abbreviation: DCM2); 4-(dicyanomethylene)-2,6-bis[p-(dimethylamino) styryl]-4H-pyran (abbreviation: BisDCM); and the like can be used. Further, the following compounds which can emit phosphorescence can also be used: bis[2-(4',6'-difluorophenyl)pyridinato-N,C2'] iridium(picolinato) (abbreviation: FIrpic); bis{2-[3',5'-bis (trifluoromethyl)phenyl]pyridinato-N,C2'}iridium(picolinato) (abbreviation: Ir(CF3ppy)2(pic)); tris(2-phenylpyridinato-N,C2')iridium (abbreviation: Ir(ppy)3); bis (2-phenylpyridinato-N,C2')iridium(acetylacetonato) (abbreviation: Ir(ppy)2(acac)); bis[2-(2'-thienyl)pyridinato-N,C3']iridium(acetylacetonato) (abbreviation: Ir(thp)2 (acac)); bis(2-phenylquinolinato-N,C2')iridium(acetylacetonato) (abbreviation: Ir(pq)2(acac)); bis[2-(2'-benzothienyl) pyridinato-N,C3']iridium(acetylacetonato) (abbreviation: Ir(btp)2(acac)); and the like.

Besides, as a high molecular electroluminescent material which can be used for forming a light emitting layer, a poly-paraphenylenevinylene-based, polyparaphenylene-based, polythiophene-based, or polyflorene-based material can be given.

In any case, a structure of a light emitting layer could change. As far as a function as a light emitting element is achieved, such changes are construed as being included as providing a dedicated electrode instead of providing a specific hole or electron injecting/transporting layer or a light emitting layer or dispersing a light emitting material.

The other of the second electrode 2407 and the fourth electrode 2417 may be formed using a material having no light transmitting property. For example, an alkali metal such as Li or Cs, an alkaline earth metal such as Mg, Ca, or Sr, an alloy containing these elements (e.g., Mg:Ag, Al:Li, Mg:In, or the like), a compound of these elements (e.g., calcium fluoride such as CaF$_2$ or calcium nitride such as Ca$_3$N$_2$) can be used. In addition, a rare earth metal such as Yb or Er can be used.

As the third insulating film 2408, a similar material to the second insulating film 2405 can be used. The third insulating film 2408 is formed in the periphery of the second electrode 2407 so as to cover an edge portion of the second electrode 2407, and has a function to separate the light emitting layer 2409 between adjacent pixels.

The light emitting layer 2409 is formed of a single layer or a plurality of layers. When the light emitting layer 2409 is formed of a plurality of layers, these layers can be categorized into a hole injecting layer, a hole transporting layer, a light emitting layer, an electron transporting layer, an electron injecting layer, and the like in view of a carrier transporting property. It is to be noted that the boundary between the layers is not always required to be clear. A material which forms both layers may be mixed in a part, where a boundary may be unclear. An organic material or an inorganic material can be used for each layer. As the organic material, any of a high molecular, medium molecular, and low molecular materials can be used.

The light emitting element 2415 is constituted by the light emitting layer 2409, the second electrode 2407, and the fourth electrode 2417 which are overlapped sandwiching the light emitting layer 2409. One of the second electrode 2407 and the fourth electrode 2417 corresponds to an anode and the other corresponds to a cathode. When a biased voltage higher than a threshold voltage is applied between the anode and the cathode, a current flows from the anode to the cathode, thereby the light emitting element 2415 emits light.

A structure shown in FIG. 24B is described. It is to be noted that the same portions as those in FIG. 24A are denoted by the same reference numerals and description thereof is omitted. FIG. 24B corresponds to FIG. 24A to which a fourth insulating film 2418 is additionally provided between the second insulating film 2405 and the third insulating film 2408. The fifth electrode 2416 and the first electrode 2406 are connected through a contact hole provided in the fourth insulating film 2418.

The fourth insulating film 2418 can have a similar structure to the second insulating film 2405. The fifth electrode 2416 can have a similar structure to the first electrode 2406.

Embodiment 2

This embodiment describes the case of using an amorphous silicon (a-Si:H) film as a semiconductor layer of a transistor. FIGS. 28A and 28B show a top gate type transistor and FIGS. 29A to 30B show bottom gate type transistors.

FIG. 28A shows a cross sectional view of a transistor which has a semiconductor layer formed of amorphous silicon. As shown in FIG. 28A, a base film 2802 is formed over a substrate 2801. Further, a pixel electrode 2803 is formed over the base film 2802. The first electrode 2804 is formed of the same material and in the same layer as the pixel electrode 2803.

A glass substrate, a quartz substrate, a ceramic substrate, or the like can be used for the substrate. Moreover, as the base film 2802, a single layer or stacked layers of aluminum nitride, silicon oxide, silicon oxynitride, or the like can be used.

Further, a first wire 2805 and a second wire 2806 are formed over the base film 2802. An edge portion of the pixel electrode 2803 is covered with the first wire 2805. A first n-type semiconductor layer 2807 and a second n-type semiconductor layer 2808 which have n-type conductivity are formed over the first wire 2805 and the second wire 2806. A semiconductor layer 2809 is formed over the base film 2802 between the first wire 2805 and the second wire 2806. A portion of the semiconductor layer 2809 extends to be over the first n-type semiconductor layer 2807 and the second n-type semiconductor layer 2808. It is to be noted that this semiconductor layer is formed of a semiconductor film having non-crystallinity such as amorphous silicon (a-Si:H) and a microcrystal semiconductor (μ-Si:H). A gate insulating film 2810 is formed over the semiconductor layer 2809. Further, an insulating film 2811 formed of the same material and in the same layer as the gate insulating film 2810 is formed over the first electrode 2804 as well. It is to be noted that a silicon oxide film, a silicon nitride film, or the like is used for the gate insulating film 2810.

A gate electrode 2812 is formed over the gate insulating film 2810. Further, a second electrode 2813 formed of the same material in the same layer as the gate electrode is formed over the first electrode 2804 with the insulating film 2811 interposed therebetween. The first electrode 2804 and the second electrode 2813 which sandwich the insulating film 2811 form the capacitor 2819. Moreover, an interlayer insulating film 2814 is formed so as to cover the edge portion of the pixel electrode 2803, the driving transistor 2818, and the capacitor 2819.

A layer 2815 containing an organic compound and a counter electrode 2816 are formed over the interlayer insulating layer 2814 and the pixel electrode 2803 provided in an opening portion therein. A region where the layer 2815 containing an organic compound is sandwiched between the pixel electrode 2803 and the counter electrode 2816 forms a light emitting element 2817.

The first electrode 2804 shown in FIG. 28A may be formed of the first electrode 2820 as shown in FIG. 28B. The first electrode 2820 is formed of the same material in the same layer as the first wire 2805 and the second wire 2806.

FIGS. 29A and 29B each shows a sectional view of a portion of a panel in a semiconductor device using a bottom gate type transistor which has a semiconductor layer formed of amorphous silicon. A gate electrode 2903 is formed over a substrate 2901. A first electrode 2904 is formed of the same layer in the same layer as the gate electrode. The gate electrode 2903 can be formed of a high melting point metal such as Ti, Cr, Mo, W, and Ta.

A gate insulating film 2905 is formed so as to cover the gate electrode 2903 and the first electrode 2904. A silicon oxide film, a silicon nitride film, or the like is used as the gate insulating film 2905.

A first semiconductor layer 2906 is formed over the gate insulating film 2905. A second semiconductor layer 2907 is formed of the same material and in the same layer as the first semiconductor layer 2906. A glass substrate, a quartz substrate, a ceramic substrate, or the like can be used as the substrate.

A first n-type semiconductor layer 2908 and a second n-type semiconductor layer 2909 which have n-type conductivity are formed over the first semiconductor layer 2906, and a third n-type semiconductor layer 2910 is formed over the second semiconductor layer 2907. A first wire 2911 and a second wire 2912 are formed over the first n-type semiconductor layer 2908 and the second n-type semiconductor layer 2909 respectively. A conductive layer 2913 formed of the same material and in the same layer as the first wire 2911 and the second wire 2912 is formed over the third n-type semiconductor layer 2910.

A second electrode is formed of the second semiconductor layer 2907, the third n-type semiconductor layer 2910, and the conductive layer 2913. It is to be noted that the second electrode and the first electrode 2904 sandwiching the gate insulating film 2905 forms a capacitor 2920.

One edge portion of the first wire 2911 is extended, on which a pixel electrode 2914 is formed.

An insulating layer 2915 is formed so as to cover an edge portion of the pixel electrode 2914, the driving transistor 2919, and the capacitor 2920. A layer 2916 containing an organic compound and a counter electrode 2917 are formed over the pixel electrode 2914 and the insulating layer 2915. A region where the layer 2916 containing an organic compound is sandwiched between the pixel electrode 2914 and the counter electrode 2917 forms a light emitting element 2918.

The second semiconductor layer 2907 and the third n-type semiconductor layer 2910 to be a portion of the second electrode of the capacitor are not always required to be provided. That is, the second conductive layer 2913 may be used as the second electrode so that a capacitor has a structure where a gate insulating film is sandwiched between the first electrode 2904 and the conductive layer 2913.

In FIG. 29A, by forming the pixel electrode 2914 before forming the first wire 2911, a capacitor 2920 can be formed having a structure where the gate insulating film 2905 is sandwiched between the first electrode 2904 and a second electrode 2921 formed of the same material as the pixel electrode 2914 as shown in FIG. 29B.

Each of FIGS. 29A and 29B shows an inversely staggered transistor having a channel etched structure, however, a transistor having a channel protective structure may also be employed. Description is made of a transistor having a channel protective structure with reference to FIGS. 30A and 30B.

A transistor having a channel protective structure shown in FIG. 30A is different from a driving transistor 2919 having a channel etched structure shown in FIG. 29A in that an insulating layer 3001 as a mask for etching is provided over a region where a channel of a first semiconductor layer 2906 is formed. Other common portions are denoted by the same reference numerals.

Similarly, a transistor having a channel protective structure shown in FIG. 30B is different from the driving transistor 2919 having a channel etched structure shown in FIG. 29B in that the insulating layer 3001 as a mask for etching is provided over a region where a channel of the first semiconductor layer 2906 in the driving transistor 2919 having a channel etched structure is formed. Other common portions are denoted by the same reference numerals.

By using an amorphous semiconductor film as a semiconductor layer (a channel forming region, a source region, a drain region, or the like) of a transistor which forms a pixel of this embodiment, manufacturing cost can be reduced. An amorphous semiconductor film can be applied to, for example, a pixel configuration shown in FIG. 7.

A structure of a transistor and a structure of a capacitor to which a pixel configuration of this embodiment can be applied are not limited to the aforementioned, and a transistor and a capacitor with various structures can be used.

This embodiment can be freely implemented in combination with Embodiment 1.

Embodiment 3

This embodiment describes a manufacturing method of a semiconductor device by using plasma treatment as a manufacturing method of a semiconductor device such as a transistor.

Figure 31A:
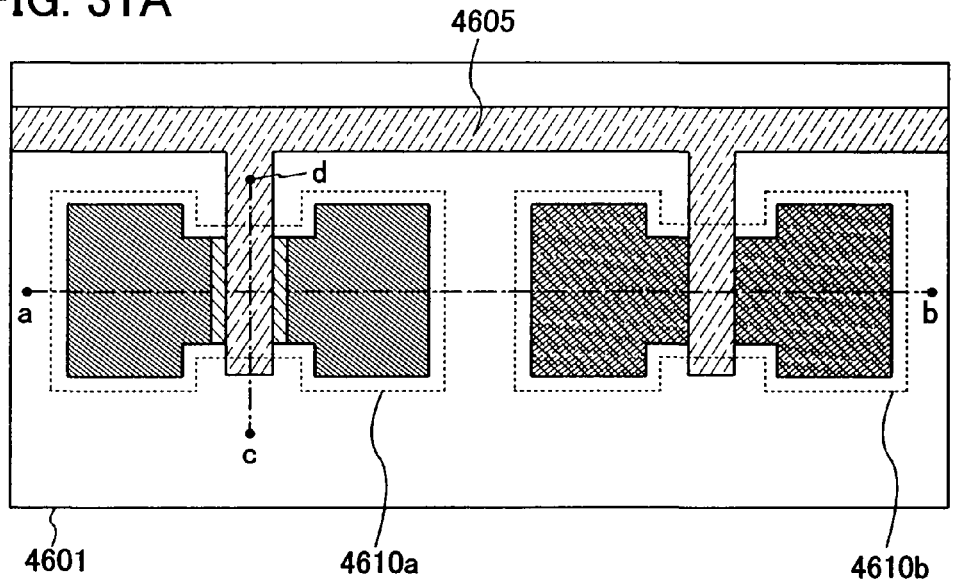
FIGS. 31A to 31C are diagrams showing Embodiment 3.
Figure 31B:
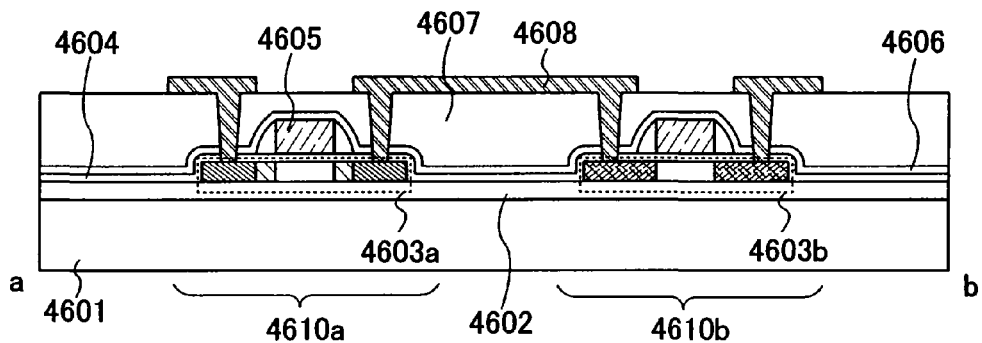
Figure 31C:
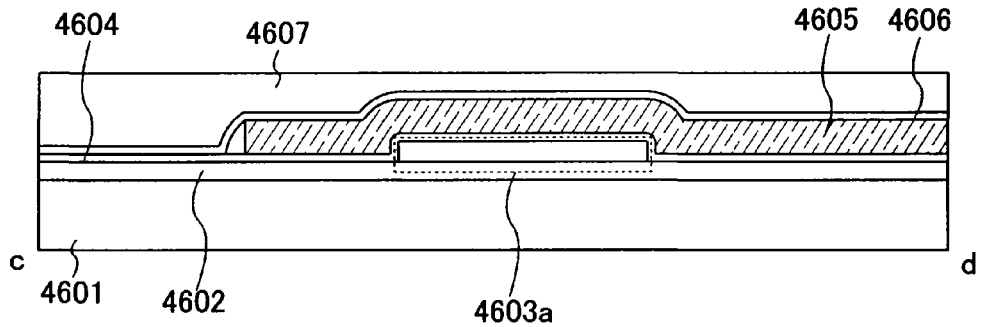

FIGS. 31A to 31C are views showing structure examples of a semiconductor device including a transistor. It is to be noted that FIG. 31B corresponds to a sectional view along a-b of FIG. 31A and FIG. 31C corresponds to a sectional view along c-d of FIG. 31A.

The semiconductor device shown in FIGS. 31A to 31C includes a first semiconductor film 4603a and a second semiconductor film 4603*b* formed over a substrate 4601 with a first insulating film 4602 interposed therebetween, a gate electrode 4605 formed over the first semiconductor film 4603*a* and the second semiconductor film 4603*b* with a gate insulating film 4604 interposed therebetween, a second insulating film 4606 and a third insulating film 4607 which cover the gate electrode, and a conductive film 4608 which is electrically connected to a source region or a drain region of the first semiconductor film 4603*a* and the second semiconductor film 4603*b* and is formed over the third insulating film 4607. It is to be noted in FIGS. 31A to 31C that an n-channel transistor 4610*a* having a portion of the first semiconductor film 4603*a* as a channel region and a p-channel transistor 4601*b* having a portion of the second semiconductor film 4603*b* as a channel region are provided, however, the invention is not limited to this structure. For example, in FIGS. 31A to 31C, an LDD region is provided in the n-channel transistor 4610*a* and is not provided in the p-channel transistor 4601*b*, however, an LDD region may be provided in both or neither of the transistors.

In this embodiment, a semiconductor film or an insulating film is oxidized or nitrided by applying plasma treatment to at least any one layer of the substrate 4601, the first insulating film 4602, the first semiconductor film 4603*a* and the second semiconductor film 4603*b*, the gate insulating film 4604, the second insulating film 4606, or the third insulating film 4607, thereby manufacturing the semiconductor device shown in FIGS. 31A to 31C. In this manner, by oxidizing or nitriding a semiconductor film or an insulating film by plasma treatment, quality of a surface of the semiconductor film or the insulating film is modified, and thus an insulating film which is denser as compared to an insulating film formed by a CVD method or a sputtering method can be formed. As a result, a defect such as a pin hole can be suppressed and characteristics of a semiconductor device and the like can be improved.

This embodiment describes a manufacturing method of a semiconductor device by applying plasma treatment to the first semiconductor film 4603*a* and the second semiconductor film 4603*b* or the gate insulating film 4604 shown in FIGS. 31A to 31C and oxidizing or nitriding the first semiconductor film 4603*a* and the second semiconductor film 4603*b* or the gate insulating film 4604 with reference to the drawings.

First, description is made of an island-shaped semiconductor film provided over a substrate, where an edge portion thereof has an almost perpendicular shape.

Figure 2:
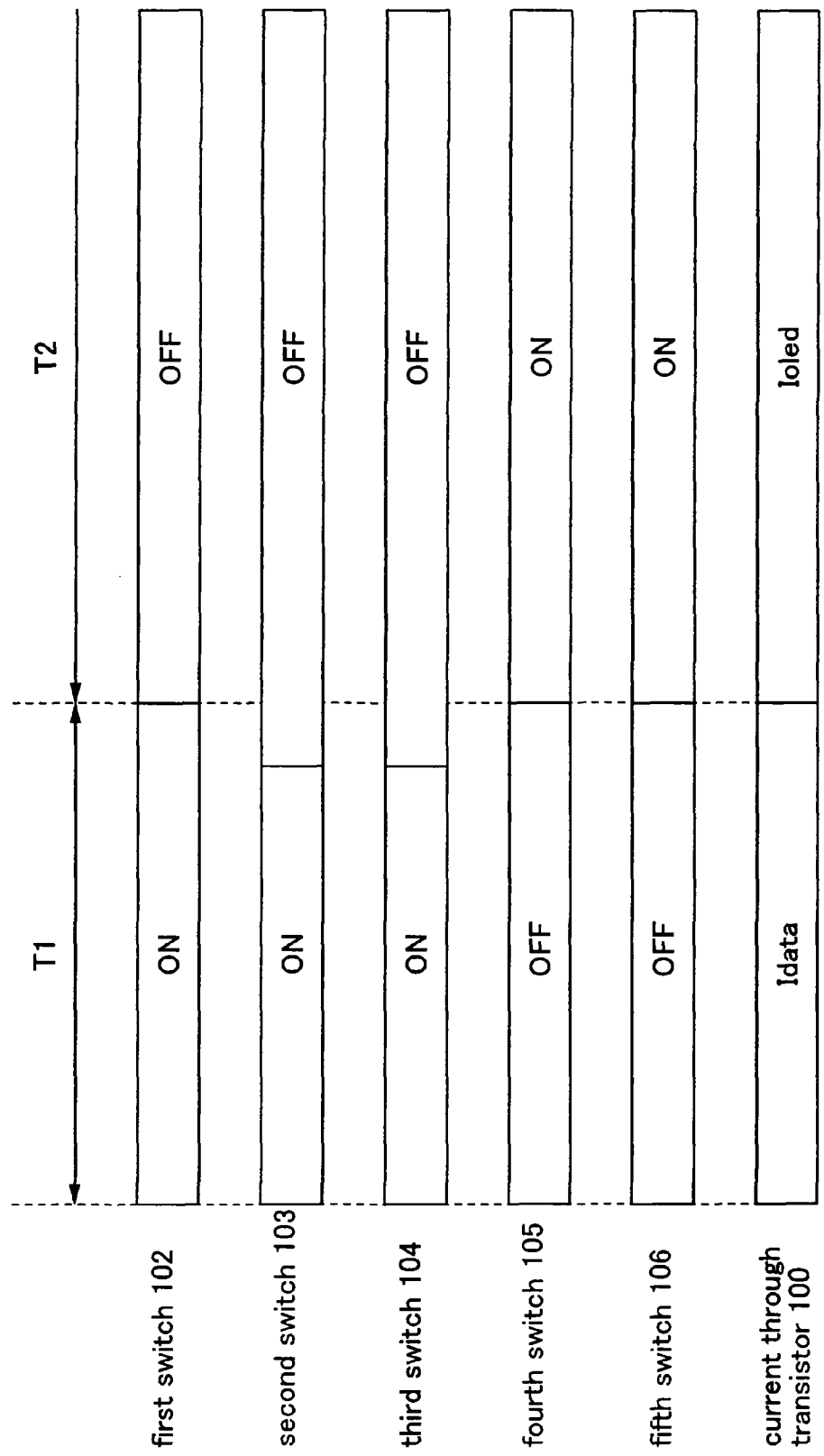
FIG. 2 is a diagram showing Embodiment Mode 1.

First, the first island-shaped semiconductor film 4603*a* and the second island-shaped semiconductor film 4603*b* are formed over the substrate 4601 (FIGS. 32A-1 and 32A-2). The first island-shaped semiconductor film 4603*a* and the second island-shaped semiconductor film 4603*b* can be formed by forming an amorphous semiconductor film using a material containing silicon (Si) as a main component (for example, $Si_xGe_{1-x}$ or the like) by a sputtering method, an LPCVD method, a plasma CVD method, or the like over a first insulating film 4602 which is formed over the substrate 4601 in advance, crystallizing the amorphous semiconductor film, and selectively etching the semiconductor film. It is to be noted that the amorphous semiconductor film can be crystallized by a crystallization method such as a laser crystallization method, a thermal crystallization method using RTA or an annealing furnace, a thermal crystallization method using a metal element which promotes crystallization, or a combination of these methods. It is to be noted in FIGS. 32A-1 and 32A-2 that edge portions of the first island-shaped semiconductor film 4603*a* and the second island-shaped semiconductor film 4603*b* are formed so as to have almost perpendicular shapes ($\theta$=85 to 100°).

Next, by oxidizing or nitriding the first semiconductor film 4603*a* and the second semiconductor film 4603*b* by plasma treatment, oxide films or a first insulating film 4621*a* and a second insulating film 4621*b* (hereinafter also referred to as a first insulating film 4621*a* and a second insulating film 4621*b*) are formed over the surfaces of the first semiconductor film 4603*a* and the second semiconductor film 4603*b* (FIG. 32B). For example, in the case where Si is used for the first semiconductor film 4603*a* and the second semiconductor film 4603*b*, silicon oxide or silicon nitride is formed as the first insulating film 4621*a* and the second insulating film 4621*b*. Further, after the first semiconductor film 4603*a* and the second semiconductor film 4603*b* are oxidized by plasma treatment, they may be nitrided by plasma treatment again. In this case, silicon oxide is formed in contact with the first semiconductor film 4603*a* and the second semiconductor film 4603*b* and silicon nitride oxide ($SiN_xO_y$) (x>y) is formed over the surface of the silicon oxide. In the case of oxidizing a semiconductor film by plasma treatment, the plasma treatment is performed in an oxygen atmosphere (for example, an atmosphere containing oxygen ($O_2$) and a rare gas (at least one of He, Ne, Ar, Kr, and Xe), an atmosphere containing oxygen, hydrogen ($H_2$), and a rare gas, or an atmosphere containing dinitrogen monoxide and a rare gas). When nitriding a semiconductor film by plasma treatment, on the other hand, plasma treatment is performed in an nitrogen atmosphere (for example, an atmosphere containing nitrogen ($N_2$) and a rare gas (containing at least one of He, Ne, Ar, Kr, and Xe), an atmosphere containing nitrogen, hydrogen, and a rare gas, or an atmosphere containing $NH_3$ and a rare gas). As the rare gas, for example, Ar can be used. Alternatively, a gas in which Ar and Kr are mixed may also be used. Therefore, the first insulating film 4621*a* and the second insulating film 4621*b* contain a rare gas (containing at least one of He, Ne, Ar, Kr, and Xe) used for plasma treatment. When Ar is used, the first insulating film 4621*a* and the second insulating film 4621*b* contain Ar.

Further, plasma treatment is performed in an atmosphere containing the aforementioned gas, with an electron density of $1\times10^{11}$ to $1\times10^{13}$ cm$^{-3}$ and an electron temperature of plasma at 0.5 to 1.5 eV. The electron density of plasma is high and the electron temperature around an object to be processed (here, the first semiconductor film 4603*a* and the second semiconductor film 4603*b*) formed over the substrate 4601 is low. Thus, plasma damages to the object to be processed can be avoided. In addition, since the electron density of plasma is $1\times10^{11}$ cm$^{-3}$ or higher, an oxide film or a nitride film formed by oxidizing or nitriding the object to be processed by the plasma treatment can be a dense film having superior evenness in film thickness as compared to a film formed by a CVD method, a sputtering method, or the like. Moreover, since the electron temperature of plasma is 1 eV or lower, the oxidation treatment or the nitriding treatment can be performed at a lower temperature than conventional plasma treatment or thermal oxidization method. For example, the oxidation treatment or the nitriding treatment can be performed sufficiently even when the plasma treatment is performed at a temperature lower than a distortion point of a glass substrate by 100° C. or more. As the frequency for producing plasma, a high frequency wave such as a microwave (2.45 GHz) can be employed. Hereinafter, the plasma treatment is performed with the above conditions unless specifically referred.

Next, the gate insulating film 4604 is formed so as to cover the first insulating film 4621*a* and the second insulating film 4621*b* (FIGS. 32C-1 and 32C-2). The gate insulating film 4604 can be formed so as to have a single layer structure or a stacked-layer structure of an insulating film containing nitrogen or oxygen such as silicon oxide, silicon nitride, silicon oxynitride ($SiO_xN_y$) (x>y), or silicon nitride oxide ($SiN_xO_y$) (x>y) by a sputtering method, an LPCVD method, a plasma CVD method, or the like. For example, when Si is used for the first semiconductor film 4603a and the second semiconductor film 4603b, and Si is oxidized by the plasma treatment, silicon oxide is formed as a gate insulating film over the first insulating film 4621a and the second insulating film 4621b. In FIGS. 32B-1 and 32B-2, when the first insulating film 4621a and the second insulating film 4621b which are formed by oxidizing or nitriding the first semiconductor film 4603a and the second semiconductor film 4603b have enough thicknesses, the first insulating film 4621a and the second insulating film 4621b can be used as gate insulating films.

Next, by forming the gate electrode 4605 or the like over the gate insulating film 4604, an n-channel transistor 4610a and a p-channel transistor 4610b which have the first island-shaped semiconductor film 4603a and the second island-shaped semiconductor film 4603b respectively as channel regions can be manufactured over the gate insulating film 4604 (FIGS. 32D-1 and 32D-2).

In this manner, by oxidizing or nitriding the surfaces of the first semiconductor film 4603a and the second semiconductor film 4603b by plasma treatment before providing the gate insulating film 4604 over the first semiconductor film 4603a and the second semiconductor film 4603b, a short-circuit between the gate electrode and the semiconductor film caused by a defect in coverage of the gate insulating film 4604 at an edge portion 4651a of a first channel region, an edge portion 4651b of a second channel region, or the like can be prevented. That is, in the case where an edge portion of an island-shaped semiconductor film has an almost perpendicular shape ($\theta$=85 to 100°), the gate insulating film may be broken and have defective coverage at the edge portion of the semiconductor film when the gate insulating film is formed so as to cover the semiconductor film by a CVD method, a sputtering method, or the like. However, by oxidizing or nitriding the semiconductor film in advance by applying plasma treatment to the surface thereof, defective coverage or the like of the gate insulating film at the edge portion of the semiconductor film can be prevented.

In FIGS. 32A-1 to D-2, the gate insulating film 4604 may be oxidized or nitrided by performing plasma treatment after forming the gate insulating film 4604. In this case, by oxidizing or nitriding the gate insulating film 4604 by applying plasma treatment to the gate insulating film 4604 (FIGS. 33A-1 and 33A-2) formed so as to cover the first semiconductor film 4603a and the second semiconductor film 4603b, an oxide film or a nitride film (hereinafter referred to as an insulating film 4623) is formed over a surface of the gate insulating film 4604 (FIGS. 33B-1 and 33B-2). The conditions for the plasma treatment can be set similar to FIGS. 32B-1 and 32B-2. Moreover, the insulating film 4623 contains a rare gas used for the plasma treatment. For example, when Ar is used, the insulating film 4623 contains Ar.

In FIGS. 33B-1 and 33B-2, after oxidizing the gate insulating film 4604 by performing plasma treatment in an oxygen atmosphere, the gate insulating film 4604 may be nitrided by performing plasma treatment in a nitrogen atmosphere again. In this case, silicon oxide or silicon oxynitride ($SiO_xN_y$) (x>y) is formed thereover in accordance with the projections and depressions of the first semiconductor film 4603a and the second semiconductor film 4603b and silicon nitride oxide ($SiN_xO_y$) (x>y) is formed in contact with the gate electrode 4605. After that, by forming the gate electrode 4605 or the like over the insulating film 4623, a semiconductor device including the n-channel transistor 4610a and the p-channel transistor 4610b which have the first island-shaped semiconductor film 4603a and the second island-shaped semiconductor film 4603b as channel regions respectively can be manufactured (FIGS. 33C-1 and 33C-2). In this manner, by applying plasma treatment to the gate insulating film to oxidize or nitride the surface of the gate insulating film, quality of the surface of the gate insulating film can be modified and a denser film can be formed. The insulating film obtained by performing the plasma treatment is denser and has less defects such as a pin hole as compared to an insulating film formed by a CVD method or a sputtering method, therefore, characteristics of a transistor can be improved.

In FIGS. 33A-1 to 33C-2, by applying plasma treatment to the first semiconductor film 4603a and the second semiconductor film 4603b in advance, the surfaces of the first semiconductor film 4603a and the second semiconductor film 4603b are oxidized or nitrided, however, plasma treatment may be applied after forming the gate insulating film 4604 without applying plasma treatment to the first semiconductor film 4603a and the second semiconductor film 4603b. In this manner, by applying plasma treatment before forming a gate electrode, the semiconductor film which is exposed by defective coverage can be oxidized or nitrided even if defective coverage is generated due to a breakage of the gate insulating film at an edge portion of the semiconductor film. Therefore, a short-circuit between the gate electrode and the semiconductor film or the like can be prevented, which is caused by the defective coverage of the gate insulating film at an edge portion of the semiconductor film.

In this manner, even when the edge portion of the island-shaped semiconductor film is formed in an almost perpendicular shape, by oxidizing or nitriding the semiconductor film or the gate insulating film by plasma treatment, a short-circuit between the gate electrode and the semiconductor film or the like can be prevented, which is caused by the defective coverage of the gate insulating film at an edge portion of the semiconductor film.

Next, description is made of the case where an edge portion of an island-shaped semiconductor film provided over a substrate is formed so as to have a tapered shape ($\theta$=30 to 85°).

First, the first island-shaped semiconductor film 4603a and the second island-shaped semiconductor film 4603b are formed over the substrate 4601 (FIGS. 34A-1 and 34A-2). As for the island-shaped semiconductor films 4603a and 4603b, an amorphous semiconductor film is formed by a sputtering method, an LPCVD method, a plasma CVD method, or the like using a material mainly containing silicon (Si) (for example, $Si_xGe_{1-x}$ or the like) over the first insulating film 4602 which is formed in advance over the substrate 4601. Then, the amorphous semiconductor film is crystallized by a crystallization method such as a laser crystallization method, a thermal crystallization method using RTA or an annealing furnace, or a thermal crystallization method using a metal element which promotes crystallization. Then, the semiconductor film is selectively etched and removed. In FIGS. 34A-1 to 34D-2, the edge portions of the island-shaped semiconductor films 4603a and 4603b are tapered ($\theta$=30 to 85°).

Next, a gate insulating film 4604 is formed so as to cover the first semiconductor film 4603a and the second semiconductor film 4603b (FIGS. 34B-1 and 34B-2). The gate insulating film 4604 can be formed in a single layer structure or a stacked-layer structure of an insulating film containing nitrogen or oxygen such as silicon oxide, silicon nitride, silicon oxynitride ($SiO_xN_y$) (x>y), or silicon nitride oxide ($SiO_xO_y$) (x>y) by a sputtering method, an LPCVD method, a plasma CVD method, or the like.

Then, the gate insulating film 4604 is oxidized or nitrided by plasma treatment, and thus, an oxide film or a nitride film (hereinafter also referred to as an insulating film 4624) is formed over the surface of the gate insulating film 4604 (FIGS. 34C-1 and 34C-2). Note that the conditions for the plasma treatment can be similar to those described above. For example, when silicon oxide or silicon oxynitride ($SiO_xN_y$) (x>y) is used as the gate insulating film 4604, plasma treatment is performed in an atmosphere containing oxygen to oxidize the gate insulating film 4604. The film obtained over the surface of the gate insulating film by the plasma treatment is denser and has less defects such as a pin hole as compared with a gate insulating film formed by a CVD method, a sputtering method, or the like. On the other hand, when plasma treatment is performed in an atmosphere containing nitrogen to nitride the gate insulating film 4604, silicon nitride oxide ($SiO_xO_y$) (x>y) can be provided as the insulating film 4624 over the surface of the gate insulating film 4604. In addition, after plasma treatment is performed in an atmosphere containing oxygen to oxidize the gate insulating film 4604, plasma treatment may be performed again in a nitrogen atmosphere to nitride the gate insulating film 4604. The insulating film 4624 contains a rare gas used in the plasma treatment. For example, when Ar is used, the insulating film 4624 contains Ar.

Next, by forming the gate electrode 4605 or the like over the gate insulating film 4604, it is possible to manufacture a semiconductor device including the n-channel transistor 4610a and the p-channel transistor 4610b each having the first island-shaped semiconductor film 4603a and the second island-shaped semiconductor film 4603b as channel regions respectively (FIGS. 34D-1 and 34D-2).

In this manner, by performing the plasma treatment to the gate insulating film, an insulating film formed of an oxide film or a nitride film is formed over the surface of the gate insulating film, and the surface of the gate insulating film can be modified in quality. The insulating film oxidized or nitrided by the plasma treatment is denser and has less defects such as a pin hole as compared to a gate insulating film formed by a CVD method or a sputtering method, and thus, the characteristics of a thin film transistor can be improved. Further, it is possible to prevent a short-circuit between the gate electrode and the semiconductor film caused by the defective coverage of the gate insulating film or the like at the edge portion of the semiconductor film by forming the edge portion of the semiconductor film into a tapered shape. However, by performing the plasma treatment after forming the gate insulating film, a short-circuit between the gate electrode and the semiconductor film, or the like can further be prevented.

A manufacturing method of a semiconductor device which is different from that in FIGS. 34A-1 to 34D-2 is described with reference to the drawings. In specific, description is made of the case where plasma treatment is selectively applied to an edge portion of a semiconductor film having a tapered shape.

First, the first island-shaped semiconductor film 4603a and the second island-shaped semiconductor film 4603b are formed over the substrate 4601 (FIGS. 35A-1 and 35A-2). As for the first island-shaped semiconductor film 4603a and the second island-shaped semiconductor film 4603b, an amorphous semiconductor film is formed using a material mainly containing silicon (Si) (e.g., $Si_xGe_{1-x}$ or the like) or the like over the first insulating film 4602 which is formed in advance over the substrate 4601 by a sputtering method, an LPCVD method, a plasma CVD method, or the like. Then, the amorphous semiconductor film is crystallized and selectively etched using a first resist 4625a and a second resist 4625b as masks. A crystallization method such as a laser crystallization method, a thermal crystallization method using RTA or an annealing furnace, a thermal crystallization method using a metal element which promotes crystallization, or a combination of the methods can be employed to crystallize the amorphous semiconductor film.

Next, before removing the first resist 4625a and the second resist 4625b used for etching the semiconductor film, plasma treatment is performed to selectively oxidize or nitride the edge portions of the first island-shaped semiconductor film 4603a and the second island-shaped semiconductor film 4603b. An oxide film or a nitride film (hereinafter, also referred to as an insulating film 4626) is formed at each edge portion of the first island-shaped semiconductor film 4603a and the second island-shaped semiconductor film 4603b (FIGS. 35B-1 and 35B-2). The plasma treatment is performed with the above conditions. In addition, the insulating film 4626 contains a rare gas used in the plasma treatment.

Then, the gate insulating film 4604 is formed so as to cover the first island-shaped semiconductor film 4603a and the second island-shaped semiconductor film 4603b (FIGS. 35C-1 and 35C-2). The gate insulating film 4604 can be formed similarly to the aforementioned.

Next, by forming the gate electrode 4605 or the like over the gate insulating film 4604, it is possible to manufacture a semiconductor device having the n-channel transistor 4610a and the p-channel transistor 4610b having the first island-shaped semiconductor film 4603a and the second island-shaped semiconductor film 4603b as channel regions respectively (FIGS. 35D-1 and 35D-2).

When the edge portions of the first island-shaped semiconductor film 4603a and the second island-shaped semiconductor film 4603b are tapered, edge portions 4652a and 4652b of the first and second channel regions formed in each part of the first island-shaped semiconductor film 4603a and the second island-shaped semiconductor film 4603b are also tapered. Thus, as the thickness of the semiconductor film or the gate insulating film varies as compared to the center portion, the characteristics of a transistor may be affected. Therefore, by selectively oxidizing or nitriding the edge portions of the channel regions by the plasma treatment, an insulating film is formed in the semiconductor film which becomes the edge portions of the channel region. Thus, the effect on the transistor due to the edge portions of the channel region can be reduced.

FIGS. 35A-1 to 35D-2 show an example where the plasma treatment is applied to only the edge portions of the first island-shaped semiconductor film 4603a and the second island-shaped semiconductor film 4603b to be oxidized or nitrided. It is needless to say, however, that the plasma treatment can also be applied to the gate insulating film 4604 to be oxidized or nitrided (FIGS. 36A-1 and 36A-2).

Next, a manufacturing method of a semiconductor device which is different from the aforementioned is described with reference to the drawings. In specific, plasma treatment is applied to a semiconductor film having a tapered shape.

First, the first island-shaped semiconductor film 4603a and the second island-shaped semiconductor film 4603b are formed over the substrate 4601 similarly to the aforementioned (FIGS. 36A-1 and 36A-2).

Next, plasma treatment is applied to the first island-shaped semiconductor film 4603a and the second island-shaped semiconductor film 4603b to oxidize or nitride the first island-shaped semiconductor film 4603a and the second island-shaped semiconductor film 4603b, thereby oxide films or nitride films (hereinafter, also referred to as a first insulating film 4627a and a second insulating film 4627b) are formed (FIGS. 36B-1 and 36B-2). The plasma treatment can be similarly performed with the above conditions. For example, when Si is used for the first island-shaped semiconductor film 4603a and the second island-shaped semiconductor film 4603b, silicon oxide or silicon nitride is formed as the first insulating film 4627a and the second insulating film 4627b. In addition, after oxidizing the first island-shaped semiconductor film 4603a and the second island-shaped semiconductor film 4603b by plasma treatment, plasma treatment may be performed again to nitride the first island-shaped semiconductor film 4603a and the second island-shaped semiconductor film 4603b. In this case, silicon oxide or silicon oxynitride ($SiO_xN_y$) (x>y) is formed in contact with the first island-shaped semiconductor film 4603a and the second island-shaped semiconductor film 4603b, and silicon nitride oxide ($SiO_xO_y$) (x>y) is formed over the surface of the silicon oxide. Therefore, the first insulating film 4627a and the second insulating film 4627b contain a rare gas used for the plasma treatment. By the plasma treatment, the edge portions of the first island-shaped semiconductor film 4603a and the second island-shaped semiconductor film 4603b are oxidized or nitrided at the same time.

Then, a gate insulating film 4604 is formed so as to cover the first insulating film 4627a and the second insulating film 4627b (FIGS. 36C-1 and 36C-2). As the gate insulating film 4604, a single layer structure or a stacked-layer structure of an insulating film containing nitrogen or oxygen such as silicon oxide, silicon nitride, silicon oxynitride ($SiO_xN_y$) (x>y), or silicon nitride oxide ($SiO_xO_y$) (x>y) can be used by a sputtering method, an LPCVD method, a plasma CVD method, or the like. For example, in a case where the first island-shaped semiconductor film 4603a and the second island-shaped semiconductor film 4603b using Si are oxidized by plasma treatment to form silicon oxide as the first insulating film 4627a and the second insulating film 4627b over the surfaces of the first island-shaped semiconductor film 4603a and the second island-shaped semiconductor film 4603b, silicon oxide is formed as the gate insulating film over the first insulating film 4627a and the second insulating film 4627b.

Next, by forming the gate electrode 4605 or the like over the gate insulating film 4604, a semiconductor device including the n-channel transistor 4610a and the p-channel transistor 4610b each having the first island-shaped semiconductor film 4603a and the second island-shaped semiconductor film 4603b as channel regions respectively can be manufactured (FIGS. 36D-1 and 36D-2).

When edge portions of a semiconductor film are formed into tapered shapes, an edge portion of a channel region formed in a part of the semiconductor film becomes a tapered shape, which may affect the characteristics of a semiconductor element. Therefore, by oxidizing or nitriding the semiconductor film by plasma treatment, an edge portion of a channel region is oxidized or nitrided, which can reduce an effect to a semiconductor element.

FIGS. 36A-1 to 36D-2 show an example where the plasma treatment is applied to only the first island-shaped semiconductor film 4603a and the second island-shaped semiconductor film 4603b to be oxidized or nitrided. It is needless to say, however, the plasma treatment can also be applied to the gate insulating film 4604 to be oxidized or nitrided (FIGS. 36B-1 and 36B-2). In this case, the gate insulating film 4604 may be oxidized by plasma treatment in an oxygen atmosphere and then nitrided by plasma treatment in a nitrogen atmosphere again. Thus, silicon oxide or silicon oxynitride ($SiO_xN_y$) (x>y) is formed thereover in accordance with the projections and depressions of the first island-shaped semiconductor film 4603a and the second island-shaped semiconductor film 4603b and silicon nitride oxide ($SiO_xO_y$) (x>y) is formed in contact with the gate electrode 4605.

In this manner, by modifying the semiconductor film or the gate insulating film in quality by oxidization or nitridation using plasma treatment, a dense and favorable insulating film can be formed. As a result, a defect such as a pin hole can be prevented even when an insulating film is formed thin, thereby a minute and high functional semiconductor element such as a transistor can be realized.

It is to be noted in this embodiment that plasma treatment is applied to the first island-shaped semiconductor film 4603a, the second island-shaped semiconductor film 4603b, or the gate insulating film 4604 in FIGS. 31A to 31C so as to oxidize or nitride the first island-shaped semiconductor film 4603a, the second island-shaped semiconductor film 4603b, or the gate insulating film 4604, however, a layer to be oxidized or nitrided by plasma treatment is not limited to these. For example, plasma treatment may be applied to the substrate 4601 or the first insulating film 4602, or to the second insulating film 4606 or the third insulating film 4607.

This embodiment can be freely implemented in combination with Embodiment 1 or 2.

Embodiment 4

In this embodiment, an example of a mask pattern for manufacturing a semiconductor device such as a transistor is described with reference to FIGS. 38A to 40B.

A first semiconductor layer 5610 and a second semiconductor layer 5611 are preferably formed of a crystalline semiconductor formed of silicon or containing silicon. For example, polycrystal silicon, single crystal silicon, or the like, which is obtained by crystallizing a silicon film by laser annealing or the like is used. Besides, a metal oxide semiconductor, amorphous silicon, or an organic semiconductor, which exhibits semiconductor characteristics can also be applied.

In any case, a semiconductor layer to be formed first is formed over an entire surface or a part of a substrate having an insulating surface (a region having a wider area than that is used as a semiconductor region of a transistor). Then, a mask pattern is formed over the semiconductor layer by photolithography. By etching the semiconductor layer utilizing the mask pattern, the first semiconductor layer 5610 and the second semiconductor layer 5611 which are in island-shapes are formed so as to include a source region, a drain region, and a channel forming region of a transistor. The first semiconductor layer 5610 and the second semiconductor layer 5611 are determined in consideration of the layout.

Figure 38A:
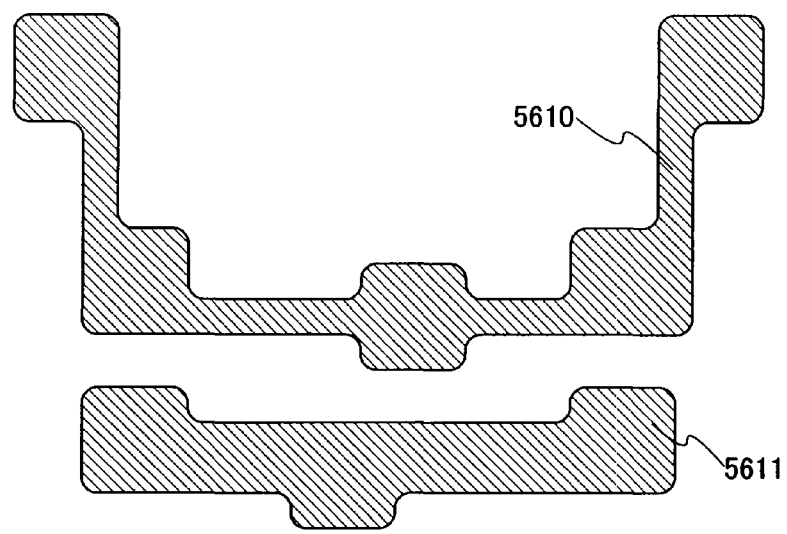
FIGS. 38A and 38B are diagrams showing Embodiment 5.
Figure 38B:
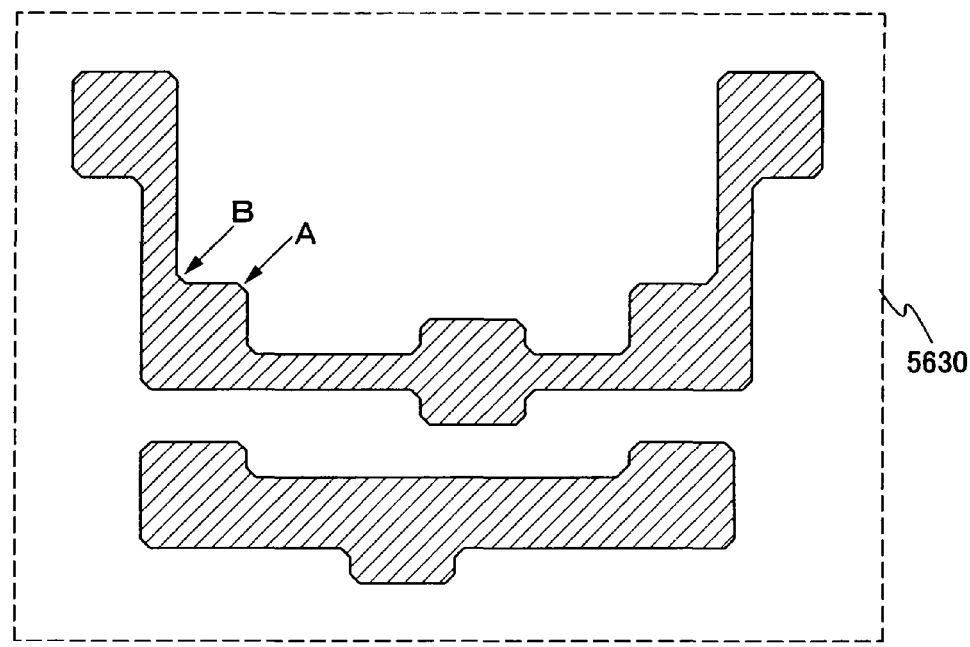

A photo mask for forming the first semiconductor layer 5610 and the second semiconductor layer 5611 shown in FIG. 38A are provided with a mask pattern 5630 shown in FIG. 38B. The mask pattern 5630 differs depending on whether a resist used for photolithography is a positive type or a negative type. In the case of using a positive type resist, the mask pattern 5630 shown in FIG. 38B is manufactured as a light shielding portion. The mask pattern 5630 has a shape where a top portion A of a polygon is removed. Further, a crooked portion B has a shape which is crooked by a plurality of steps so that the corner does not have a right angle. In the pattern of this photo mask, for example, a corner portion of the pattern (right angle triangle) is removed so that one side of the right angle triangle becomes 10 μm or shorter.

The shape of the mask pattern 5630 shown in FIG. 38B is reflected to the first semiconductor layer 5610 and the second semiconductor layer 5611 shown in FIG. 38A. In that case, a similar shape to the mask pattern 5630 may be transferred, however, corner portions of the mask pattern 5630 may have further round shapes. That is, a round portion where a pattern shape is further smoothed than the mask pattern 5630 may be provided.

Figure 39A:
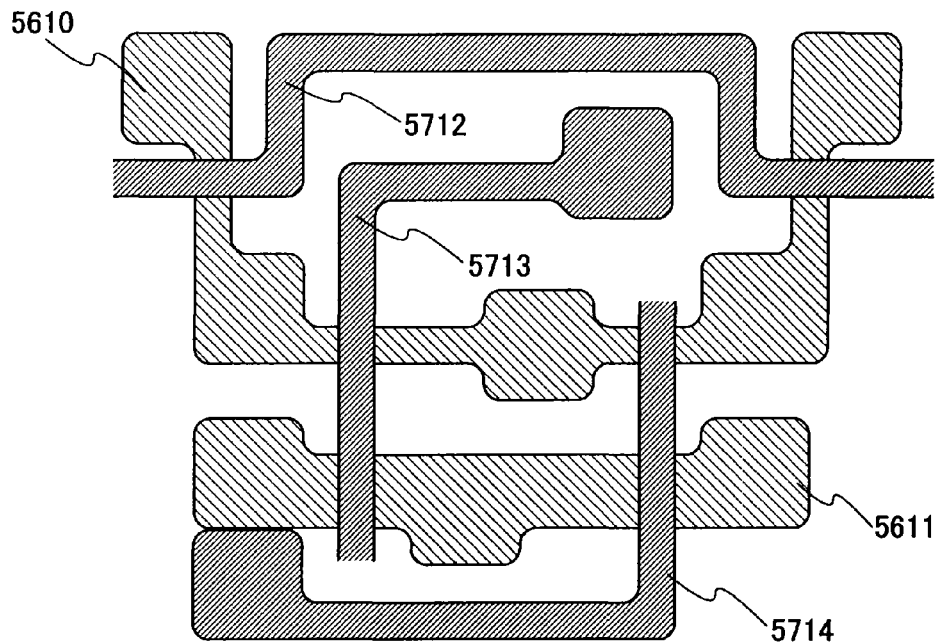
FIGS. 39A and 39B are diagrams showing Embodiment 5.

An insulating layer containing silicon oxide or silicon nitride at least in a portion is formed over the first semiconductor layer 5610 and the second semiconductor layer 5611. One of the functions of this insulating layer is as a gate insulating layer. As shown in FIG. 39A, a first gate wire 5712, a second gate wire 5713, and a third gate wire 5714 are formed so as to partially overlap the semiconductor layer. The first gate wire 5712 is formed corresponding to the first semiconductor layer 5610. The second gate wire 5713 is formed corresponding to the first semiconductor layer 5610 and the second semiconductor layer 5611. Further, the third gate wire 5714 is formed corresponding to the first semiconductor layer 5610 and the second semiconductor layer 5611. The gate wire is formed by forming a metal layer or a highly conductive semiconductor layer and patterning the layer by photolithography over the insulating layer.

Figure 39B:
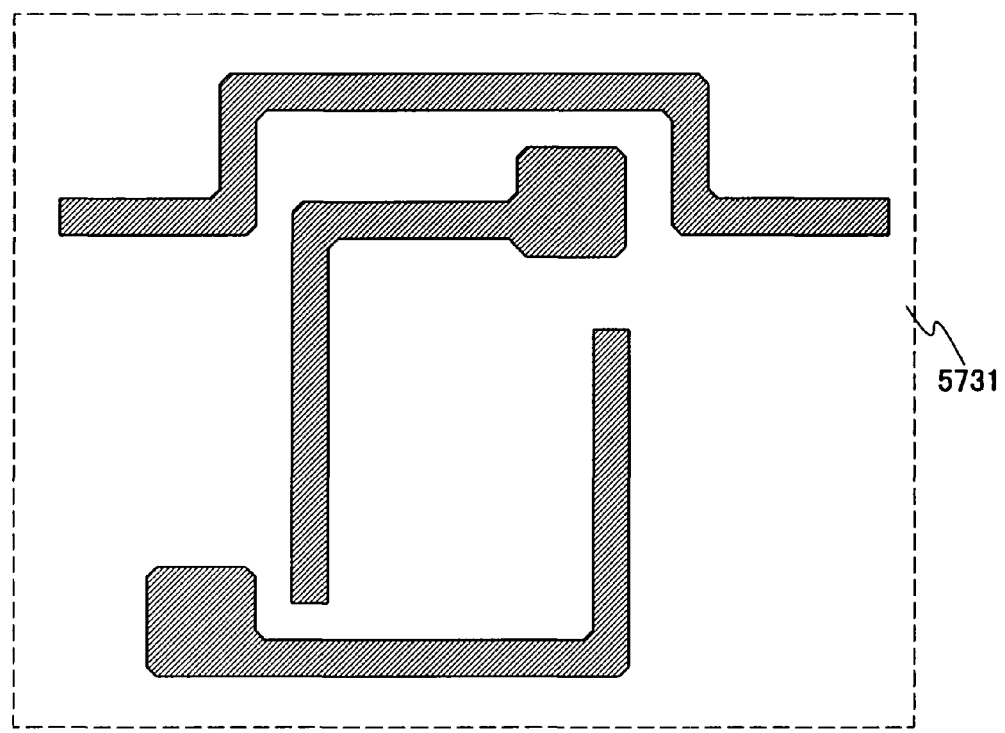

The photo mask for forming the gate wires is provided with a mask pattern 5731 shown in FIG. 39B. The mask pattern 5731 has a pattern where a corner portion that is a right triangle bent into an L shape is removed so that one side of the triangle is 10 μm or shorter, or equal to or longer than one-fifth the line width of the wire and equal to or shorter than half the line width of the wire, thereby the corner portion is rounded. That is to say, the circumference of the wiring layer in the corner portion is curved when seen from above. The shape of the mask pattern 5731 shown in FIG. 39B is reflected to the first gate wire 5712, the second gate wire 5713, and the third gate wire 5714 shown in FIG. 39A. In that case, a similar shape to the mask pattern 5731 may be transferred, however, corner portions of the mask pattern 5731 may have further round shapes. That is, a round portion where a pattern shape is further smoothed than the mask pattern 5731 may be provided. That is, in corner portions of the first gate wire 5712, the second gate wire 5713, and the third gate wire 5714, in order to form a round circumference of the corner portion, a part of the wiring layer is removed, which corresponds to an isosceles right triangle having two first straight lines that are perpendicular to each other making the corner, and a second straight line that makes an angle of about 45 degrees with the two first straight lines. When removing the triangle, two obtuse angles are formed in the wiring layer. At this time, the wiring layer is preferably etched by appropriately adjusting the etching conditions and/or a mask design so that a rounded line in contact with the first straight line and the second straight line is formed in each obtuse angle part. Note that the length of the two sides of the isosceles right triangle, which are equal to each other, is equal to or longer than one-fifth of the width of the wire and equal to or shorter than half the width of the wire. In addition, the inner circumference of the corner portion is also formed to be rounded in accordance with the circumference of the corner portion. A projecting portion has an effect to suppress generation of fine powder due to abnormal discharge when dry-etching by plasma and a depression portion has an effect to wash away fine powder when cleaning the substrate, which easily gathers at the corner. As a result, the yield is expected to be remarkably improved.

An interlayer insulating layer is formed after the first gate wire 5712, the second gate wire 5713, and the third gate wire 5714 are formed. The interlayer insulating layer is formed of an inorganic insulating material such as silicon oxide or an organic insulating material using polyimide, an acrylic resin, or the like. An insulating layer such as silicon nitride or silicon nitride oxide may be interposed between the interlayer insulating layer, the first gate wire 5712, the second gate wire 5713, and the third gate wire 5714. Moreover, an insulating layer formed of silicon nitride or silicon nitride oxide may be provided over the interlayer insulating layer as well. This insulating layer can prevent the semiconductor layer or the gate insulating layer from contamination by an impurity such as an exogenous metal ion or moisture which is not favorable for a transistor.

Figure 40A:
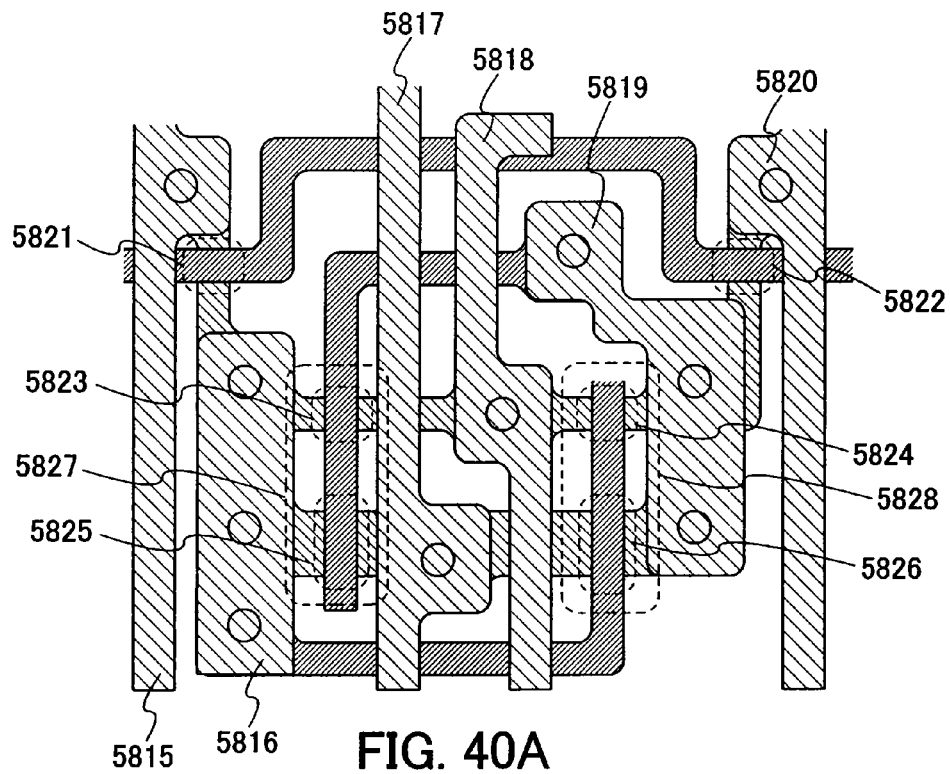
FIGS. 40A and 40B are diagrams showing Embodiment 5.

An interlayer insulating layer has an opening at a predetermined position. For example, an opening is provided so as to correspond to a gate wire or a semiconductor layer formed below. A wiring layer formed of a single layer or a plurality of layers of a metal or a metal compound is patterned into a predetermined pattern by etching with a mask pattern formed by photolithography. Then, as shown in FIG. 40A, a first wire 5815 to a fourth wire 5820 are formed so as to partially overlap the semiconductor layer. The wires connect between specific elements. The wires do not connect between specific elements linearly, but in a crooked manner due to the restriction of layout. Moreover, a width of the wire changes in a contact portion or other regions. In the contact portion, when a contact hole is as large as a width of a wire or larger, the width of the wire is changed so as to expand in that portion.

Figure 40B:
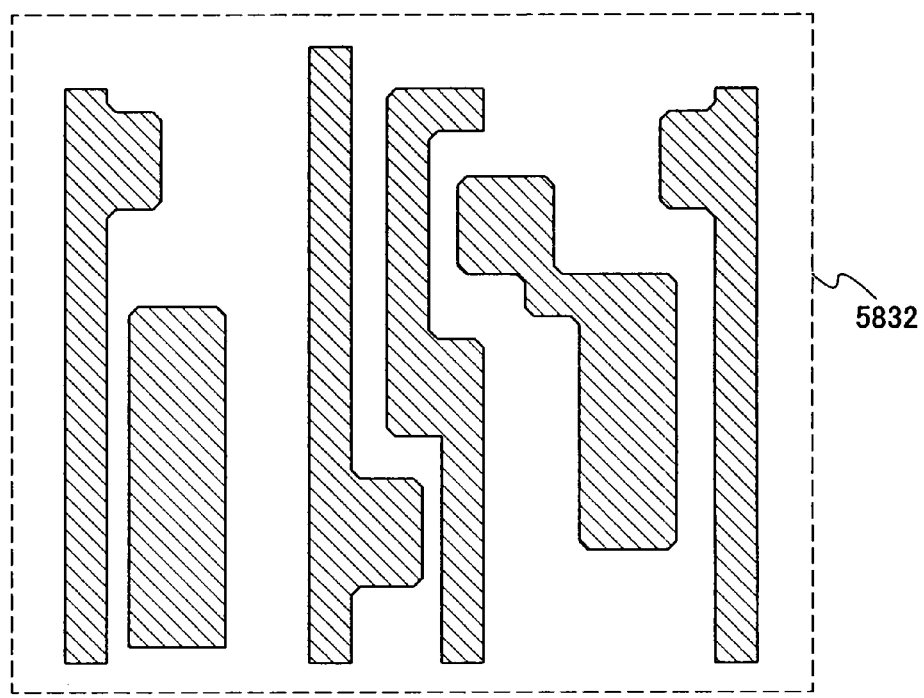

A photo mask for forming the first wire 5815 to the fourth wire 5820 is provided with a mask pattern 5832 shown in FIG. 40B. In this case also, the mask pattern 5832 has a pattern where a corner portion that is a right triangle bent into an L shape is removed so that one side of the triangle is 10 μm or shorter, or equal to or longer than one-fifth the line width of the wire and equal to or shorter than half the line width of the wire, thereby the corner portion is rounded. That is to say, the circumference of the wiring layer in the corner portion is curved when seen from above. That is, in order to form a round circumference of the corner portion, a part of the mask pattern 5832 is removed, which corresponds to an isosceles right triangle having two first straight lines that are perpendicular to each other making the corner, and a second straight line that makes an angle of about 45 degrees with the two first straight lines. When removing the triangle, two obtuse angles are formed in the wiring layer. At this time, the wiring layer is preferably etched by appropriately adjusting the etching conditions and/or a mask design so that a rounded line in contact with the first straight line and the second straight line is formed in each obtuse angle part. Note that the length of the two sides of the isosceles right triangle, which are equal to each other, is equal to or longer than one-fifth of the width of the wire and equal to or shorter than half the width of the wire. In addition, the inner circumference of the corner portion is also formed to be rounded in accordance with the circumference of the corner portion. A projecting portion has an effect to suppress generation of fine powder due to abnormal discharge when dry-etching by plasma and a depression portion has an effect to wash away fine powder when cleaning the substrate which easily gathers at the corner. As a result, the yield is expected to be remarkably improved. When a corner portion of a wire is rounded, more efficient electrical conduction is also expected. Further, it is quite convenient to wash dusts away in a plurality of parallel wires.

FIG. 40A shows a first n-channel transistor 5821 to a fourth n-channel transistor 5824, a first p-channel transistor 5825, and a second p-channel transistor 5826. The third n-channel transistor 5823 and the first p-channel transistor 5825 constitute a first inverter 5827 while the fourth n-channel transistor 5824 and the second p-channel transistor 5826 constitute a second inverter 5828. It is to be noted that a circuit including these six transistors constitutes an SRAM. An insulating layer formed of silicon nitride, silicon oxide, or the like may be formed over these transistors.

This embodiment can be freely implemented in combination with Embodiments 1 to 3.

Embodiment 5

Figure 25A:
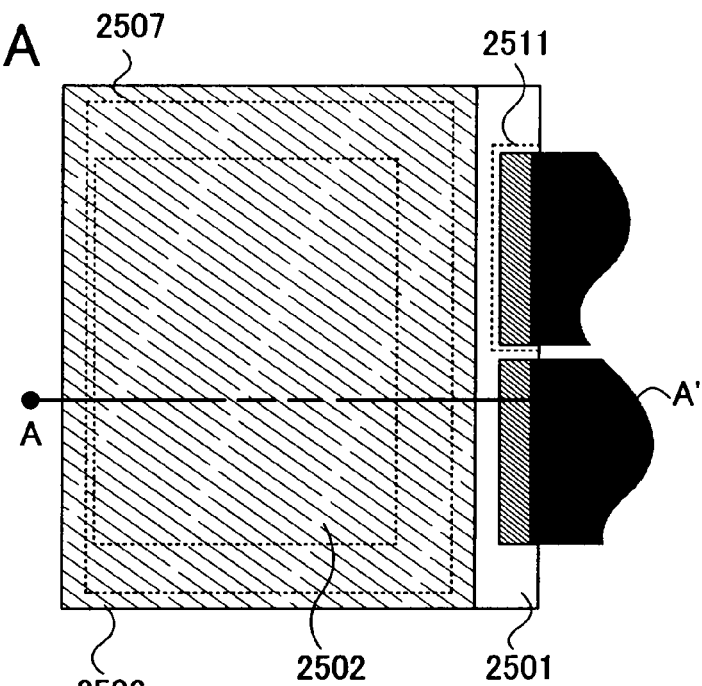
FIGS. 25A to 25C are diagrams showing Embodiment 5.
Figure 25B:
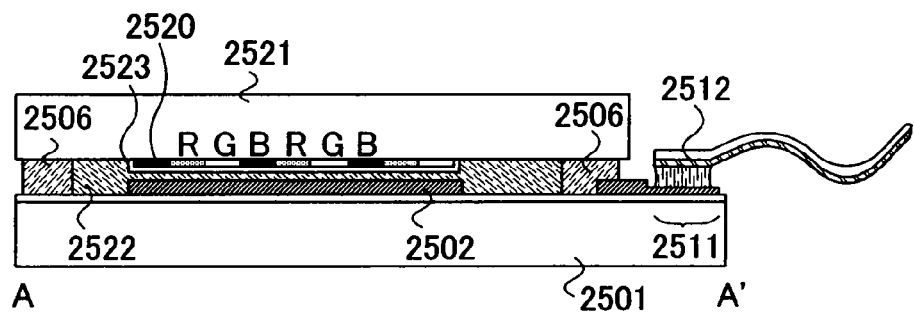
Figure 25C:
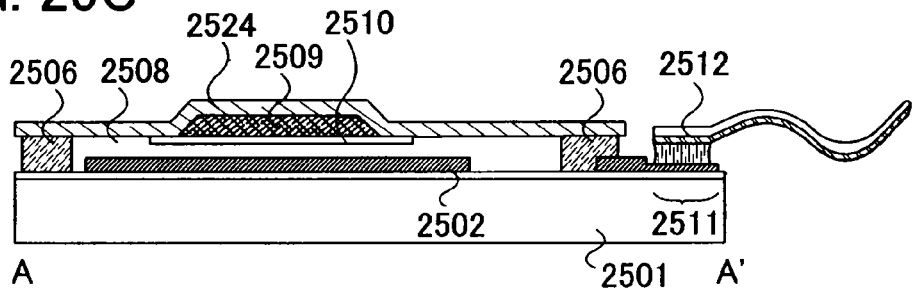

In this embodiment, a structure where a substrate where pixels are formed is sealed is described with reference to FIGS. 25A to 25C. FIG. 25A is a top plan view of a panel formed by sealing a substrate where pixel are formed. FIGS. 25B and 25C are sectional views along A-A' in FIG. 25A. Substrates shown in FIGS. 25B and 25C are sealed by different methods.

In FIGS. 25A to 25C, a pixel portion 2502 including a plurality of pixels is provided over a substrate 2501 and a sealant 2506 is provided so as to surround the pixel portion 2502, and a sealing material 2507 is attached thereto. For a pixel structure, the structure described in embodiment modes or Embodiment 1 can be used.

In a panel shown in FIG. 25B, the sealing material 2507 shown in FIG. 25A corresponds to a counter substrate 2521. The counter substrate 2521 which is transparent is attached by using the sealant 2506 as an adhesive layer, thereby a sealed space 2522 is formed by the substrate 2501, the counter substrate 2521, and the sealant 2506. The counter substrate 2521 is provided with a color filter 2520 and a protective film 2523 for protecting the color filter. Light emitted from a light emitting element provided in the pixel portion 2502 is discharged outside through the color filter 2520. The sealed space 2522 is filled with an inert resin, liquid, or the like. It is to be noted that a resin having a light transmitting property, where a moisture absorbing material is dispersed, may be used as the resin to be filled in the sealed space 2522. Further, by using the same material for the sealant 2506 and a material to be filled in the sealed space 2522, the counter substrate 2521 may be attached and the pixel portion 2502 may be sealed at the same time.

In a display panel shown in FIG. 25C, the sealing material 2507 shown in FIG. 25A corresponds to a sealing material 2524. By using the sealant 2506 as an adhesive layer, the sealing material 2524 is attached, thereby a sealed space 2508 is formed by the substrate 2501, the sealant 2506, and the sealing material 2524. A moisture absorbing agent 2509 is provided in a depression portion of the sealing material 2524 in advance, for keeping a clean atmosphere by adsorbing moisture, oxygen, and the like in the sealed space 2508 to suppress deterioration of a light emitting element. This depression portion is covered with a fine mesh type cover material 2510. The cover material 2510 passes through air and moisture, but the moisture absorbing agent 2509 does not. It is to be noted that the sealed space 2508 may be filled with a rare gas such as nitrogen or argon, or may be filled with an inert resin or liquid.

An input terminal portion 2511 for transmitting signals to the pixel portion 2502 or the like is provided over the substrate 2501. Signals such as video signals are transmitted to the input terminal portion 2511 through a flexible printed circuit (FPC) 2512. In the input terminal portion 2511, a wire formed over the substrate 2501 and a wire provided in the flexible printed circuit (FPC) 2512 are electrically connected by using a resin where conductors are dispersed (Anisotropic Conductive Film (ACF)).

A driver circuit for inputting signals to the pixel portion 2502 may be integrated over the substrate 2501 where the pixel portion 2502 is formed. The driver circuit for inputting signals to the pixel portion 2502 may be formed into an IC chip, which may then be connected onto the substrate 2501 by COG (Chip On Glass) or the IC chip may be provided over the substrate 2501 by TAB (Tape Auto Bonding) or using a printed board.

This embodiment can be freely implemented in combination with Embodiments 1 to 4.

Embodiment 6

The invention can be applied to a display module incorporating a circuit for inputting signals to a panel.

Figure 26:
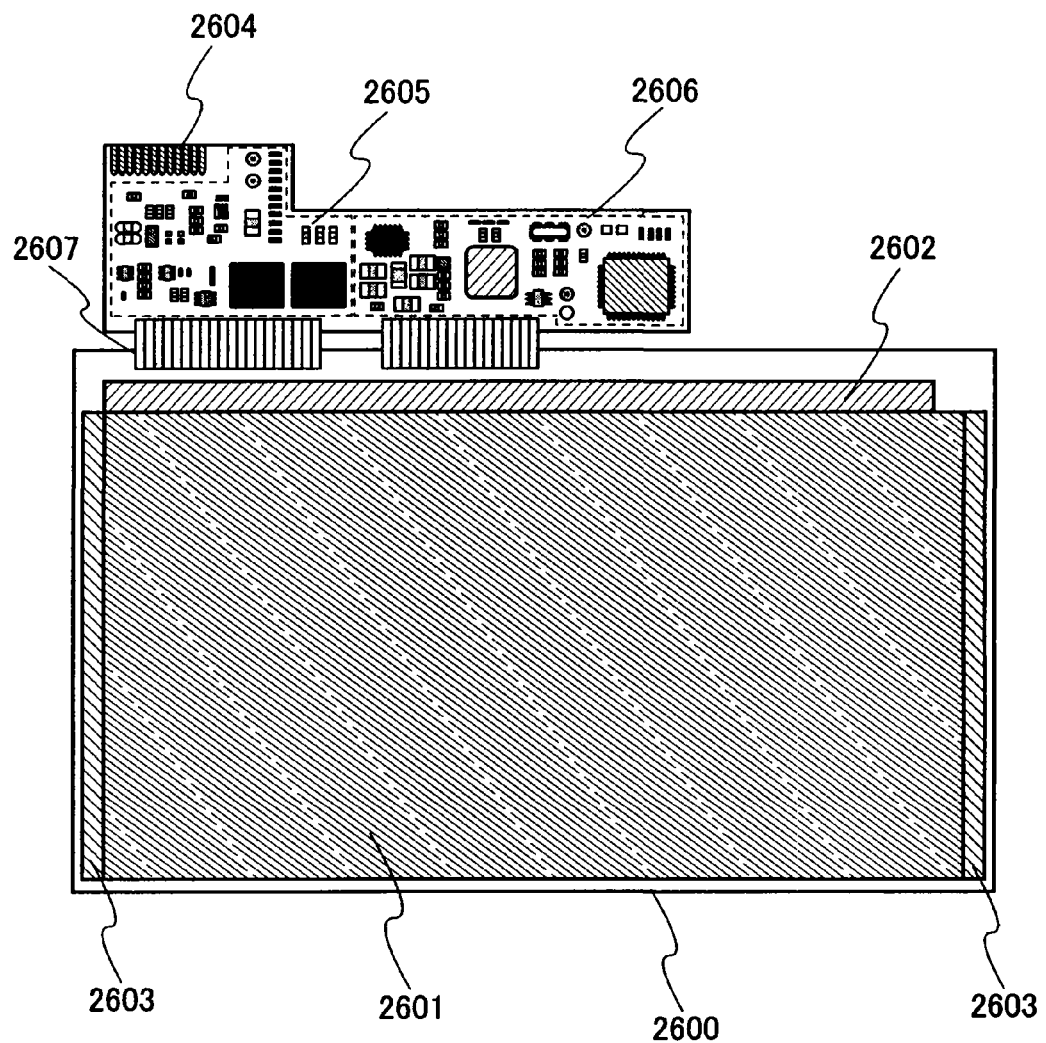
FIG. 26 is a diagram showing Embodiment 6.

FIG. 26 shows a display module where a panel 2600 and a circuit substrate 2604 are combined. In FIG. 26, a controller 2605, a signal divider circuit 2606, and the like are formed over the circuit substrate 2604 as an example, however, circuits formed over the circuit substrate 2604 are not limited to these and any circuit which generates a signal for controlling the panel may be provided.

Signals outputted from these circuits formed over the circuit substrate 2604 are inputted to the panel 2600 by a connecting wire 2607.

The panel 2600 includes a pixel portion 2601, a source driver 2602, and a gate driver 2603. A configuration of the panel 2600 can be similar to that described in Embodiment 1, 2, or the like. In FIG. 26, the source driver 2602 and the gate driver 2603 are formed over the same substrate with the pixel portion 2601, however, a display module of the invention is not limited to this configuration. Only the gate driver 2603 may be formed over the same substrate with the pixel portion 2601 and the source driver may be formed over the circuit substrate. Alternatively, both the source driver and the gate driver may be formed over the circuit substrate.

By incorporating such a display module, display portions of various electronic devices can be formed.

This embodiment can be freely implemented in combination with Embodiments 1 to 5.

Embodiment Mode 7

In this embodiment, electronic devices to which the invention can be applied are described. The electronic devices include a camera (a video camera, a digital camera, and the like), a projector, a head mounted display (a goggle type display), a navigation system, a car stereo, a personal computer, a game machine, a portable information terminal (a mobile computer, a portable phone, an electronic book, or the like), an image reproducing device provided with a recording medium (specifically, a device which reproduces a memory medium such as a DVD (Digital Versatile Disc) and has a display capable of displaying the reproduced image), and the like. Typical examples of the electronic devices are shown in FIGS. 27A to 27D.

Figure 27A:
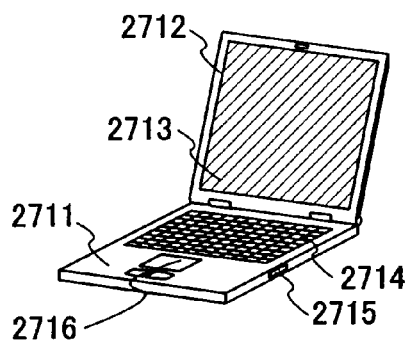
FIGS. 27A to 27D are diagrams showing Embodiment 7.

FIG. 27A illustrates a personal computer including a main body 2711, a housing 2712, a display portion 2713, a keyboard 2714, an external connection port 2715, a pointing mouse 2716, and the like. The invention is applied to the display portion 2713. By using the invention, power consumption of the display portion can be reduced.

Figure 27B:
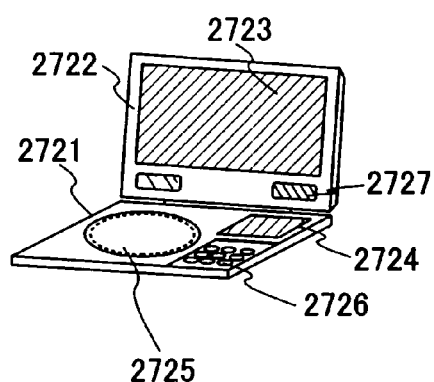

FIG. 27B illustrates an image reproducing device provided with a recording medium (specifically a DVD reproducing device), including a main body 2721, a housing 2722, a first display portion 2723, a second display portion 2724, a recording medium reading portion 2725 (DVD or the like), an operating key 2726, a speaker portion 2727, and the like. The first display portion 2723 mainly displays image data while the second display portion 2724 mainly displays text data.

The invention is applied to the first display portion 2723 and the second display portion 2724. By using the invention, power consumption of the display portion can be reduced.

Figure 27C:
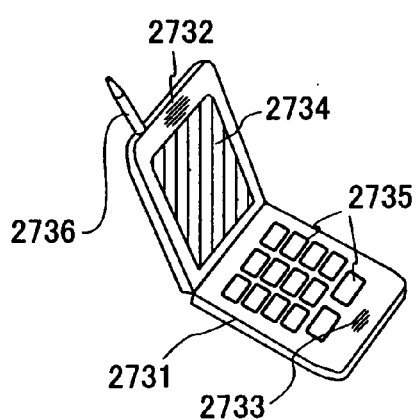

FIG. 27C illustrates a portable phone including a main body 2731, an audio output portion 2732, an audio input portion 2733, a display portion 2734, operating switches 2735, an antenna 2736, and the like. The invention is applied to the display portion 2734. By using the invention, power consumption of the display portion can be reduced.

Figure 27D:
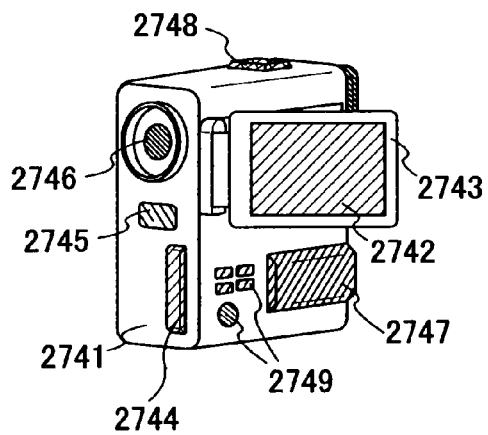

FIG. 27D illustrates a camera including a main body 2741, a display portion 2742, a housing 2743, an external connection port 2744, a remote control receiving portion 2745, an image receiving portion 2746, a battery 2747, an audio input portion 2748, operating keys 2749, and the like. The invention is applied to the display portion 2742. By using the invention, power consumption of the display portion can be reduced.

This embodiment can be freely implemented in combination with Embodiments 1 to 6.

Embodiment 8

This embodiment describes application examples of a display panel having a display portion including a display device using a pixel structure of the invention with reference to application modes shown in the drawings. A display panel having a display portion including a display device using a pixel structure of the invention can be integrated with a transport, a structure, and the like.

Figure 47A:
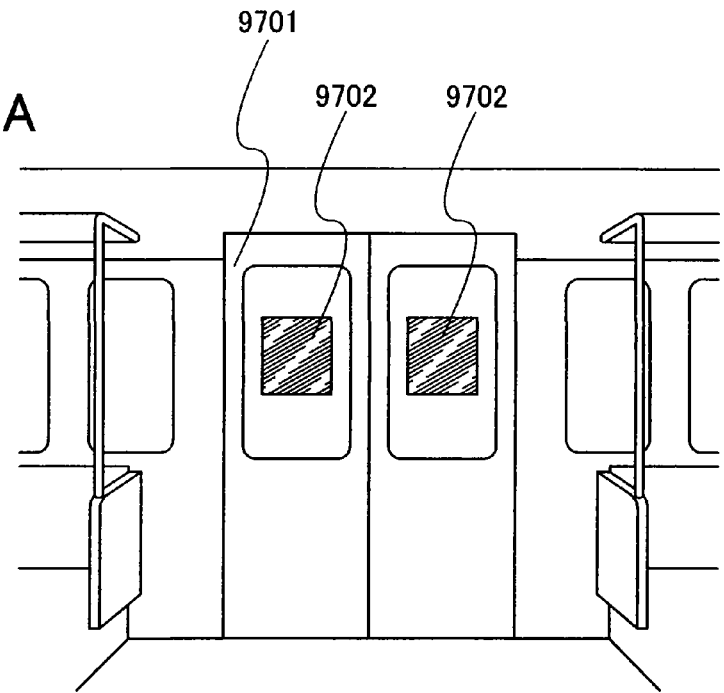
FIGS. 47A and 47B are diagrams showing Embodiment 8.
Figure 47B:
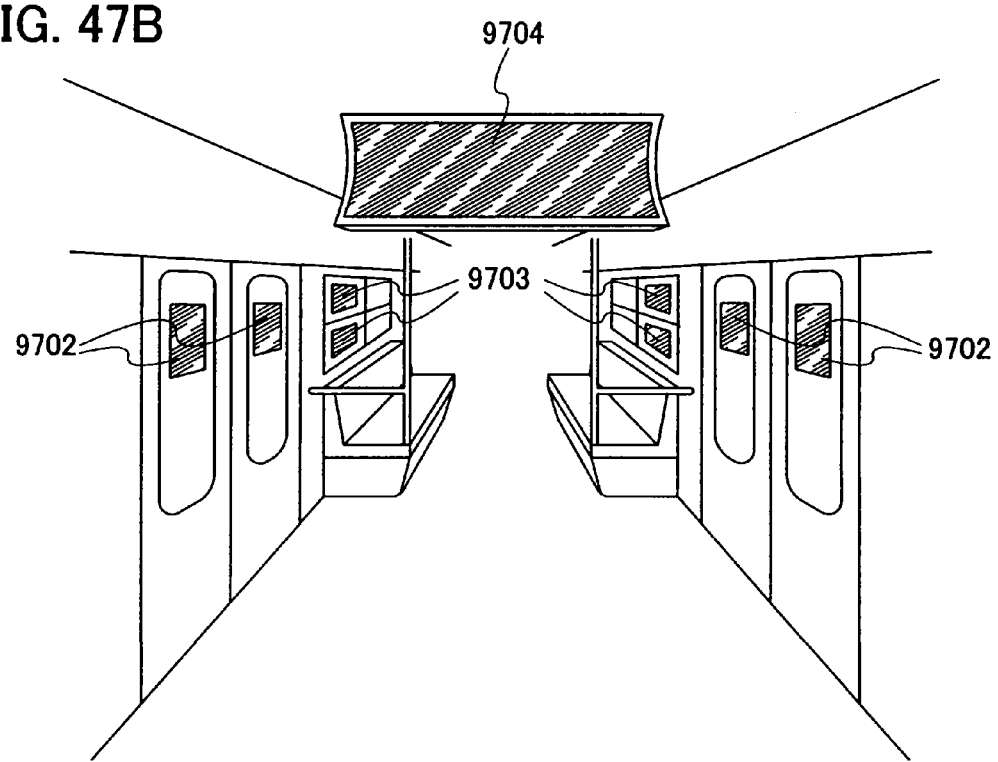

FIGS. 47A and 47B show examples of a display device integrated transport as an example of a display panel having a display portion including a display device using a pixel structure of the invention. FIG. 47A shows an example where display panels 9702 are used for glass of doors in a train car body 9701 as an example of a display device integrated transport. In the display panels 9702 each having a display portion including a display device using a pixel structure of the invention, an image displayed in the display portion can be easily changed by external signals. Therefore, an image of the display panel can be changed depending on the time when the kind of passengers of a train changes, which is expected to provide a more effective advertising effect.

It is to be noted that a display panel having a display portion including a display device using a pixel structure of the invention is not limited to be capable of being applied to glass of a door in a train car body shown in FIG. 47A, and can be applied to various places by changing the shape thereof. FIG. 47B shows an example thereof.

FIG. 47B illustrates the interior of the train car body. In FIG. 47B, first display panels 9703 provided on glass windows and a second display panel 9704 hung from a ceiling are shown in addition to the display panels 9702 used for the glass of doors shown in FIG. 47A. The first display panel 9703 having a pixel structure of the invention is provided with a light emitting display element. Therefore, it displays an image for advertisement when the train car is crowded with people while it does not perform display when the train car is not crowded, thereby an outside scenery can be seen from the train car. Further, in the second display panel 9704 having a pixel structure of the invention, by providing a switching element such as an organic transistor over a film type substrate to drive a self-light emitting type display element, a display panel itself can be bent and perform display.

Another application example of a display device integrated transport using a display panel having a display portion including a display device using a pixel structure of the invention is described with reference to FIG. 49.

Figure 49:
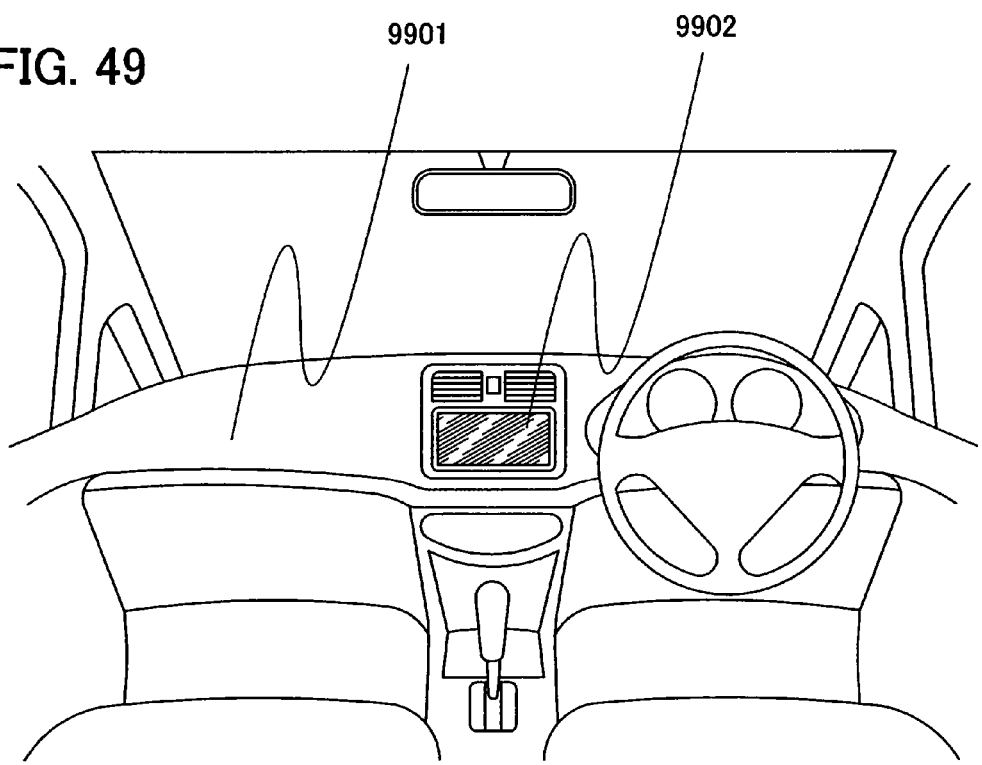
FIG. 49 is a diagram showing Embodiment 8.

FIG. 49 shows a display device integrated transport as an example of a display panel having a display portion including a display device using a pixel structure of the invention. FIG. 49 shows an example of a display panel 9902 which is integrated with a car body 9901 as an example of a display device integrated transport. The display panel 9902 having a display portion including a display device using a pixel structure of the invention shown in FIG. 49 is integrated with a car body and has functions to display the movement of the car and information inputted internally or externally as required, and navigate the car to the destination.

It is to be noted that a display panel having a display portion including a display device using a pixel structure of the invention is not limited to be capable of being applied to a front portion of the car body shown in FIG. 49, and can be applied to various places such as a glass window and a door by changing the shape thereof.

Another application mode of a display device integrated transport using a display panel having a display portion including a display device using a pixel structure of the invention is described with reference to FIGS. 51A and 51B.

Figure 51A:
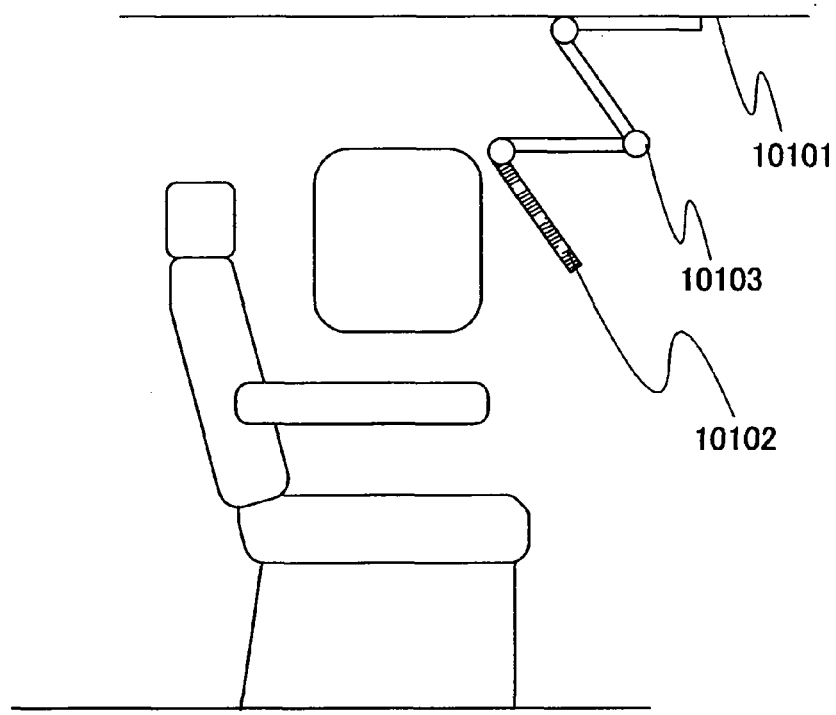
FIGS. 51A and 51B are diagrams showing Embodiment 8.
Figure 51B:
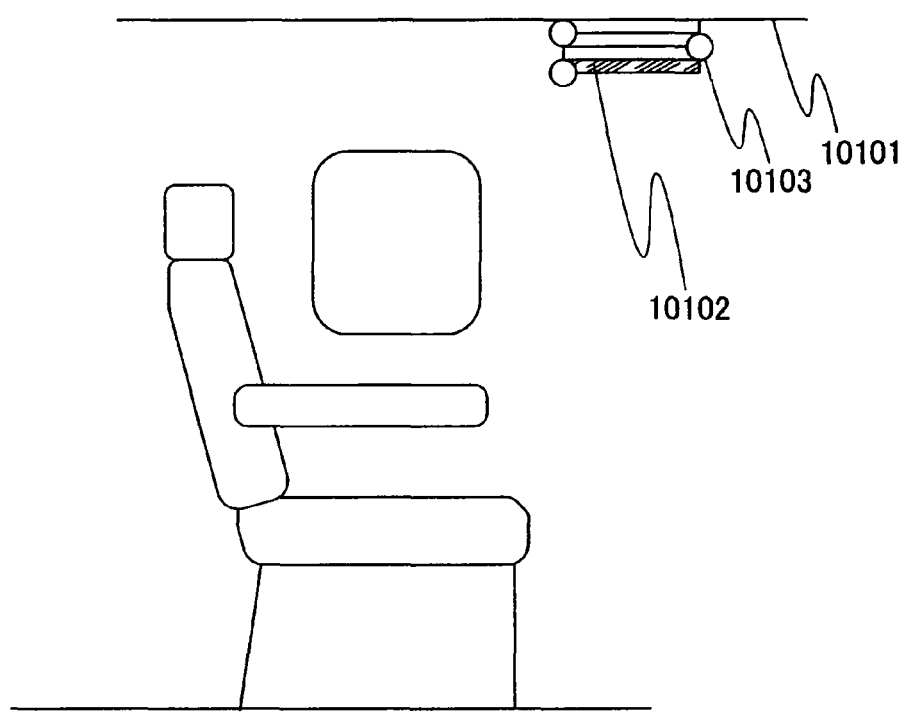

Each of FIGS. 51A and 51B shows a display device integrated transport as an example of a display panel having a display portion including a display device using a pixel structure of the invention. FIG. 51A illustrates an example of a display panel 10102 which is integrated with a ceiling of a passenger seat in an aircraft body 10101 as an example of a display device integrated transport. The display panel 10102 having a display portion including a display device using a pixel structure of the invention is integrated with the aircraft body 10101 by a hinge portion 10103. By expansion and contraction of the hinge portion 10103, a passenger can view the display panel 10102. The display panel 10102 has functions to display information by an operation of a passenger and to be used for advertisement and entertainment. As shown in FIG. 51B, by folding the hinge portion to store the display panel 10102 in the aircraft body 10101, security at take off and landing can be provided. In an emergency, by making display elements in the display panel emit light, the display panel can be used as a guide light of the aircraft body 10101.

It is to be noted that a display panel having a display portion including a display device using a pixel structure of the invention is not limited to be capable of being applied to only a ceiling portion of the aircraft body 10101 shown in FIGS. 51A and 51B, and can be applied to various places such as a seat and a door by changing the shape thereof. For example, the display panel may be provided on the back of a seat in front of a passenger so as to be operated and viewed.

It is to be noted in this embodiment that a train car body, a car body, and an aircraft body are shown as examples of a transport, however, the invention is not limited to these and can be applied to a variety of transports such as a motorcycle, a four-wheeled vehicle (including a car, a bus, and the like), a train (including a monorail, a train, and the like), and a vessel. By using a display panel having a display portion including a display device using a pixel structure of the invention, downsizing and low power consumption of the display panel can be achieved, and at the same time, a transport provided with a display medium with a favorable operation can be provided. In particular, display of the display panels in a transport can be easily changed all at the same time by external signals, therefore, such a display panel is quite effective as an advertisement board for general customers and information board in a time of disaster.

An application example of a display panel having a display portion including a display device using a pixel structure of the invention to a structure is described with reference to FIG. 48.

Figure 48:
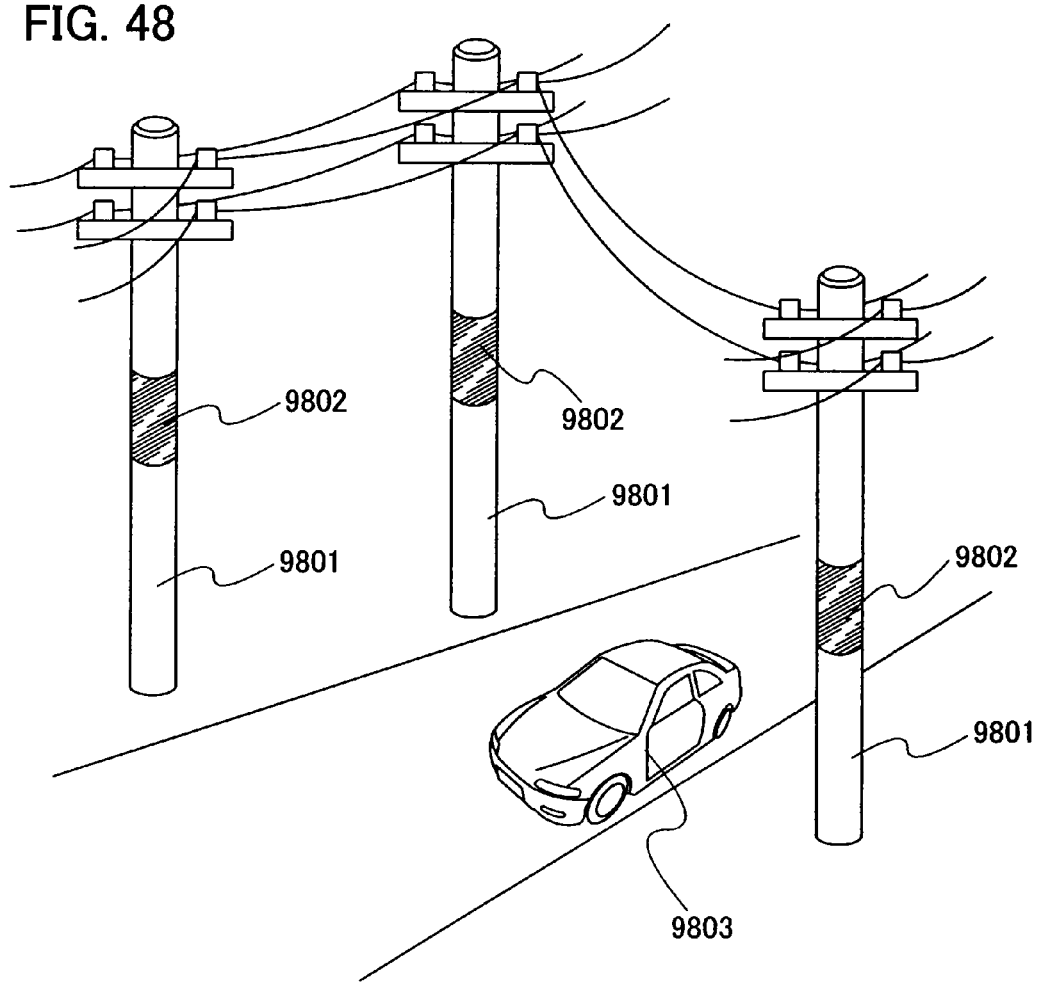
FIG. 48 is a diagram showing Embodiment 8.

FIG. 48 shows an application example of a display panel including a switching element such as an organic transistor over a film type substrate to drive a self-light emitting display element, thereby the display panel itself can be bent and perform display. In FIG. 48, the display panel is provided over a curved surface of a columnar body provided outdoors, such as an electric pole as a structure. Here, display panels 9802 are provided for electric poles 9801 as the columnar body.

The display panels 9802 shown in FIG. 48 are placed at the middle of the height of the electric poles, which is a position higher than human's point of view. Images displayed on the display panels 9802 can be recognized by looking at the display panels 9082 from a transport 9803. When the same image is displayed in the display panels 9802 provided for electric poles which stand in a large number outdoors, a viewer can recognize information and advertisement display. In FIG. 48, the display panels 9802 provided for the electric poles 9801 can easily display the same image by external signals, quite effective information display and advertisement effect can be expected. Further, by providing a self-luminous display element as a display element in a display panel of the invention, the display panel can be effectively used as a highly visible display medium even at night.

An application example of a display panel having a display portion including a display device using a pixel structure of the invention to another structure than FIG. 48 is described with reference to FIG. 50.

Figure 50:
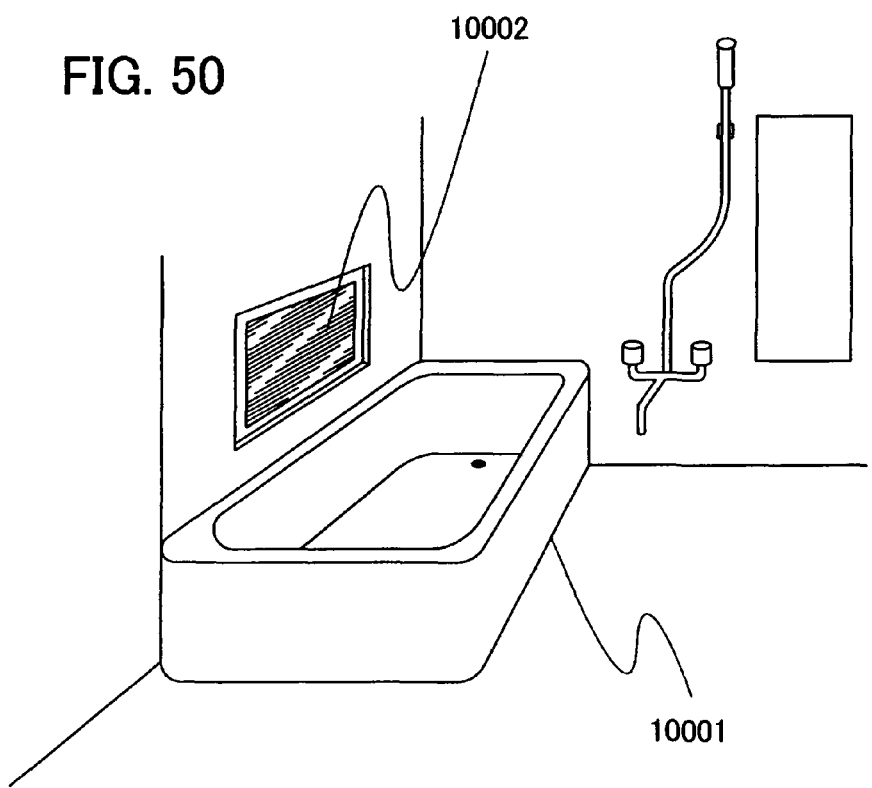
FIG. 50 is a diagram showing Embodiment 8.

FIG. 50 shows an application example of a display panel having a display portion including a display device using a pixel structure of the invention. FIG. 50 shows an example of a display panel 10002 incorporated in a sidewall of a prefabricated bath 10001 as an example of a display device integrated type. The display panel 10002 shown in FIG. 50 having a display portion including a display device using a pixel structure of the invention is integrated with the prefabricated bath 10001, thus a user can view the display panel 10002. The display panel 10002 has functions to display information by an operation of a user and to be used for advertisement and entertainment.

A display device having a display portion including a display device using a pixel structure of the invention is not limited to be capable of being applied only to a sidewall of the prefabricated bath 10001 shown in FIG. 50, and can be applied to various places by changing the shape thereof, including being integrated in a portion of a mirror surface or a bath tub.

Figure 46:
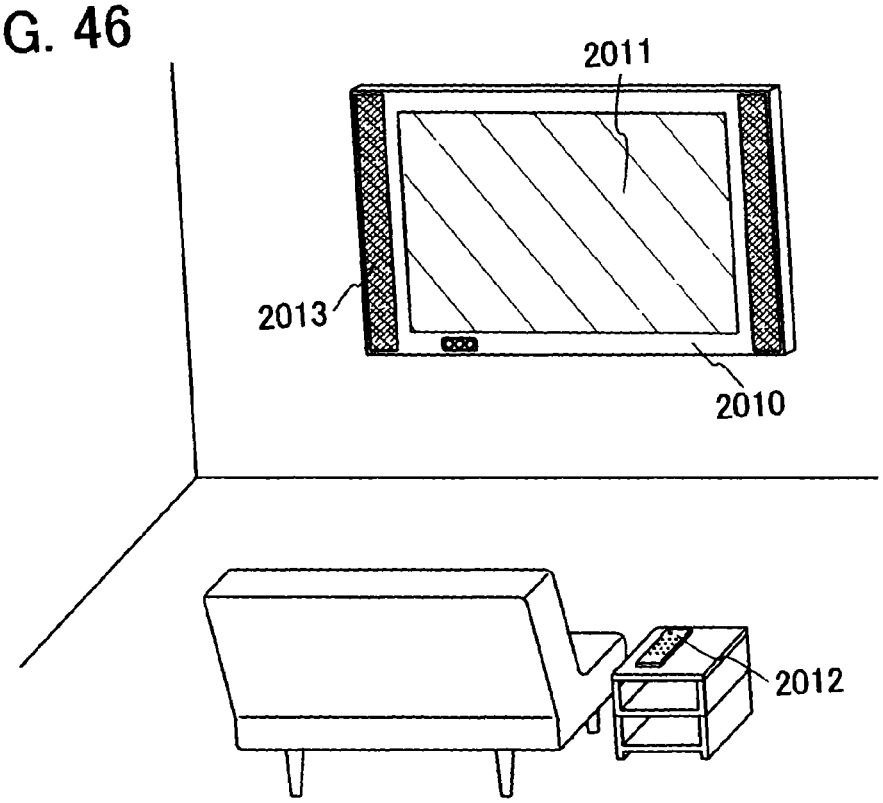
FIG. 46 is a diagram showing Embodiment 8.

FIG. 46 shows an example of providing a television device having a large display portion in a structure. FIG. 46 includes a housing 2010, a display portion 2011, a remote control device 2012 as an operating portion, a speaker portion 2013, and the like. A display panel having a display portion including a display device using a pixel structure of the invention is applied for manufacturing the display portion 2011. The television device shown in FIG. 46, which is integrated with a structure as a wall-hanging type, can be set without occupying a wide space.

In this embodiment, an electric pole is shown as an example of a structure having columnar body and a prefabricated bath is shown as a structure, however, this embodiment is not limited to these and any structure which can be provided with a display panel can be used. By applying a display device having a display portion including a display device using a pixel structure of the invention, downsizing and low power consumption of the display device can be achieved, and at the same time, a transport provided with a display medium with a favorable operation can be provided.

This application is based on Japanese Patent Application serial no. 2005-269323 filed in Japan Patent Office on 16 Sep. 2005, the entire contents of which are hereby incorporated by reference.

What is claimed is:

1. A display device comprising:
a pixel comprising:
   a first switching element;
   a second switching element;
   a third switching element;
   a fourth switching element;
   a fifth switching element;
   a first transistor comprising a first terminal connected to a first wire, a second terminal connected to a second wire through the first switching element, and to a gate of the first transistor through the second switching element;
   a second transistor comprising a first terminal connected to the first wire and a second terminal connected to a gate of the second transistor through the third switching element;
   a first capacitor comprising one electrode connected to the first wire and the other electrode directly connected to the gate of the first transistor and to a first terminal of the fourth switching element;
   a second capacitor comprising one electrode connected to the first wire and the other electrode directly connected to the gate of the second transistor and to a second terminal of the fourth switching element; and
   a light emitting element comprising one electrode connected to the second terminal of the first transistor through the fifth switching element.

2. The display device according to claim 1,
wherein the first transistor and the second transistor have a same conductive type.

3. The display device according to claim 1,
wherein a channel length of the first transistor is longer than a channel length of the second transistor.

4. The display device according to claim 1,
wherein a channel width of the first transistor is wider than a channel width of the second transistor.

5. The display device according to claim 1,
wherein the first transistor is connected in series to the light emitting element and controls a current flowing through the first transistor to control luminance of the light emitting element.

6. A display device comprising:
a pixel comprising:
   a first switching element;
   a second switching element;
   a third switching element;
   a fourth switching element;
   a fifth switching element;
   a first transistor comprising a first terminal connected to a first wire and a second terminal connected to a gate of the first transistor through the first switching element;
   a second transistor comprising a first terminal connected to the first wire, a second terminal connected to a second wire through the second switching element and to a gate of the second transistor through the third switching element;

a first capacitor comprising one electrode connected to the first wire and the other electrode directly connected to the gate of the first transistor and to a first terminal of the fourth switching element;

a second capacitor comprising one electrode connected to the first wire and the other electrode directly connected to the gate of the second transistor and to a second terminal of the fourth switching element; and a light emitting element comprising one electrode connected to the second terminal of the first transistor through the fifth switching element.

7. The display device according to claim 6, wherein the first transistor and the second transistor have a same conductive type.

8. The display device according to claim 6, wherein a channel length of the first transistor is longer than a channel length of the second transistor.

9. The display device according to claim 6, wherein a channel width of the first transistor is wider than a channel width of the second transistor.

10. The display device according to claim 6, wherein the first transistor is connected in series to the light emitting element and controls a current flowing through the first transistor to control luminance of the light emitting element.

11. A driving method of a display device comprising:
a pixel comprising:
- a first transistor;
- a second transistor;
- a first capacitor which holds a gate-source voltage of the first transistor in accordance with a current flowing through the first transistor;
- a second capacitor which holds a threshold voltage of the second transistor; and
- a switching element comprising a first terminal directly connected to a gate of the first transistor and a second terminal directly connected to a gate of the second transistor, said method comprising:
obtaining a gate-source voltage of the first transistor in the first capacitor;
obtaining a gate-source voltage of the second transistor in the second capacitor; and
turning on the switching element to capacitively couple the first capacitor and the second capacitor.

12. A driving method of a display device according to claim 11,
wherein an operation of obtaining the gate-source voltage of the first transistor in the first capacitor and an operation of obtaining the gate-source voltage of the second transistor in the second capacitor are performed at the same time.

13. A driving method of a display device comprising:
a pixel comprising:
- a first switching element;
- a second switching element;
- a third switching element;
- a fourth switching element;
- a fifth switching element;
- a first transistor comprising a first terminal connected to a first wire and a second terminal connected to a second wire through the first switching element and to a gate of the first transistor through the second switching element;
- a second transistor comprising a first terminal connected to the first wire and a second terminal connected to a gate of the second transistor through the third switching element;
- a first capacitor comprising one electrode connected to the first wire and the other electrode directly connected to the gate of the first transistor and to a first terminal of the fourth switching element;
- a second capacitor comprising one electrode connected to the first wire and the other electrode directly connected to the gate of the second transistor and to a second terminal of the fourth switching element; and
- a light emitting element comprising one electrode connected to the second terminal of the first transistor through the fifth switching element, said method comprising:
obtaining a gate-source voltage of the first transistor in the first capacitor;
obtaining a gate-source voltage of the second transistor in the second capacitor; and
turning on the fourth switching element to capacitively couple the first capacitor and the second capacitor.

14. A driving method of a display device according to claim 13,
wherein an operation of obtaining the gate-source voltage of the first transistor in the first capacitor and an operation of obtaining the gate-source voltage of the second transistor in the second capacitor are performed at the same time.

15. A driving method of a display device comprising:
a pixel comprising:
- a first switching element;
- a second switching element;
- a third switching element;
- a fourth switching element;
- a fifth switching element;
- a first transistor comprising a first terminal connected to a first wire and a second terminal connected to a gate of the first transistor through the first switching element;
- a second transistor comprising a first terminal connected to the first wire and a second terminal connected to a second wire through the second switching element and to a gate of the second transistor through the third switching element;
- a first capacitor comprising one electrode connected to the first wire and the other electrode directly connected to the gate of the first transistor and to a first terminal of the fourth switching element;
- a second capacitor comprising one electrode connected to the first wire and the other electrode directly connected to the gate of the second transistor and to a second terminal of the fourth switching element; and
- a light emitting element comprising one electrode connected to the second terminal of the first transistor through the fifth switching element, said method comprising:
obtaining a gate-source voltage of the first transistor in the first capacitor;
obtaining a gate-source voltage of the second transistor in the second capacitor; and
turning on the fourth switching element to capacitively couple the first capacitor and the second capacitor.

16. A driving method of a display device according to claim 15,
wherein an operation of obtaining the gate-source voltage of the first transistor in the first capacitor and an operation of obtaining the gate-source voltage of the second transistor in the second capacitor are performed at the same time.

* * * * *

UNITED STATES PATENT AND TRADEMARK OFFICE
CERTIFICATE OF CORRECTION

PATENT NO.       : 7,995,009 B2
APPLICATION NO.  : 11/530741
DATED            : August 9, 2011
INVENTOR(S)      : Atsushi Umezaki It is certified that error appears in the above-identified patent and that said Letters Patent is hereby corrected as shown below:

Column 13, line 4, replace "Vgs(t1) with --Vgs(T1)--

Column 24, line 1, delete "-continued"

Signed and Sealed this
Twentieth Day of March, 2012

David J. Kappos
*Director of the United States Patent and Trademark Office*